United States Patent
Chen et al.

(10) Patent No.: US 9,590,137 B2
(45) Date of Patent: Mar. 7, 2017

(54) LIGHT-EMITTING DIODE

(71) Applicant: MIKRO MESA TECHNOLOGY CO., LTD., Apia (WS)

(72) Inventors: Li-Yi Chen, Tainan (TW); Pei-Yu Chang, Tainan (TW); Chih-Hui Chan, Tainan (TW); Chun-Yi Chang, Tainan (TW); Shih-Chyn Lin, Tainan (TW); Hsin-Wei Lee, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 0 days.

(21) Appl. No.: 14/940,123

(22) Filed: Nov. 12, 2015

(65) Prior Publication Data
US 2016/0072012 A1 Mar. 10, 2016

Related U.S. Application Data

(63) Continuation-in-part of application No. 14/701,514, filed on Apr. 30, 2015, now Pat. No. 9,231,153, which is a continuation-in-part of application No. 14/290,999, filed on May 30, 2014, now Pat. No. 9,105,813, said application No. 14/940,123 is a
(Continued)

(51) Int. Cl.
*H01L 21/00* (2006.01)
*H01L 33/00* (2010.01)
*H01L 33/38* (2010.01)
*H01L 33/14* (2010.01)
*H01L 33/44* (2010.01)
(Continued)

(52) U.S. Cl.
CPC .......... *H01L 33/0079* (2013.01); *H01L 24/83* (2013.01); *H01L 33/145* (2013.01); *H01L 33/38* (2013.01); *H01L 33/44* (2013.01); *H01L 25/0753* (2013.01); *H01L 2224/83191* (2013.01); *H01L 2924/0002* (2013.01)

(58) Field of Classification Search
CPC ...... H01L 33/0079; H01L 24/83; H01L 33/44
See application file for complete search history.

(56) References Cited

U.S. PATENT DOCUMENTS 8,525,210 B2 * 9/2013 Tanaka ............... H01L 33/42
257/98
9,385,267 B2 * 7/2016 Chen ................. H01L 33/44
(Continued)

FOREIGN PATENT DOCUMENTS

| CN | 1346154 A | 4/2002 |
|---|---|---|
| CN | 102074635 A | 5/2011 |
| JP | H08340132 A | 12/1996 |

*Primary Examiner* — Laura Menz
(74) *Attorney, Agent, or Firm* — CKC & Partners Co., Ltd.

(57) ABSTRACT

A light-emitting diode (LED) includes a first type semiconductor layer, a second type semiconductor layer, a current controlling structure, a first electrode, and a second electrode. The second type semiconductor layer is joined with the first type semiconductor layer. The current controlling structure is joined with the first type semiconductor layer, and the current controlling structure has at least one current-injecting zone therein. The first electrode is electrically coupled with the first type semiconductor layer through the current-injecting zone of the current controlling structure. The second electrode is electrically coupled with the second type semiconductor layer.

18 Claims, 43 Drawing Sheets

Related U.S. Application Data continuation-in-part of application No. 14/718,106, filed on May 21, 2015, now Pat. No. 9,219,197, which is a continuation-in-part of application No. 14/290,999.

(51) Int. Cl.
*H01L 23/00* (2006.01)
*H01L 25/075* (2006.01)

(56) References Cited

U.S. PATENT DOCUMENTS

| | | | |
|---|---|---|---|
| 2008/0185606 A1* | 8/2008 | Sano | H01L 33/42 257/98 |
| 2012/0205705 A1* | 8/2012 | Tanaka | H01L 33/42 257/98 |
| 2016/0064594 A1* | 3/2016 | Chen | H01L 33/44 257/94 |
| 2016/0072012 A1* | 3/2016 | Chen | H01L 33/145 257/101 |

* cited by examiner

LIGHT-EMITTING DIODE

RELATED APPLICATIONS

The present application is a continuation-in-part application of U.S. application Ser. No. 14/701,514, filed on Apr. 30, 2015, which is a continuation-in-part application of the application Ser. No. 14/290,999, filed May 30, 2014. The present application is also a continuation-in-part application of U.S. application Ser. No. 14/718,106, filed on May 21, 2015, which is a continuation-in-part application of the application Ser. No. 14/290,999, filed May 30, 2014. The entire disclosure of the above application is hereby incorporated by reference herein.

BACKGROUND

Technical Field

The present disclosure relates to light-emitting diodes (LEDs).

Description of Related Art

In the recent years, light-emitting diodes (LEDs) have become popular in general and commercial lighting applications. As light sources, LEDs have many advantages including the aspects of low energy consumption, long lifetime, small size, and fast switching, and hence conventional illuminant technology, such as incandescent lamps, is gradually replaced by LEDs. In an LED, when electrons and holes recombine across the band gap in the active layer, the recombination energy is emitted in the form of photons. This recombination mechanism is the so-called radiative recombination.

In an LED display uses an array contains large quantity of micro-size LEDs. In order to provide an adequate brightness (e.g., about 500 nits-3000 nits), the emitting energy of each of the LEDs usually must be well controlled. Otherwise, the brightness of the LED display will be too high. To control the emitting energy and maintaining the efficiency and uniformity of the display are important.

SUMMARY

According to some embodiments of the present disclosure a light-emitting diode (LED) including a first type semiconductor layer, a second type semiconductor layer, a current controlling structure, a first electrode, and a second electrode. The second type semiconductor layer is joined with the first type semiconductor layer. The current controlling structure is joined with the first type semiconductor layer, and the current controlling structure has at least one current-injecting zone therein. The first electrode is electrically coupled with the first type semiconductor layer through the current-injecting zone of the current controlling structure. The second electrode is electrically coupled with the second type semiconductor layer.

DETAILED DESCRIPTION

Figure 1:
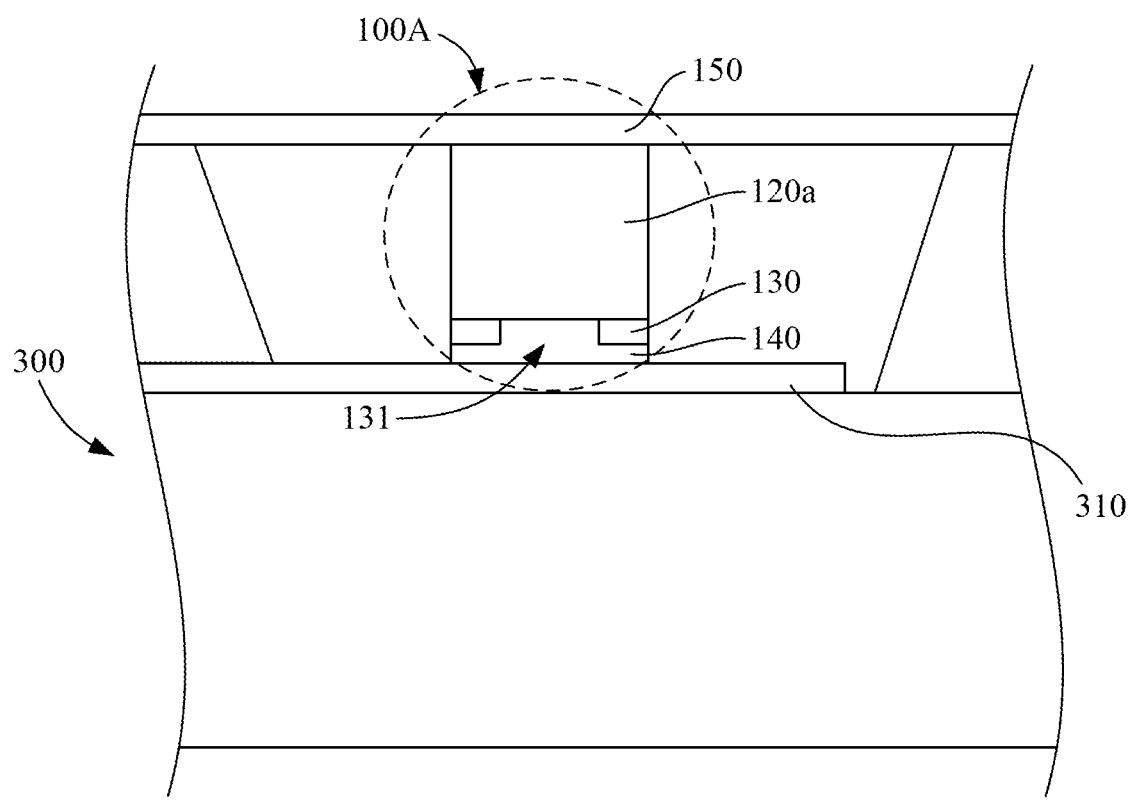
FIG. 1 is a cross-sectional view of a micro-light-emitting diode (micro-LED) disposed on a receiving substrate according to an embodiment of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present disclosure describe micro semiconductor devices and a method of forming an array of micro semiconductor devices such as micro-light-emitting diodes (micro-LEDs) for transfer to a receiving substrate. For example, the receiving substrate may be, but is not limited to, a display substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures according to embodiments of the disclosure. As used herein, the terms "micro" devices or structures are meant to refer to the scale of 1 to 100 μm. However, it is to be appreciated that embodiments of the present disclosure are not necessarily so limited, and that certain aspects of the embodiments may be applicable to larger, and possibly smaller size scales.

Some embodiments of the disclosure describe a method of processing a bulk LED substrate into an array of micro-LEDs which are poised for pick up and transfer to a receiving substrate. In this manner, it is possible to integrate and assemble micro-LEDs into heterogeneously integrated systems. The micro-LEDs can be picked up and transferred individually, in groups, or as the entire array. Thus, the micro-LEDs in the array of micro-LEDs are poised for pick up and transfer to a receiving substrate such as display substrate of any size ranging from micro displays to large area displays, and at high transfer rates. In some embodiments, arrays of micro-LEDs which are poised for transfer are described as having a fine pitch and each micro LED has a regular octagon shape with the pitch size of 10 um. Thus a 4-inch LED epi wafer could be divided into an micro LED array which contains more than 27 million devices. Thus, a high density of pre-fabricated micro devices with a specific functionality may be produced in a manner in which they are poised for pick up and transfer to a receiving substrate.

FIG. 1 is a cross-sectional view of a micro-light-emitting diode (micro-LED) 100A disposed on a receiving substrate 300 according to an embodiment of this disclosure. The receiving substrate 300 is illustrated as a display substrate including a bonding electrode 310 joined with the micro-LED 100A, for example, and the details of the receiving substrate 300 can be referred to FIG. 9 and will be described in more detail in the following description. The micro-LED 100A includes a micro p-n diodes 120a, a current controlling layer 130, a first conductive layer 140, and a second conductive layer 150. The micro-LED 100A shown in FIG. 1 can be manufactured according to operations sequentially illustrated by FIG. 2C-2I, for example.

Figure 2A:
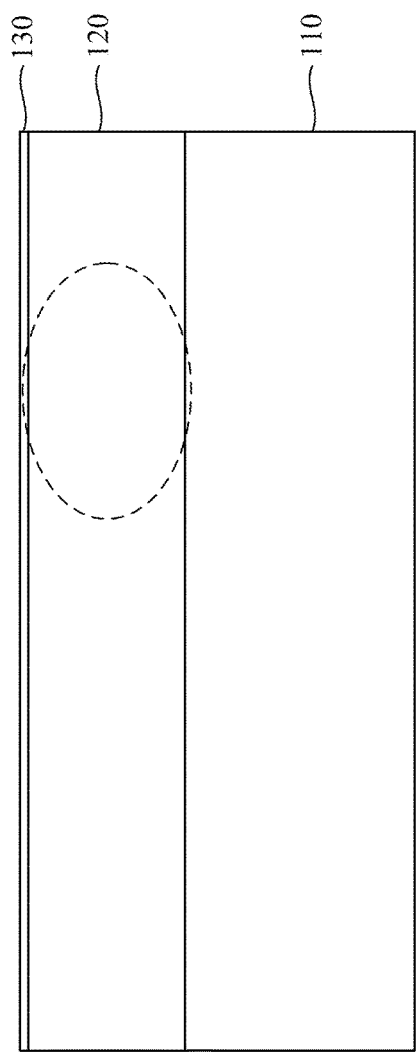
FIG. 2A is a cross-sectional side view illustration of a bulk LED substrate according to an embodiment of the disclosure.

FIG. 2A is a cross-sectional side view illustration of a bulk LED substrate according to an embodiment of the disclosure. Referring now to FIG. 2A, a semiconductor device layer 120 is formed on a growth substrate 110. In an embodiment, the semiconductor device layer 120 may not be fully functional. For example, contacts such as an anode or cathode may not yet be formed. In the interest of conciseness and to not obscure embodiments of the disclosure, the following description is made with regard to the semiconductor device layer 120 as a p-n diode layer 120 grown on the growth substrate 110 according to conventional heterogeneous growth conditions.

The p-n diode layer 120 may include a compound semiconductor having a bandgap corresponding to a specific region in the spectrum. For example, the p-n diode layer 120 may include one or more layers based on II-VI materials (e.g. ZnSe, ZnO) or III-V nitride materials (e.g. GaN, AlN, InN, InGaN, GaP, AlInGaP, AlGaAs and their alloys). The growth substrate 110 may include any suitable substrate such as, but not limited to, silicon, SiC, GaAs, GaN and sapphire ($Al_2O_3$).

In a particular embodiment, the growth substrate 110 is sapphire, and the p-n diode layer 120 is formed of GaN. Despite the fact that sapphire has a larger lattice constant and thermal expansion coefficient mismatch with respect to GaN, sapphire is reasonably low cost, widely available and its transparency is compatible with laser lift-off (LLO) techniques. In another embodiment, another material such as SiC may be used as the growth substrate 110 for the GaN p-n diode layer 120. Like sapphire, SiC substrates may be transparent. Several growth techniques may be used for growth of the p-n diode layer 120 such as metalorganic chemical vapor deposition (MOCVD).

Figure 2B:
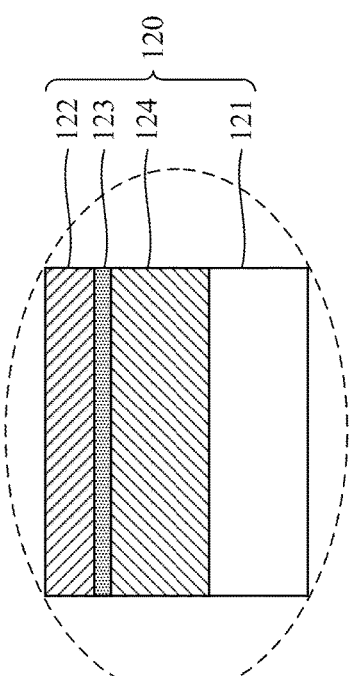
FIG. 2B is an enlarged section of the p-n diode layer in FIG. 2A.

FIG. 2B is an enlarged section of the p-n diode layer 120 in FIG. 2A. In the particular embodiment illustrated in FIG. 2B, the p-n diode layer 120 may include a first type semiconductor layer 122 (e.g., a p-doped layer), an active layer 123, a second type semiconductor layer 124 (e.g., an n-doped layer), and a buffer bulk GaN layer 121. In some embodiments, the buffer bulk GaN layer 121 is optionally not formed in the p-n diode layer 120, so the following operation of removing the buffer bulk GaN layer 121 (i.e., the operation illustrated in FIG. 2G) can be omitted. The buffer bulk GaN layer 121 may be n-doped due to silicon or oxygen contamination, or intentionally doped with a donor such as silicon. The second type semiconductor layer 124 may likewise be doped with a donor such as silicon, while first type semiconductor layer 122 may be doped with an acceptor such as magnesium. A variety of alternative p-n diode configurations may be utilized to form the p-n diode layer 120. Likewise, a simple p-n contact junction or a variety of single quantum well (SQW) or multiple quantum well (MQW) configurations may be utilized to form the active layer 123. In addition, various buffer layers may be included as appropriate. In one embodiment, the sapphire growth substrate 110 has a thickness of approximately 100 μm-400 μm, the buffer bulk GaN layer 121 has a thickness of approximately 3 μm-5 μm, the second type semiconductor layer 124 has a thickness of approximately 0.1 μm-5 μm, the active layer 123 has a thickness less than approximately 100-400 nm, and the first type semiconductor layer 122 has a thickness of approximately 100 nm-1 μm.

Figure 2C:
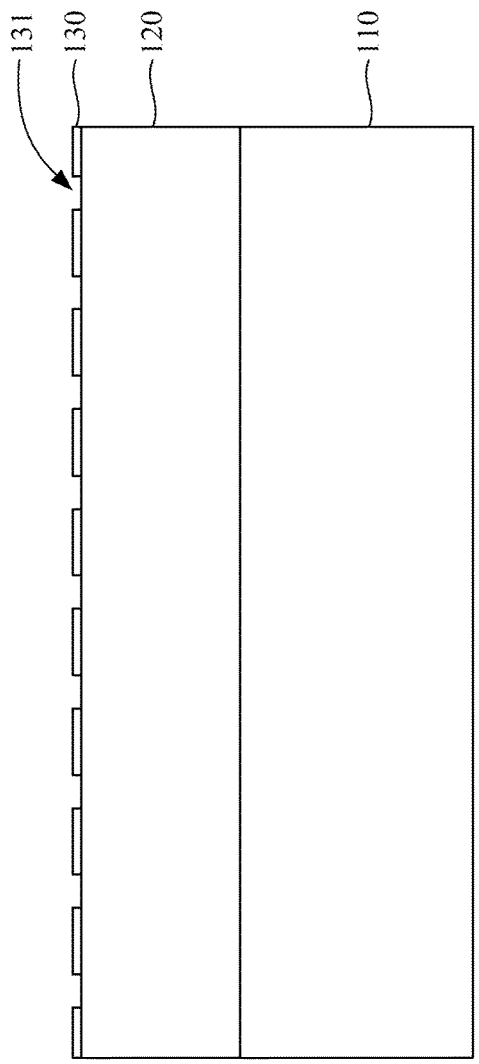
FIG. 2C is a cross-sectional side view illustration of a patterned current controlling layer formed on the p-n diode layer in FIG. 2A according to an embodiment of the disclosure.

FIG. 2C is a cross-sectional side view illustration of a patterned current controlling layer 130 formed on the p-n diode layer 120 in FIG. 2A according to an embodiment of the disclosure. Referring now to FIG. 2C, a current controlling layer 130 may then be formed over the p-n diode layer 120, and a plurality of openings 131 are formed within the current controlling layer 130. In the embodiment of the disclosure, after a plurality of the micro-LEDs 100A are manufactured (as described in the following description), each of the micro-LEDs 100A has one opening 131, but the disclosure is not limited in this regard. In some embodiments, after a plurality of the micro-LEDs 100A are manufactured, each of the micro-LEDs 100A may have more than one opening 131.

Figure 2D:
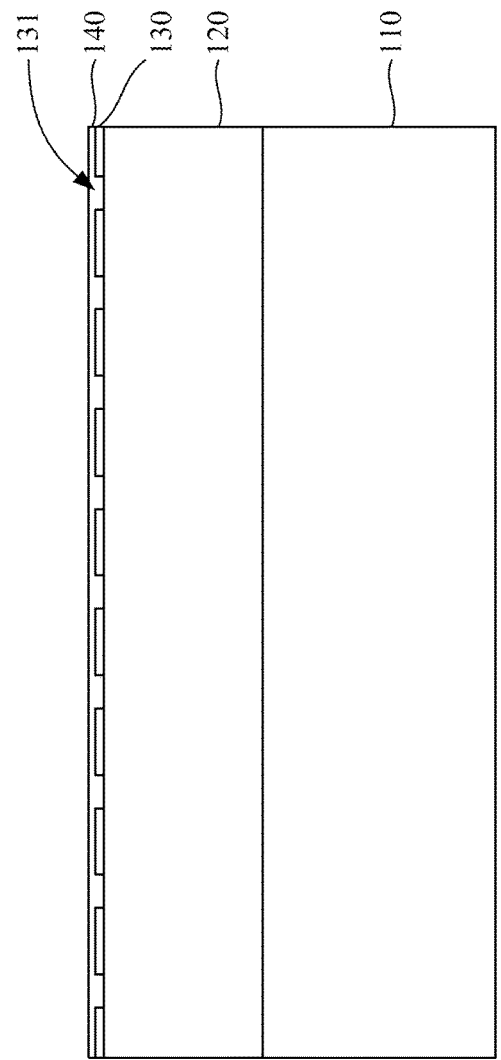
FIG. 2D is a cross-sectional side view illustration of a first conductive layer formed on the patterned current controlling layer in FIG. 2C according to an embodiment of the disclosure.

FIG. 2D is a cross-sectional side view illustration of a first conductive layer 140 formed on the patterned current controlling layer 130 in FIG. 2C according to an embodiment of the disclosure. Referring now to FIG. 2D, a first conductive layer 140 may then be formed over the current controlling layer 130. The first conductive layer 140 is electrically coupled with the exposed parts of the first type semiconductor layer 122 of the p-n diode layer 120 through the openings 131. The first conductive layer 140 serves as an electrode layer, though other layers may be included. In an embodiment, the first conductive layer 140 has a thickness of approximately 0.1 µm-15 µm. In another embodiment, the first conductive layer 140 may also be optically transparent. Transparency may be accomplished by making the first conductive layer 140 very thin to minimize light absorption or using the transparent conductive materials. Alternatively, in some embodiments, the first conductive layer 140 is formed on the receiving substrate 300 in advance, rather than formed on the patterned current controlling layer 130 (as illustrated in FIG. 2D).

Figure 2E:
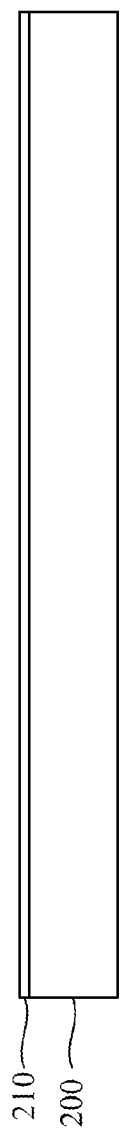
FIG. 2E is a cross-sectional side view illustration of a carrier substrate with an adhesive layer according to an embodiment of the disclosure.
Figure 2F:
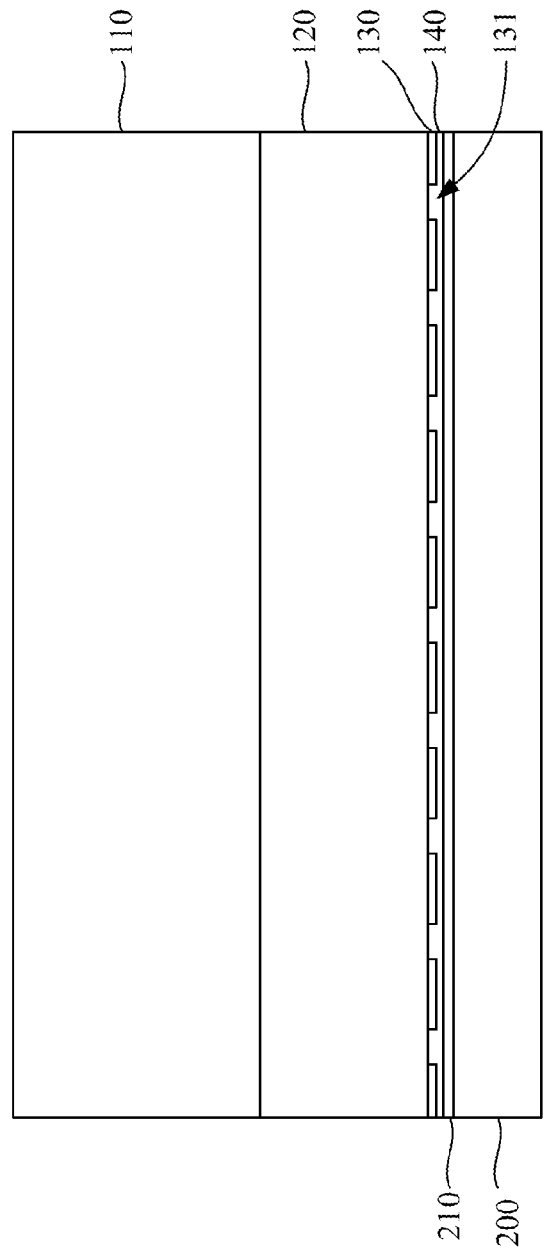
FIG. 2F is a cross-sectional side view illustration of bonding the structure of FIG. 2D and the structure of FIG. 2E together according to an embodiment of the disclosure.

FIG. 2E is a cross-sectional side view illustration of a carrier substrate with an adhesive layer 210 according to an embodiment of the disclosure. FIG. 2F is a cross-sectional side view illustration of bonding the structure of FIG. 2D and the structure of FIG. 2E together according to an embodiment of the disclosure. According to certain embodiments of the disclosure, a combination of the p-n diode layer 120, the current controlling layer 130, and the first conductive layer 140 grown on the growth substrate 110 is subsequently transferred to a carrier substrate 200 before chipped, such as one illustrated in FIG. 2F and described in more detail in the following description. In some embodiments, the first conductive layer 140 and the p-n diode layer 120 may be chipped prior to transfer to a carrier substrate 200. Accordingly, embodiments of the disclosure may be implemented in a multitude of variations during formation of an array of micro-LEDs 100A for subsequent transfer to the receiving substrate 300.

In an embodiment, the adhesive layer 210 may have a thickness of approximately 0.1 µm-100 µm.

The adhesive layer 210 may be made of adhesion capable organic or non-organic materials, e.g., UV curable glue or silicone. The adhesive layer 210 may be formed from a material which is capable of adhering the combination of the p-n diode layer 120, the current controlling layer 130, and the first conductive layer 140 to the carrier substrate 200. Specifically, the adhesion force of the adhesive layer 210 could be adjusted or reduced by an electric field, UV light, electromagnetic radiation, heat, ultrasound, mechanical force, pressure, or any combinations thereof. Referring now to FIG. 2F, the combination of the p-n diode layer 120, the current controlling layer 130, and the first conductive layer 140 and the carrier substrate 200 may be bonded together by using the adhesive layer 210.

Figure 2G:
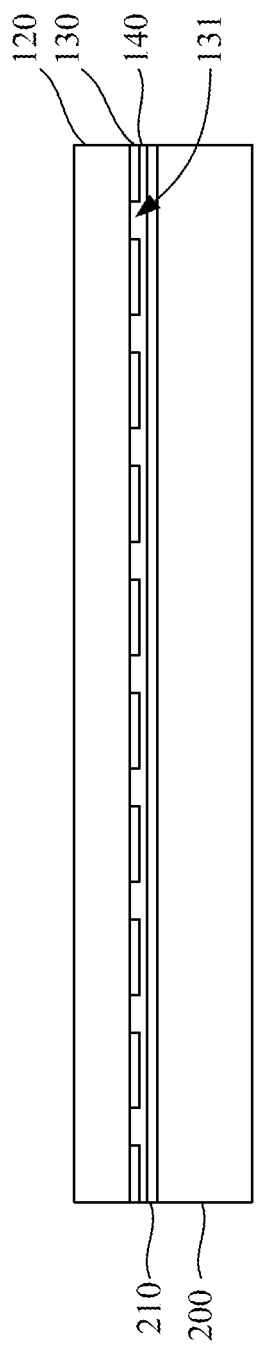
FIG. 2G is a cross-sectional side view illustration of removing the growth substrate from the bonded structure in FIG. 2F and thinning-down the p-n diode layer according to an embodiment of the disclosure.

FIG. 2G is a cross-sectional side view illustration of removing the growth substrate 110 from the bonded structure in FIG. 2F and thinning-down the p-n diode layer 120 according to an embodiment of the disclosure. Referring now to FIG. 2G, the growth substrate 110 has been removed from the bonded structure. The growth substrate 110 may be removed by a suitable method such as chemical lift-off or laser lift-off (LLO). While using LLO, the absorption in the GaN p-n diode layer 120 at the interface results in localized heating of the interface resulting in decomposition at the interfacial GaN to liquid Ga metal and nitrogen gas. Once the desired are has been irradiated, the transparent sapphire growth substrate 110 can be removed by remelting the Ga on a hotplate.

Referring now to FIG. 2G, the p-n diode layer 120 is then thinned down to a desirable thickness. Referring back to the enlarged p-n diode layer 120 in FIG. 2B, a predetermined amount of the buffer bulk GaN layer 121 (which may be n-type) or a portion of the second type semiconductor layer 124 are removed so that an operable p-n diode remains after thinning. The buffer bulk GaN layer 121 can be fully etched. Alternatively, the buffer bulk GaN layer 121 can be partially etched to form contact holes via which the second type semiconductor layer 124 can be electrically coupled with the second conductive layer 150 shown in FIG. 1. In some embodiments, the buffer bulk GaN layer 121 is optionally not formed in the p-n diode layer 120, so the operation of removing the buffer bulk GaN layer 121 (i.e., the operation illustrated in FIG. 2G) can be omitted. Depending upon the underlying structure, the thinning process may be optionally performed utilizing suitable techniques such as dry etching to etch the buffer bulk GaN layer 121.

Figure 2H:
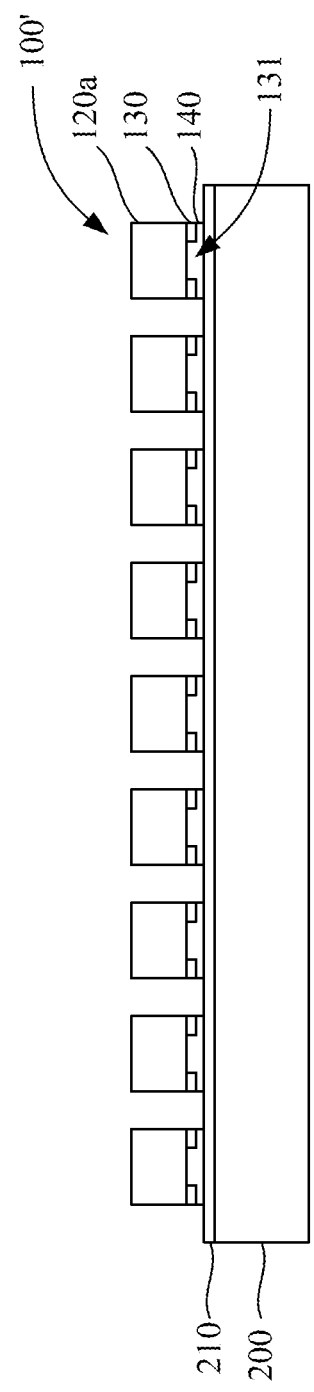
FIG. 2H is a cross-sectional side view illustration of etching the p-n diode layer and the first conductive layer in FIG. 2G to form micro p-n diodes according to an embodiment of the disclosure.

FIG. 2H is a cross-sectional side view illustration of etching the p-n diode layer 120 and the first conductive layer 140 in FIG. 2G to form micro p-n diodes 120a according to an embodiment of the disclosure. Referring now to FIG. 2H, the plurality of micro p-n diodes 120a are positioned over the adhesive layer 210. In the embodiment, the micro p-n diodes 120a have vertical sidewalls. For example, ICP (Inductively Coupled Plasma) which a chlorine-based etch chemistry may be utilized to obtain vertical sidewalls.

Furthermore, the current controlling layer 130 illustrated in FIG. 2H can be taken as being separated into a number of parts. In some embodiments, the parts of the current controlling layer 130 are separated from each other, and hence each of the micro p-n diodes 120a includes at least one of the parts of the current controlling layer 130. Accordingly, in some embodiments, in the operation of patterning the current controlling layer 130 illustrated in FIG. 2C, the openings 131 and the parts of the current controlling layer 130 are formed, in which the parts of the current controlling layer 130 are separated from each other are formed. Thus, the process of patterning the current controlling layer 130 to form the openings 131 and the process of patterning the current controlling layer 130 to separate the current controlling layers 130 into a number of parts may be performed in the different operations or the same operation. Next, in some embodiments, the operation of etching the p-n diode layer 120 can be performed after the operation illustrated in FIG. 2C.

Figure 2I:
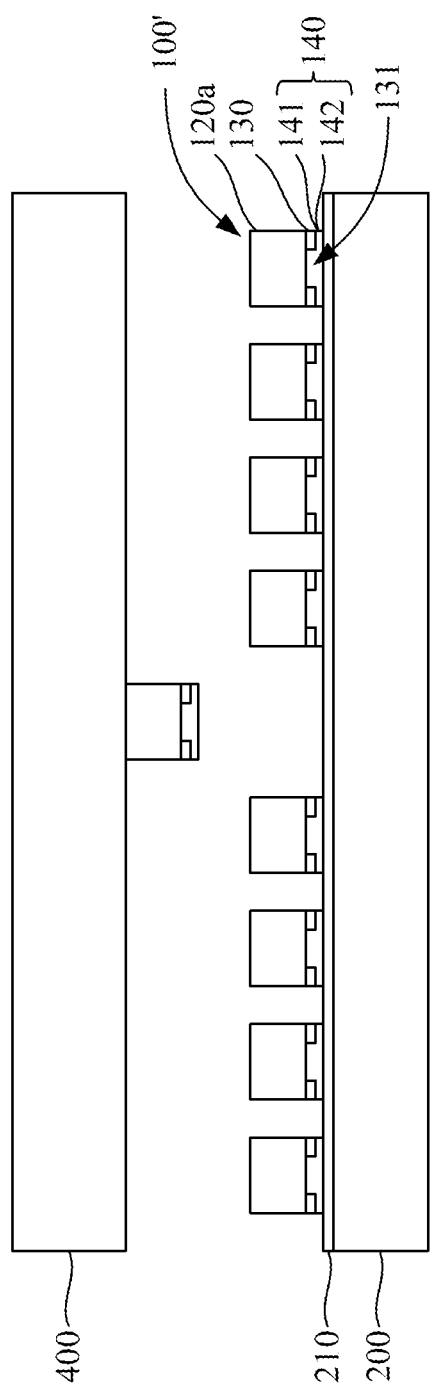
FIG. 2I is a cross-sectional side view illustration of a transfer head picking up a micro-LED from the carrier substrate in FIG. 2H according to an embodiment of the disclosure.

FIG. 2I is a cross-sectional side view illustration of a transfer head 400 picking up a micro-LED 100' from the carrier substrate 200 in FIG. 2H according to an embodiment of the disclosure. Referring now to FIG. 2I, the micro-LEDs 100' or array of micro-LEDs 100' in FIG. 2I are poised for pick up and transfer to the receiving substrate 300 illustrated in FIG. 1, for example with a transfer head 400.

In some embodiments, the Young's modulus of the adhesive layer 210 is less than or equal to 30 GPa. As a result, the adhesive layer 210 may absorb impact forces associated with contacting the micro-LEDs 100' with a transfer head 400 during the pick up process.

Referring back to FIG. 2H, the carrier substrate 200 is provided having an array of micro-LEDs 100' disposed thereon. Each micro-LED 100' may at least include the micro p-n diode 120a, the current controlling layer 130 having at least one opening 131, and the first conductive layer 140, with the first conductive layer 140 between the current controlling layer 130 and the adhesive layer 210 on the carrier substrate 200. To transfer the micro-LED 100' to the receiving substrate 300 illustrated in FIG. 1, the adhesion force of the adhesive layer 210 is decreased by an electric field, UV light, electromagnetic radiation, heat, ultrasound, mechanical force, pressure, or any combinations thereof in advance. A combination of the micro p-n diode 120a, the current controlling layer 130, the first conductive layer 140 is then be picked up with the transfer head 400 and then placed on the receiving substrate 300.

A variety of suitable transfer heads can be utilized to aid in the pick up and placement operations according to embodiments of the disclosure. For example, the transfer head 400 may exert a pick up pressure on the micro-LED 100' according to vacuum, magnetic, adhesive, or electrostatic attraction in order to pick up the micro-LED 100'.

Referring back to FIG. 1 which is an illustration of the receiving substrate 300 onto which a micro-LED 100A has been placed. In the embodiment, the receiving substrate 300 is a display substrate. In the particular embodiment illustrated, the micro-LED 100' shown in FIG. 2I may be placed over the bonding electrode 310 of the receiving substrate 300. A second conductive layer 150 may then be formed over the micro p-n diode 120a, so as to form the micro-LED 100A shown in FIG. 1. In some embodiments, the second conductive layer 150 is formed from a transparent contact material such as indium tin oxide (ITO). In some embodiments, the second conductive layer 150 is in the form of a bonding wire.

In one embodiment, the p-n diode 120a may include a second type semiconductor layer 124 with a thickness of approximately 0.1 µm-50 µm, the active layer 123 (which may be SQW or MQW) with a thickness approximately 50 nm-5 µm, and the first type semiconductor layer 122 with thickness of approximately 50 nm-20 µm. In an embodiment, the second type semiconductor layer 124 may be 0.1 µm-6 µm thick (which may include or replace bulk layer 121 previously described).

Figure 3A:
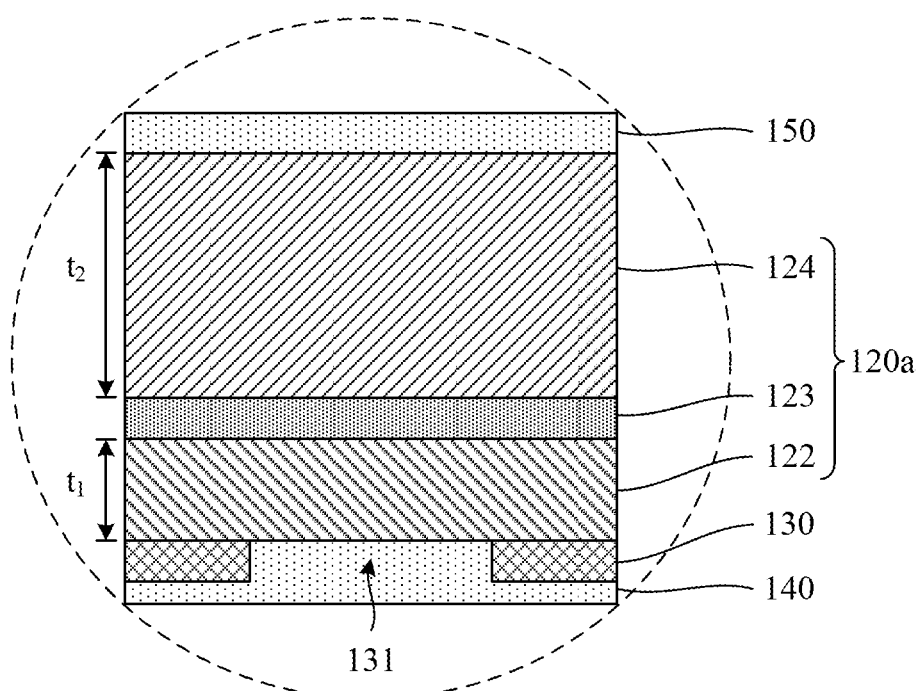
FIG. 3A is an enlarged cross-sectional view of the micro-LED in FIG. 1 according to a first embodiment of this disclosure.

FIG. 3A is an enlarged cross-sectional view of the micro-LED 100A in FIG. 1 according to a first embodiment of this disclosure. The micro-LED 100A includes a micro p-n diode 120a, a current controlling layer 130, a first conductive layer 140, and a second conductive layer 150. The micro p-n diode 120a includes a first type semiconductor layer 122, an active layer 123, and a second type semiconductor layer 124. The second type semiconductor layer 124 is joined with the first type semiconductor layer 122. The active layer 123 is disposed between the first type semiconductor layer 122 and the second type semiconductor layer 124. The current controlling layer 130 is joined with the first type semiconductor layer 122. The current controlling layer 130 has at least one opening 131 therein to expose at least one part of the first type semiconductor layer 122. The first conductive layer 140 is partially joined with the current controlling layer 130 and is electrically coupled with the exposed part of the first type semiconductor layer 122 through the opening 131 of the current controlling layer 130. The second conductive layer 150 is electrically coupled with the second type semiconductor layer 124.

Referring to FIG. 1 and FIG. 3A, in the embodiment, a combination of the first type semiconductor layer 122, the active layer 123, the second type semiconductor layer 124, the current controlling layer 130, the first conductive layer 140, and the second conductive layer 150 is joined with the bonding electrode 310 on the receiving substrate 300, so as to form a micro-LED display. In the embodiment, the first type semiconductor layer 122 is proximal to the receiving substrate 300, and the second type semiconductor layer 124 is distal to the receiving substrate 300.

In the embodiment, at least one of the first conductive layer 140 and the second conductive layer 150 has a light-permeable part. Specifically, in the embodiment, a vertical projection of the current controlling layer 130 on said one of the first conductive layer 140 and the second conductive layer 150 overlaps with the light-permeable part. The light-permeable part is transparent or semi-transparent.

In some embodiments, a vertical projection of the opening 131 of the current controlling layer 130 on said one of the first conductive layer 140 and the second conductive layer 150 overlaps with the light-permeable part.

In some embodiments, said one of the first conductive layer 140 and the second conductive layer 150 having the light-permeable part is wholly transparent.

As shown in FIG. 3A, the opening 131 of the current controlling layer 130 defines the contact interface between the first conductive layer 140 and the first type semiconductor layer 122. When the micro-LED 100A is forward biased, charge carriers flow from the contact interface between the first conductive layer 140 and the first type semiconductor layer 122 to the junction of the first type semiconductor layer 122 and the second type semiconductor layer 124 (i.e., the active layer 123).

It is noted that a conventional current blocking layer disposed in a conventional LED is used to prevent the current from flowing through the opaque portion of the electrode of the LED. That is, the location of the current blocking layer is right aligned with the opaque portion of the electrode of the LED. In order to make good use of the whole emitting area of the LED, the area of the current blocking layer must be as small as possible.

On the contrary, the micro-LED 100A of the disclosure uses the current controlling layer 130 to limit the emitting area of the micro-LED 100A. Compared with the conventional current blocking layer, the vertical projection of the current controlling layer 130 of the present disclosure on said one of the first conductive layer 140 and the second conductive layer 150 further overlaps with the light-permeable part of said one of the first conductive layer 140 and the second conductive layer 150. Since the opening 131 limits the area where the current goes into the micro-LED 100A, the current density within the emitting area of the micro-LED 100A increases and can be uniform, thereby increasing the operating stability and efficiency of the micro-LED 100A.

Furthermore, since the opening 131 of the current controlling layer 130 makes the emitting area of the micro-LED 100A smaller than the size of the micro-LED 100A, it is possible to continue miniaturization of the emitting area of the micro-LED 100A while remain the size of the micro-LED 100A to allow the micro-LED 100A to be manufactured with acceptable yield rate. For example, a 20 µm×20 µm micro-LED 100A with a 2 µm×2 µm opening can perform the similar light output characteristics as an ideal 2 µm×2 µm micro-LED.

In some embodiments, the size of the micro-LED 100A is smaller than 100 µm×100 µm or 0.01 $mm^2$.

In some embodiments, the current spreading length of the first type semiconductor layer 122 is less than the current spreading length of the second type semiconductor layer 124. In some embodiments, the current spreading length of the second type semiconductor layer 124 is over 20 times greater than the current spreading length of the first type semiconductor layer 122. In this configuration, charge carriers in the first type semiconductor layer 122 are more difficult to spread to the side surface of the first type semiconductor layer 122 and/or the side surface of the active layer 123. Therefore, the emitting area (or region) can be well-controlled.

The current spreading length of lateral direction of a semiconductor layer of a diode is determined by the following equation I:

$$L_s = \sqrt{\frac{n_{ideal}KT}{\rho J_0|e|}},\qquad \text{Equation 1}$$

where $L_s$ is the current spreading length of the semiconductor layer of the diode, t is the thickness of the semiconductor layer, $n_{ideal}$ is the ideality factor of the diode, K is the Boltzmann constant, T is the temperature of the semiconductor layer in Kelvin, $\rho$ is the resistivity of the semiconductor layer, $J_0$ is the current density at the interface between the semiconductor layer and a electrode of the diode, and e is the electric charge of an electron.

As confirmed by the aforementioned equation I, the current spreading length of the semiconductor layer of the diode is proportional to $$\sqrt{\frac{t}{\rho}}.$$

Therefore, in some embodiments, the first type semiconductor layer 122 has a resistivity $\rho_1$ and a thickness $t_1$, the second type semiconductor layer 124 has a resistivity $\rho_2$ and a thickness $t_2$, $$\sqrt{\frac{t_1}{\rho_1}} < \sqrt{\frac{t_2}{\rho_2}}$$

and to make the current spreading length of the first type semiconductor layer 122 to be less than the current spreading length of the second type semiconductor layer 124.

Figure 13:
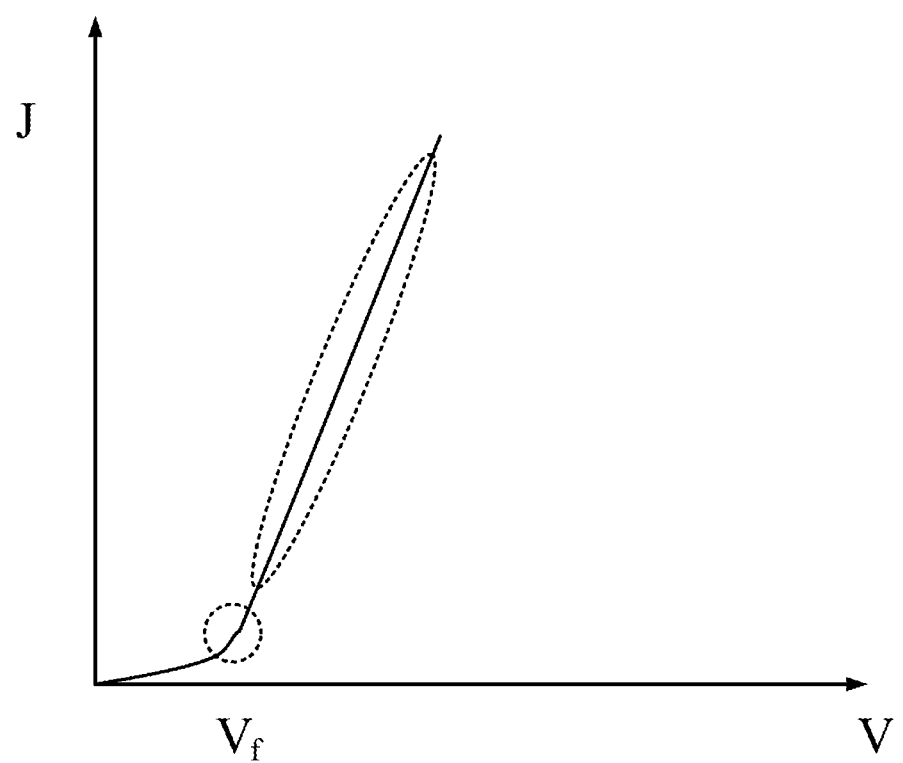
FIG. 13 illustrates a current density of the emitting area versus voltage JV curve of a micro-LED.

FIG. 13 illustrates a current density of the emitting area versus voltage JV curve of a micro-LED. In the mid/low power operation (i.e., at the region indicated by the dotted circle in FIG. 13), the operating of a conventional micro-LED is close to it's $V_f$ (diode forward voltage), this may cause non-uniform characteristics among different micro-LEDs.

Therefore, in some embodiments, the current controlling layer 130 with the opening 131 is joined with the first type semiconductor layer 122, which has a short current spreading length. Since the first type semiconductor layer 122 has the short current spreading length, the first type semiconductor layer 122 for example has high resistivity and is thin in thickness, as illustrated in FIG. 3A. Furthermore, since the opening 131 of the current controlling layer 130 accompanied with the first type semiconductor layer 122 having the short current spreading length limits the area where the current goes into the micro-LED 100A, the emitting area of the micro-LED 100A can be decreased to be smaller than the area of the active layer 123 so as to provide an adequate brightness, and the current density within the emitting area of the micro-LED 100A increases. Since the current density of the micro-LED 100A increases, the micro-LED 100A can be operated in the linear power operation (i.e., at the region indicated by the dotted oval in FIG. 13). The result is the better reliability and a better uniform characteristic of the micro-LED 100A.

In some embodiments, the first type semiconductor layer 122 is made of, for example, p-doped GaN or p-doped AlGaInP. The thickness of the first type semiconductor layer 122 is in a range from 50 nm to 20 μm. The first type semiconductor layer 122 is formed by, for example, epitaxy.

In some embodiments, the first type semiconductor layer 122 may include an optional ohmic contact layer (not shown) to reduce the contact resistance between the first conductive layer 140 and the first type semiconductor layer 122. In some embodiments, the ohmic contact layer and the rest of the first type semiconductor layer 122 are made of, for example, p-doped GaN or p-doped AlGaInP, while the ohmic contact layer is doped more heavily than the rest of the first type semiconductor layer 122. Alternatively, the ohmic contact layer is made of, for example, InGaN, and the rest of the first type semiconductor layer 122 is made of, for example, p-doped GaN or p-doped AlGaInP. The thickness of the ohmic contact layer is in a range from 5 nm to 2 μm. The thickness of the rest of the first type semiconductor layer 122 is in a range from 50 nm to 20 μm.

In some embodiments, the second type semiconductor layer 124 is made of, for example, n-doped GaN:Si. The thickness of the second type semiconductor layer 124 is in a range from 0.1 μm to 50 μm. The second type semiconductor layer 124 is formed by, for example, epitaxy.

Similarly, in some embodiments, the second type semiconductor layer 124 also includes an optional ohmic contact layer (not shown) to reduce the contact resistance between the second conductive layer 150 and the second type semiconductor layer 124. In some embodiments, the ohmic contact layer and the rest of the second type semiconductor layer 124 are made of, for example, n-doped GaN:Si, while the ohmic contact layer is doped more heavily than the rest of the second type semiconductor layer 124. The thickness of the ohmic contact layer is in a range from 5 nm to 2 μm. The thickness of the rest of the second type semiconductor layer 124 is in a range from 0.1 μm to 50 μm.

In some embodiments, the active layer 123 is made of, for example, heterostructure or quantum well structure. The thickness of the active layer 123 is in a range from 50 nm to 5 μm. The active layer 123 is formed by, for example, epitaxy.

In some embodiments, the active layer 123 can be omitted. In the case that the active layer 123 is omitted, the second type semiconductor layer 124 is directly joined with the first type semiconductor layer 122.

The second conductive layer 150 of the micro-LED 100A shown in FIG. 3A is at least partially joined with the second type semiconductor layer 124, such that the first type semiconductor layer 122, the active layer 123, and the second type semiconductor layer 124 are disposed between the first conductive layer 140 and the second conductive layer 150. Both the first conductive layer 140 and the second conductive layer 150 are made of a conductive material, such as metal or a transparent conductive material, e.g., indium tin oxide (ITO). The first conductive layer 140 and the second conductive layer 150 can be formed by, for example, physical vapor deposition (PVD) or chemical vapor deposition (CVD).

In addition, the second conductive layer 150 in the embodiment fully contacts the second type semiconductor layer 124, but the disclosure is not limited in this regard. In some embodiments, the second conductive layer 150 is in the form of a bonding wire and partially contacts the second type semiconductor layer 124.

In some embodiments, a combination of the first type semiconductor layer 122, the active layer 123, the second type semiconductor layer 124, and the current controlling layer 130 with the opening 131 is a solid with at least two planes. For example, the combination of the first type semiconductor layer 122, the active layer 123, the second type semiconductor layer 124, and the current controlling layer 130 with the opening 131 is a cylinder, a polyhedron, or a trapezoidal solid.

In some embodiments, the current controlling layer 130 is transparent. In some embodiments, the current controlling layer 130 is monochrome transparent. In some embodiments, the current controlling layer 130 is reflective. In some embodiments, the current controlling layer 130 is monochrome reflective.

In some embodiments, the current controlling layer 130 is a dielectric layer which is made of a dielectric material, such as silicon nitride or silicon dioxide. The thickness of the current controlling layer 130 is in a range from 1 nm to 5 μm. The current controlling layer 130 is formed by, for example, physical vapor deposition (PVD), CVD. However, the current controlling layer 130 of the disclosure is not limited to be a dielectric layer.

Figure 3B:
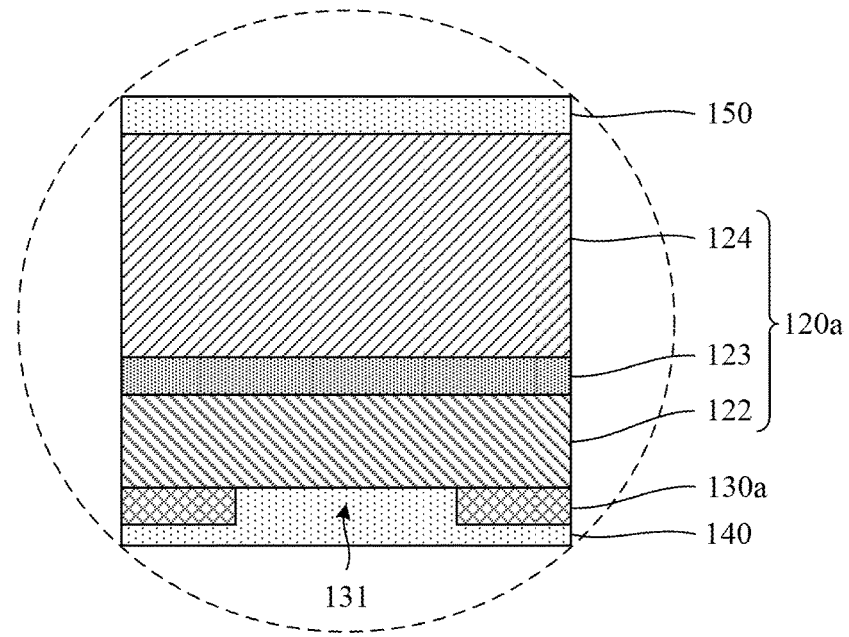
FIG. 3B is an enlarged cross-sectional view of the micro-LED in FIG. 1 according to a second embodiment of this disclosure.

FIG. 3B is an enlarged cross-sectional view of the micro-LED 100A according to a second embodiment of this disclosure. Referring now to FIG. 3B, the first type semiconductor layer 122 and the second type semiconductor layer 124 form a first p-n junction, the current controlling layer 130a and the first type semiconductor layer 122 form a second p-n junction, and the first conductive layer 140 and the second conductive layer 150 are configured to forward bias the first p-n junction while reverse bias the second p-n junction. In an embodiment, the first type semiconductor layer 122 is a p type semiconductor layer, and the second type semiconductor layer 124 and the current controlling layer 130a are n type semiconductor layers. In another embodiment, the first type semiconductor layer 122 is an n type semiconductor layer, and the second type semiconductor layer 124 and the current controlling layer 130a are p type semiconductor layers. As a result, no current will flow through the part of the active layer 123 corresponding to the current controlling layer 130a, so that the part of the active layer 123 is prevented from emitting light.

Other details regarding the micro-LED 100A of FIG. 3B are similar to the micro-LED 100A of FIG. 3A and therefore are not repeated here to avoid duplicity.

Figure 3C:
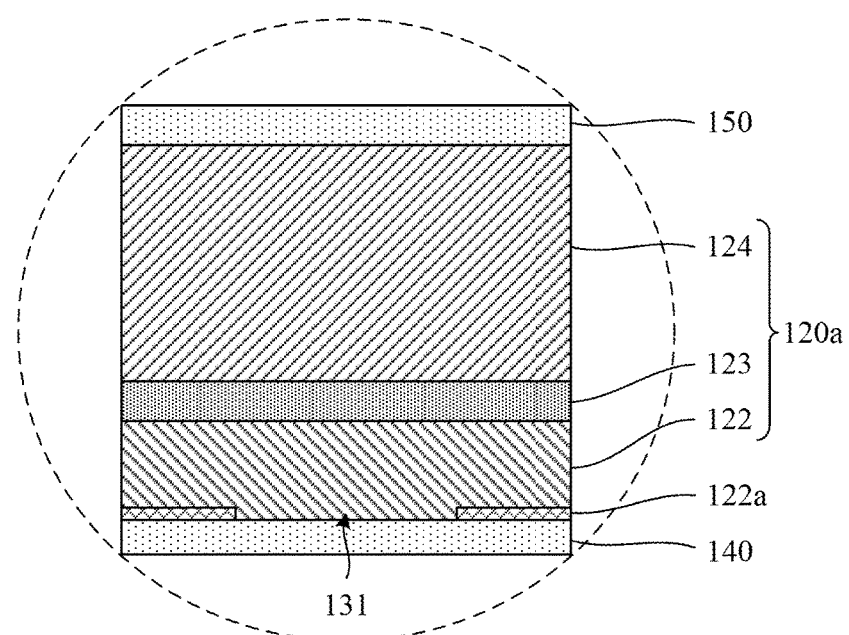
FIG. 3C is an enlarged cross-sectional view of the micro-LED in FIG. 1 according to a third embodiment of this disclosure.

FIG. 3C is an enlarged cross-sectional view of the micro-LED 100A according to still a third embodiment of this disclosure. Referring now to FIG. 3C, the first type semiconductor layer 122 and the second type semiconductor layer 124 form a p-n junction, and the current controlling layer 122a and the first type semiconductor layer 122 form a Schottky barrier. In the embodiments, the first type semiconductor layer 122 may consisted of heavily Mg-doped p-GaN (e.g., 30 nm in thickness and [Mg]=~2.2×10$^{20}$ cm-3) or moderately Mg-doped p-GaN (e.g., 120 nm in thickness and [Mg]=~2.1×10$^{19}$ cm-3), for example. To fabricate the current controlling layer 122a, an Ar$^+$ plasma treatment on the first type semiconductor layer 122 was performed using a predetermined working pressure, rf power, and a predetermined process time. The Schottky barrier were first fabricated on the treated surfaces of the first type semiconductor layer 122 using an Ni/Ag/Pt ohmic contact as the first conductive layer 140. It is evident that the bias current of the Ni/Ag/Pt contact formed on the plasma-treated surfaces of the first type semiconductor layer 122 are nearly zero in the measured voltage range from −1 to 5V, while the plasma-untreated surfaces of the first type semiconductor layer 122 shows ohmic behavior. That is, the Ar$^+$ plasma treatment to the first type semiconductor layer 122 led to the formation of a large barrier height. As a result, no current will flow through the part of the active layer 123 corresponding to the current controlling layer 122a, so that the part of the active layer 123 is prevented from emitting light.

Other details regarding the micro-LED 100A of FIG. 3C are similar to the micro-LED 100A of FIG. 3A and therefore are not repeated here to avoid duplicity.

In some embodiments, the first type semiconductor layer 122 has the resistivity $\rho_1$ mentioned above, the current controlling layer 130 is a high resistivity layer which has a resistivity $\rho_h$, and $\rho_h > \rho_1$. For example, may be over 10 times greater than $\rho_1$, but the disclosure is not limited in this regard. In some embodiments, the current controlling layer 130 can be a semiconductor layer lighter doped or un-doped respect to the first type semiconductor layer 122, a semi-metal layer, a ceramic layer, or a semi-insulator layer. As a result, the current controlling layer 130 can control most of the current to flow through the opening 131 of the current controlling layer 130, so as to limit the emitting area of the active layer 123 at a part corresponding to the opening 131 as possible.

In some embodiments, as shown in FIG. 3B, the first type semiconductor layer 122 is a p type semiconductor layer, the second type semiconductor layer 124 is an n type semiconductor layer, and the current controlling layer 130 is a hole blocking layer. The LUMO (Lowest Unoccupied Molecular Orbital) energy level of the current controlling layer 130 is lower than that of the first type semiconductor layer 122 for at least 0.2 eV, so as to block holes transporting from the first type semiconductor layer 122 to the active layer 123. As a result, the holes in the first type semiconductor layer 122 can only transport to the active layer 123 via the opening 131 of the current controlling layer 130. For example, the material of the current controlling layer 130 can be $Al_xGa_yN_{(1-x-y)}$ with superlattice structure.

In some embodiments, as shown in FIG. 3B, the first type semiconductor layer 122 is an n type semiconductor layer, the second type semiconductor layer 124 is a p type semiconductor layer, and the current controlling layer 130 is an electron blocking layer. The HOMO (Highest Occupied Molecular Orbital/Conduction band) energy level of the current controlling layer 130 is higher than that of the first type semiconductor layer 122 for at least 0.2 eV, so as to block electrons transporting from the first type semiconductor layer 122 to the active layer 123. As a result, the electrons in the first type semiconductor layer 122 can only transport to the active layer 123 via the opening 131 of the current controlling layer 130. For example, the material of the current controlling layer 130 can be $Al_xGa_yN_{(1-x-y)}$ with superlattice structure.

Referring back to FIG. 1 and FIG. 3A, in the embodiment, the current controlling layer 130 is located at a side of the micro p-n diodes 120a proximal to the bonding electrode 310 of the receiving substrate 300. That is, the opening 131 of the current controlling layer 130 faces toward the receiving substrate 300. However, the disclosure is not limited in this regard.

Figure 4A:
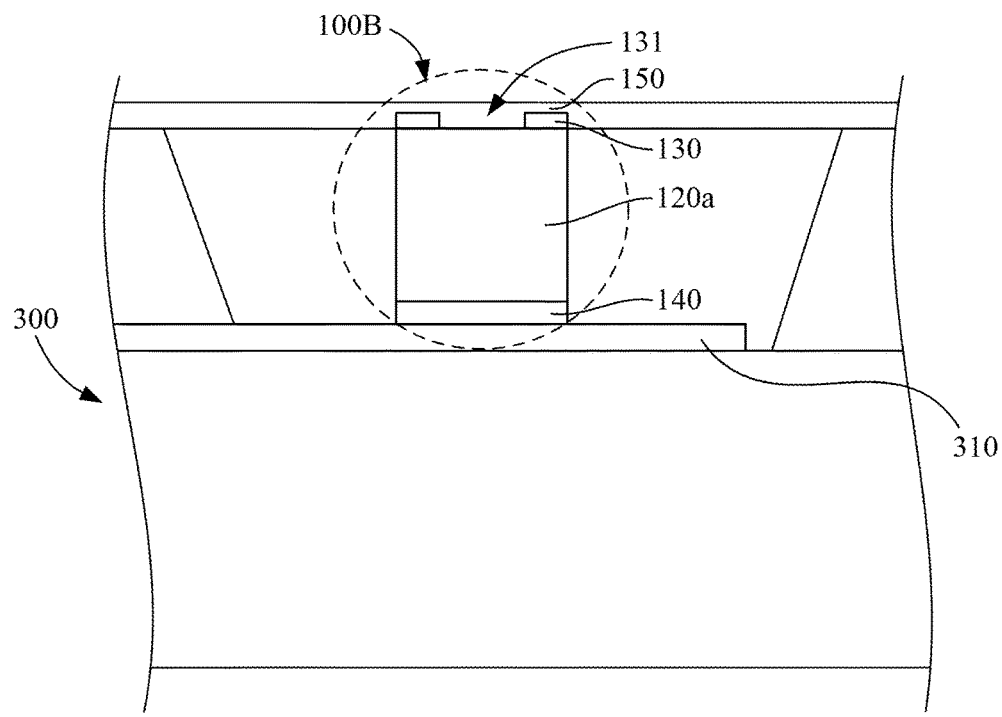
FIG. 4A is a cross-sectional view of a micro-LED disposed on a receiving substrate according to an embodiment of this disclosure.
Figure 4B:
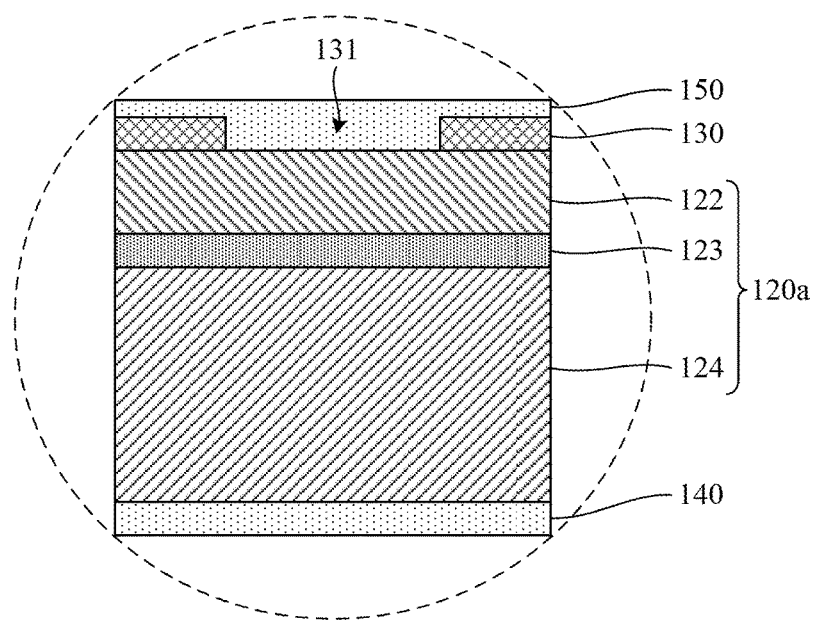
FIG. 4B is an enlarged cross-sectional view of the micro-LED in FIG. 4A according to an embodiment of this disclosure.

FIG. 4A is a cross-sectional view of a micro-LED 100B disposed on a receiving substrate 300 according to an embodiment of this disclosure. FIG. 4B is an enlarged cross-sectional view of the micro-LED 100B in FIG. 4A according to an embodiment of this disclosure. The micro-LED 100B also includes a micro p-n diodes 120a, a current controlling layer 130, a first conductive layer 140, and a second conductive layer 150. A combination of the first type semiconductor layer 122, the active layer 123, the second type semiconductor layer 124, the current controlling layer 130, the first conductive layer 140, and the second conductive layer 150 is joined with the bonding electrode 310 on the receiving substrate 300, so as to form a micro-LED display. The difference between the micro-LED 100B of FIG. 4A and the micro-LED 100A of FIG. 3A is that the current controlling layer 130 of FIG. 4A is located at a side of the micro p-n diodes 120a distal to the bonding electrode 310 of the receiving substrate 300. That is, the opening 131 of the current controlling layer 130 of FIG. 4A faces away from the receiving substrate 300.

To manufacture the micro-LED 100B shown in FIGS. 4A & 4B, a semiconductor device layer 120 and a patterned current controlling layer 130 can be sequentially formed on a growth substrate 110 (as illustrated in FIG. 2C). A difference between the manufacturing of the micro-LED 100B of FIG. 4A and the micro-LED 100A of FIG. 1 is that the formation of the first conductive layer 140 of micro-LED 100B is performed after bonding the structure of FIG. 2C to the structure of FIG. 2E (as the operation illustrated in FIG. 2F) and removing the growth substrate 110. After forming the first conductive layer 140 on the thinned p-n diode layer 120, the combination of the first conductive layer 140, the thinned p-n diode layer 120, and the current controlling layer 130 is etched to form a plurality of micro p-n diodes 120a (as the operation illustrated in FIG. 2H). Alternatively, in some embodiments, the first conductive layer 140 is formed on the receiving substrate 300 in advance, rather than formed on the thinned p-n diode layer 120. In some embodiments, the first conductive layer 140 can be omitted, and the p-n diode layer 120 can be directly joined with the bonding electrode 310 on the receiving substrate 300.

Afterwards, to make the opening 131 of the current controlling layer 130 of FIG. 4A face away from the receiving substrate 300, the micro p-n diodes 120a can be transferred to another carrier substrate 200 to reverse the orientation of the micro p-n diodes 120a prior to transferring the micro p-n diodes 120a to the receiving substrate 300 (as the operation illustrated in FIG. 2I). After bonding the micro p-n diodes 120a to the later carrier substrate 200, the adhesion force of the adhesive layer 210 on the former carrier substrate 200 is decreased, so as to separate the micro p-n diodes 120a from the former carrier substrate 200. Alternatively, in some embodiments, the micro p-n diodes 120a can be picked up twice sequentially by two transfer heads to reverse the orientation of the micro p-n diodes 120a prior to transferring the micro p-n diodes 120a to the receiving substrate 300. Other details regarding the micro-LED 100B of FIG. 4A are similar to the micro-LED 100A of FIG. 1 and therefore are not repeated here to avoid duplicity.

Figure 4C:
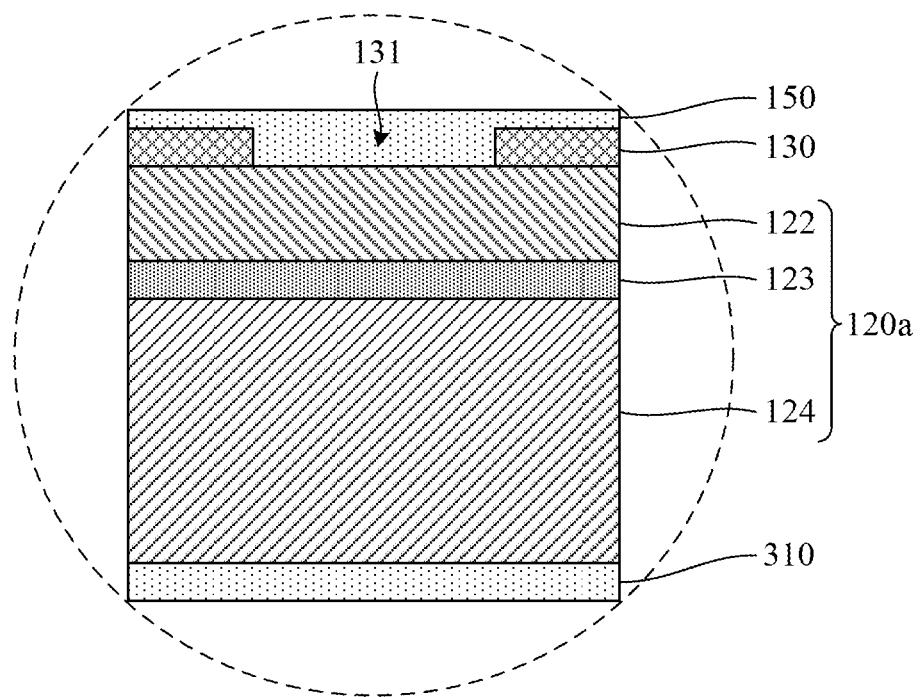
FIG. 4C is an enlarged cross-sectional view of the micro-LED in FIG. 4A according to an embodiment of this disclosure.

FIG. 4C is an enlarged cross-sectional view of the micro-LED 100B in FIG. 4A according to an embodiment of this disclosure. A difference between the manufacturing of the micro-LED 100B of FIG. 4C and the micro-LED 100B of FIG. 4A is that the operation of forming the first conductive layer 140 can be omitted in the micro-LED 100B of FIG. 4A, and the combination of first type semiconductor layer 122, the active layer 123, the second type semiconductor layer 124, and the current controlling layer 130 can be directly bonded to the bonding electrode 310 of the receiving substrate 300. In other words, the bonding electrode 310 can serve as the first conductive layer 140 of the micro-LED 100B of FIG. 4A.

Other details regarding the micro-LED 100B of FIG. 4C are similar to the micro-LED 100B of FIG. 4A and therefore are not repeated here to avoid duplicity.

Figure 5A:
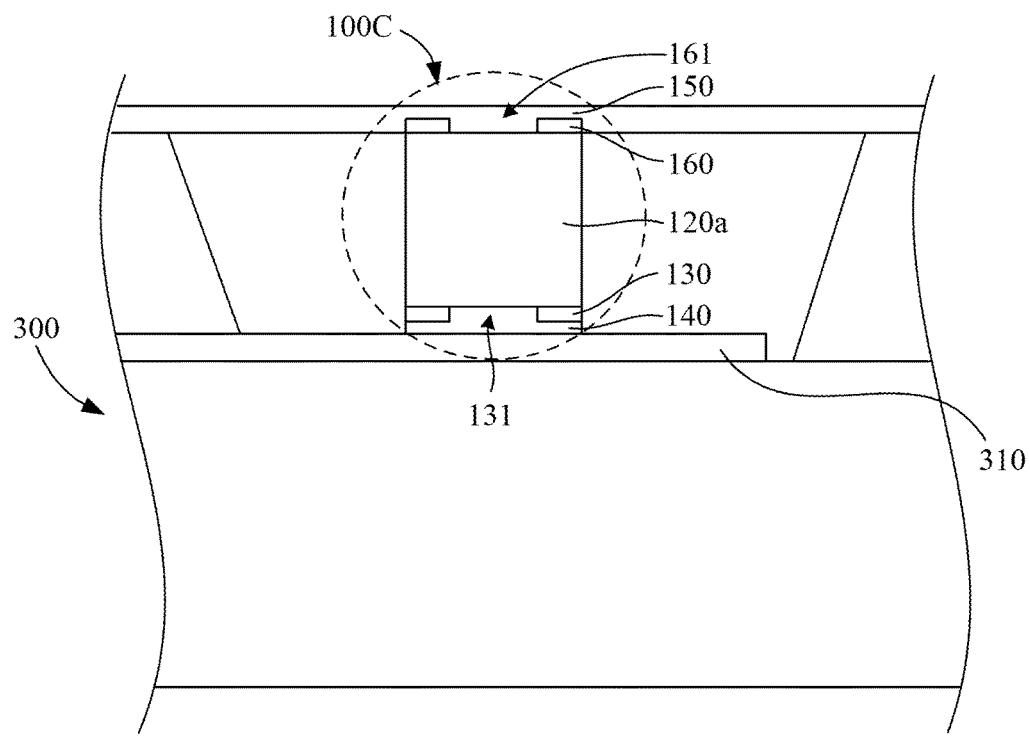
FIG. 5A is a cross-sectional view of a micro-LED disposed on a receiving substrate according to an embodiment of this disclosure.
Figure 5B:
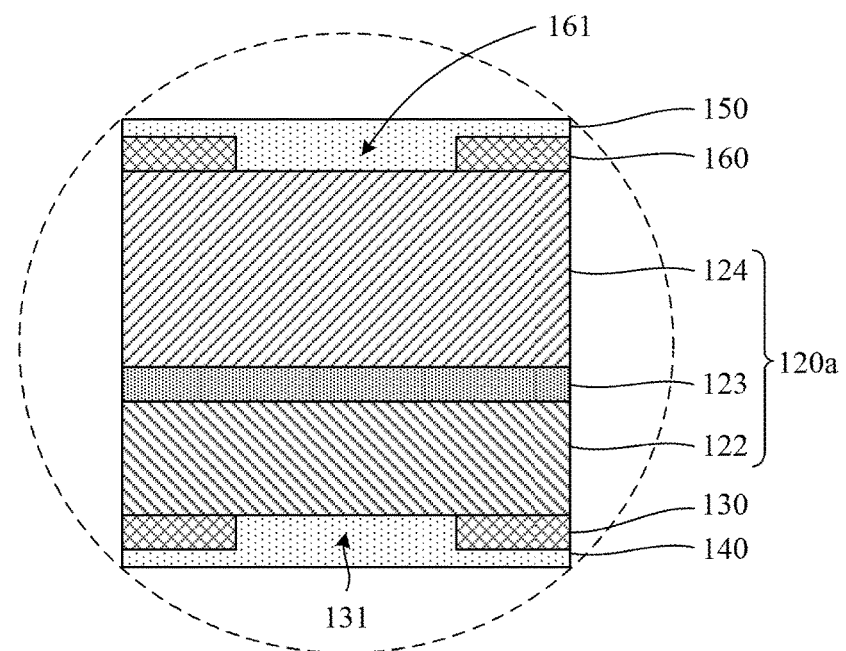
FIG. 5B is an enlarged cross-sectional view of the micro-LED in FIG. 5A according to an embodiment of this disclosure.

FIG. 5A is a cross-sectional view of a micro-LED 100C disposed on a receiving substrate 300 according to an embodiment of this disclosure. FIG. 5B is an enlarged cross-sectional view of the micro-LED 100C in FIG. 5A according to an embodiment of this disclosure. The micro-LED 100C also includes a micro p-n diodes 120a, a current controlling layer 130, a first conductive layer 140, and a second conductive layer 150, and further includes another current controlling layer 160. The difference between the micro-LED 100C of FIG. 5A and the micro-LED 100A of FIG. 1 is that the micro-LED 100C further includes the current controlling layer 160 located at a side of the micro p-n diodes 120a distal to the bonding electrode 310 of the receiving substrate 300, in which the current controlling layer 160 has at least one opening 161 therein, and the second conductive layer 150 extends through the opening 161 of the current controlling layer 160 to be electrically coupled with the second type semiconductor layer 124. That is, the opening 161 of the current controlling layer 160 of FIG. 5A faces away from the receiving substrate 300.

To manufacture the micro-LED 100C shown in FIGS. 5A & 5B, operations illustrated by FIG. 2A-2G can be sequentially performed. A difference between the manufacturing of the micro-LED 100C of FIG. 5A and the micro-LED 100A of FIG. 1 is that the formation of the current controlling layer 160 is performed after removing the growth substrate 110. After forming the current controlling layer 160 on the thinned p-n diode layer 120, the combination of the current controlling layer 160, the thinned p-n diode layer 120, the current controlling layer 130, and the first conductive layer 140 is etched to form a plurality of micro p-n diodes 120a (as the operation illustrated in FIG. 2H). Afterwards, the micro p-n diodes 120a are poised for pick up and transfer to the receiving substrate 300 (as the operation illustrated in FIG. 2I). Other details regarding the micro-LED 100C of FIG. 5A are similar to the micro-LED 100A of FIG. 1 and therefore are not repeated here to avoid duplicity.

Figure 6:
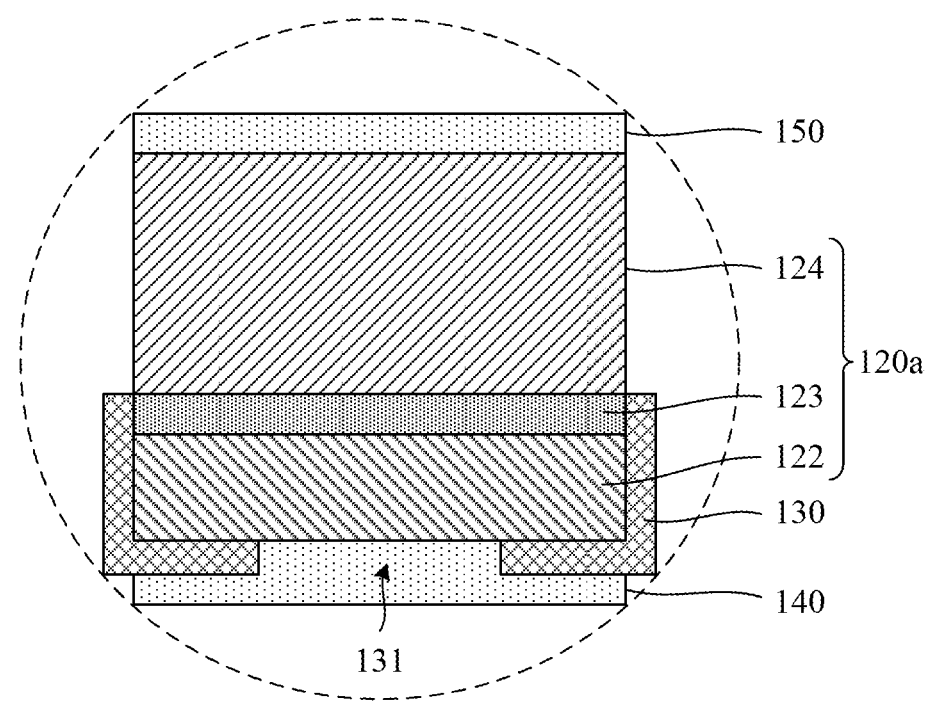
FIG. 6 is an enlarged cross-sectional view of a micro-LED according to another embodiment of this disclosure.

FIG. 6 is an enlarged cross-sectional view of a micro-LED 100A according to another embodiment of this disclosure. Similar to the current controlling layer 130 in FIG. 3A, the current controlling layer 130 of FIG. 6 partially cover a major surface of the first type semiconductor layer 122 distal to the second type semiconductor layer 124. The difference between the current controlling layer 130 of FIG. 6 and the current controlling layer 130 of FIG. 3A is that the current controlling layer 130 of FIG. 6 further at least partially covers the side surfaces of the first type semiconductor layer 122 and the active layer 123, and the current controlling layer 130 must be a dielectric layer. In this configuration, the side surfaces of the first type semiconductor layer 122 and the active layer 123 can be protected from moisture, process contamination, and mechanical damage by the current controlling layer 130. It is noted that all embodiments of the current controlling layer described above (i.e., the current controlling layers 130, 130a, and 122a) can be applied if the current controlling layer only partially covers the side surface of the first type semiconductor layer 122 without the side surface of the active layer 123.

Other details regarding the micro-LED 100A of FIG. 6 are similar to the micro-LED 100A of FIG. 3A and therefore are not repeated here to avoid duplicity.

Figure 7A:
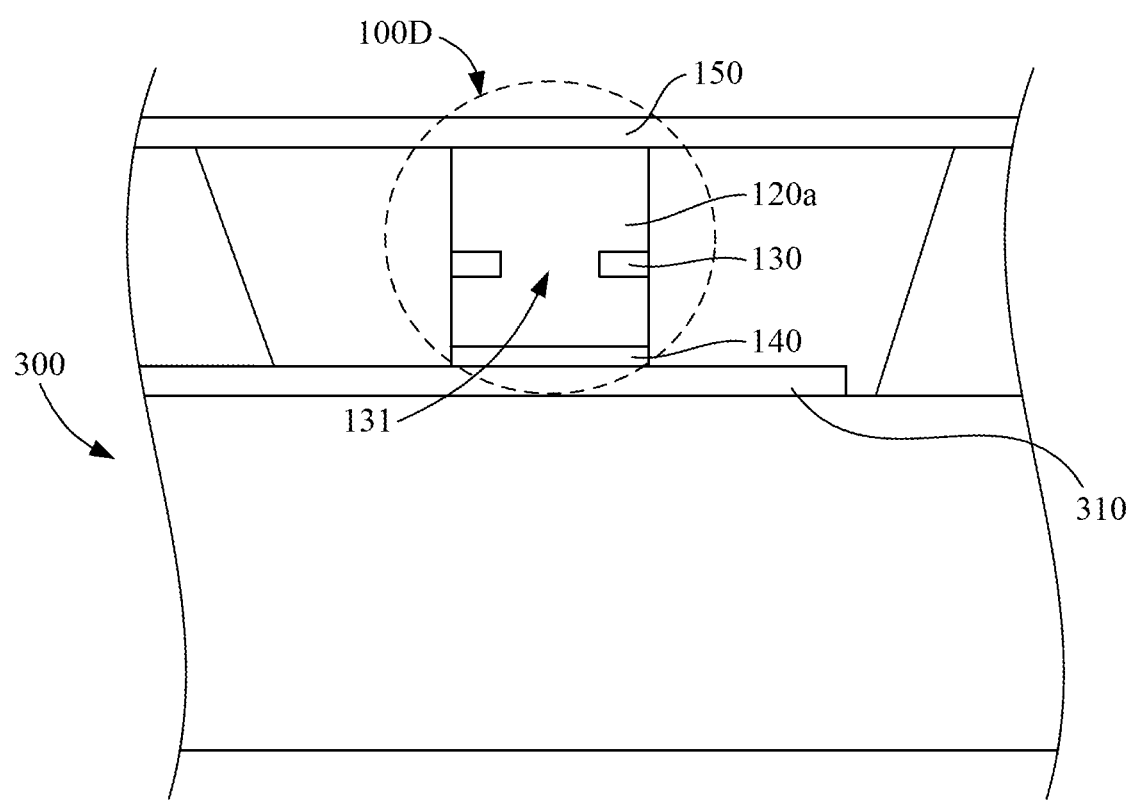
FIG. 7A is a cross-sectional view of a micro-LED disposed on a receiving substrate according to an embodiment of this disclosure.
Figure 7B:
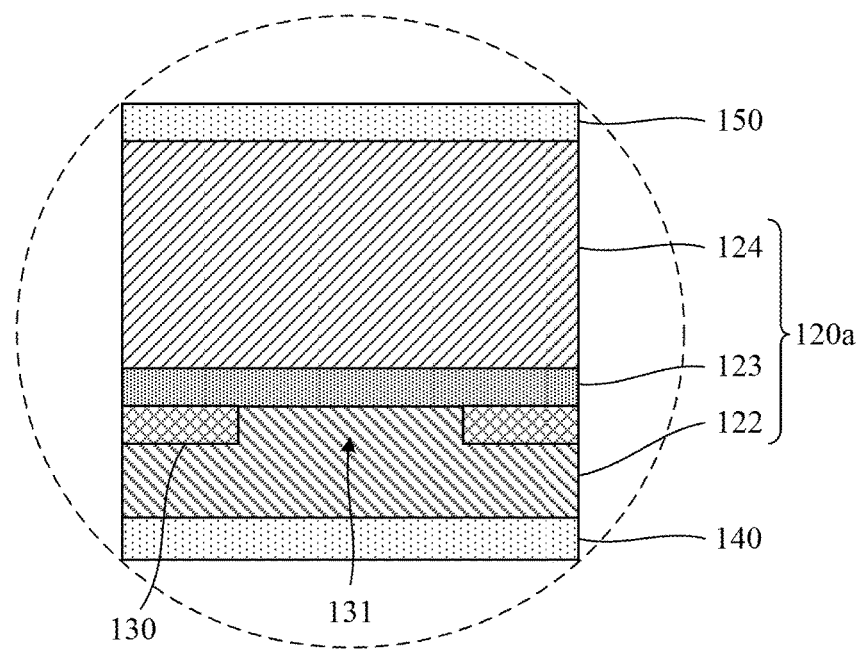
FIG. 7B is an enlarged cross-sectional view of the micro-LED in FIG. 7A according to an embodiment of this disclosure.

FIG. 7A is a cross-sectional view of a micro-LED 100D disposed on a receiving substrate 300 according to an embodiment of this disclosure. FIG. 7B is an enlarged cross-sectional view of the micro-LED 100D in FIG. 7A according to an embodiment of this disclosure. The micro-LED 100D includes a micro p-n diode 120a, a current controlling layer 130 disposed in the micro p-n diode 120a, a first conductive layer 140, and a second conductive layer 150. The micro p-n diode 120a includes a first type semiconductor layer 122, an active layer 123, and a second type semiconductor layer 124. The first type semiconductor layer 122 is a p type semiconductor layer, and the second type semiconductor layer 124 is an n type semiconductor layer. The second type semiconductor layer 124 is joined with the first type semiconductor layer 122. The active layer 123 is disposed between the first type semiconductor layer 122 and the second type semiconductor layer 124. The current controlling layer 130 is disposed between the first type semiconductor layer 122 and the active layer 123 and has at least one opening 131, and the first type semiconductor layer 122 is electrically coupled with the active layer 123 through the opening 131 of the current controlling layer 130. The first conductive layer 140 is electrically coupled with the first type semiconductor layer 122. The second conductive layer 150 is electrically coupled with the second type semiconductor layer 124. In some embodiments, the first conductive layer 140 can be omitted, and the micro p-n diode 120a can be directly joined with the bonding electrode 310 on the receiving substrate 300.

It is noted that the difference between the current controlling layer 130 of FIG. 7B and the current controlling layer 130 of FIG. 1 is that the current controlling layer 130 of FIG. 7B is disposed between the first type semiconductor layer 122 and the active layer 123, and the current controlling layer 130 contacts the active layer 123. To manufacture the micro-LED 100D shown in FIG. 7B in which the current controlling layer 130 is disposed between the first type semiconductor layer 122 and the active layer 123, the formation of the current controlling layer 130 illustrated in FIGS. 2A & 2C can be brought forward to be performed after the formation of the active layer 123 and before the formation of the first type semiconductor layer 122 illustrated in FIG. 2B.

Figure 7C:
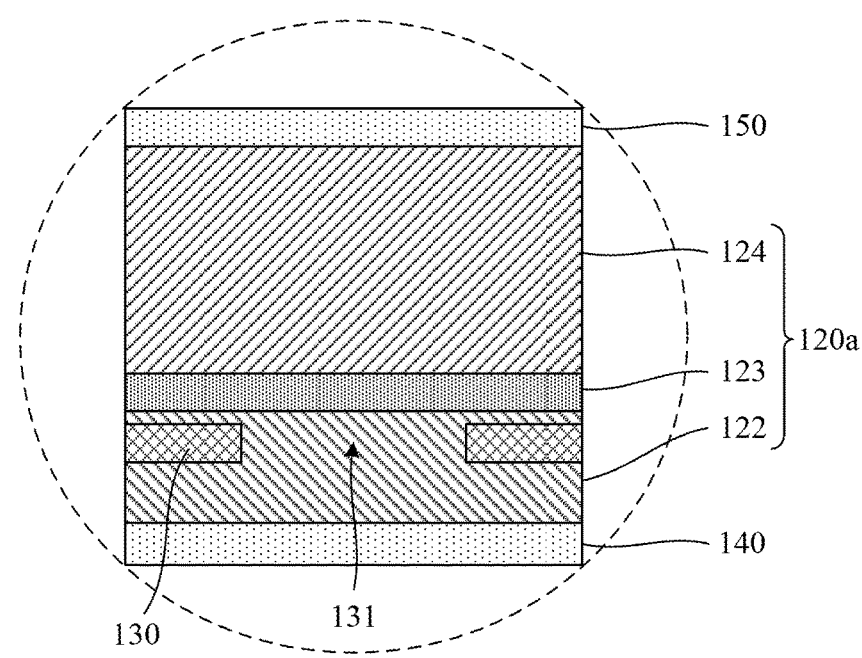
FIG. 7C is an enlarged cross-sectional view of the micro-LED in FIG. 7A according to another embodiment of this disclosure.

FIG. 7C is an enlarged cross-sectional view of the micro-LED 100D in FIG. 7A according to another embodiment of this disclosure. The difference between the current controlling layer 130 of FIG. 7C and the current controlling layer 130 of FIG. 7B is that the current controlling layer 130 of FIG. 7C is disposed in the first type semiconductor layer 122 without contacting the active layer 123. In this configuration, the first type semiconductor layer 122 may protect the active layer 123 while manufacturing the current controlling layer 130.

To manufacture the micro-LED 100D shown in FIG. 7C in which the current controlling layer 130 is disposed in the first type semiconductor layer 122, the formation of the current controlling layer 130 illustrated in FIGS. 2A & 2C can be brought forward to be performed during the formation of the first type semiconductor layer 122 illustrated in FIG. 2B. For example, the current controlling layer 130 can be formed after forming 10% of the first type semiconductor layer 122, and the rest 90% of the first type semiconductor layer 122 is then formed after the formation of the current controlling layer 130.

Other details regarding the micro-LED 100D of FIG. 7C are similar to the micro-LED 100D of FIG. 7B and therefore are not repeated here to avoid duplicity.

Figure 7D:
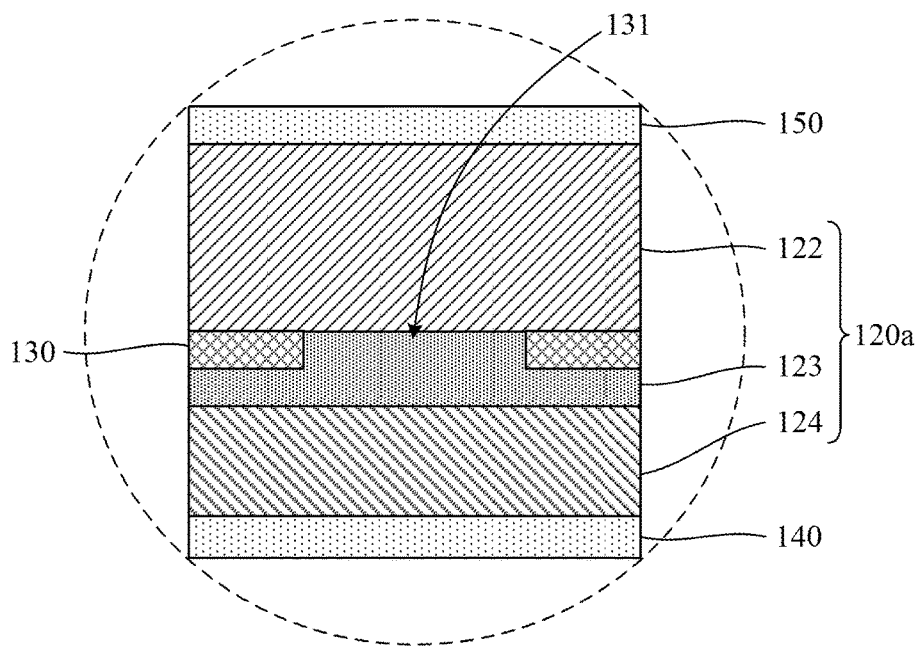
FIG. 7D is an enlarged cross-sectional view of the micro-LED in FIG. 7A according to another embodiment of this disclosure.

FIG. 7D is an enlarged cross-sectional view of the micro-LED 100D in FIG. 7A according to an embodiment of this disclosure. The differences between the current controlling layer 130 of FIG. 7D and the current controlling layer 130 of FIG. 1 are that the current controlling layer 130 of FIG. 7D is disposed between the first type semiconductor layer 122 and the active layer 123, the current controlling layer 130 contacts the active layer 123, the first type semiconductor layer 122 is an n type semiconductor layer, and the second type semiconductor layer 124 is a p type semiconductor layer. To manufacture the micro-LED 100D shown in FIG. 7D in which the current controlling layer 130 is disposed between the first type semiconductor layer 122 and the active layer 123, the formation of the current controlling layer 130 illustrated in FIGS. 2A & 2C can be brought forward to be performed before the formation of the active layer 123 illustrated in FIG. 2B.

In the embodiment, after the patterned current controlling layer 130 is formed on the first type semiconductor layer 122, the active layer 123 is formed from the opening 131 of the current controlling layer 130, but the disclosure is not limited in this regard. In some embodiments, after the patterned current controlling layer 130 is formed on the first type semiconductor layer 122, the opening 131 of the current controlling layer 130 can be further filled with first type semiconductor layer 122.

Other details regarding the micro-LED 100D of FIG. 7D are similar to the micro-LED 100D of FIG. 7B and therefore are not repeated here to avoid duplicity.

Figure 7E:
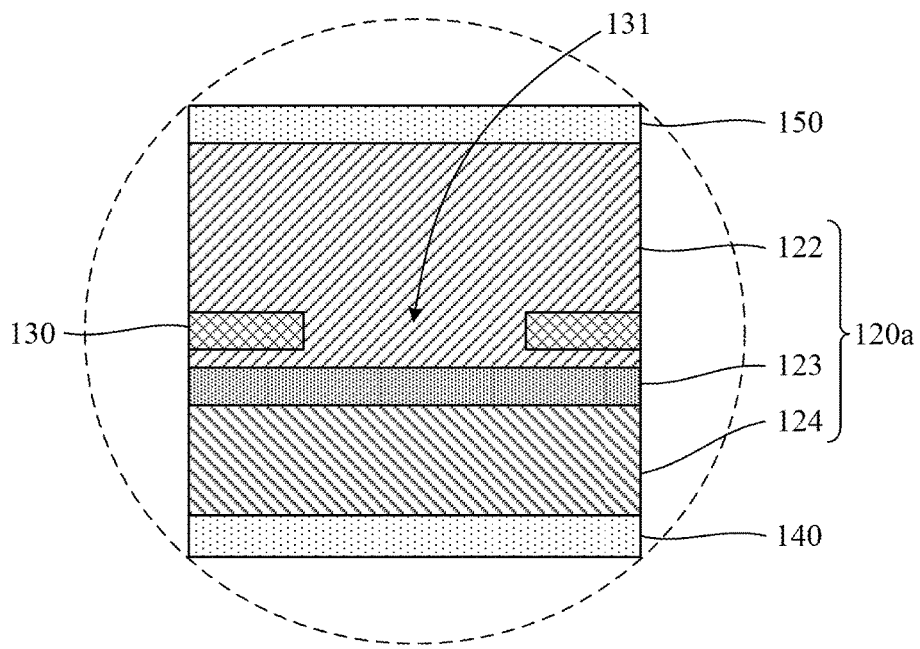
FIG. 7E is an enlarged cross-sectional view of the micro-LED in FIG. 7A according to another embodiment of this disclosure.

FIG. 7E is an enlarged cross-sectional view of the micro-LED 100D in FIG. 7A according to another embodiment of this disclosure. The difference between the current controlling layer 130 of FIG. 7E and the current controlling layer 130 of FIG. 7D is that the current controlling layer 130 of FIG. 7E is disposed in the first type semiconductor layer 122 without contacting the active layer 123.

To manufacture the micro-LED 100D shown in FIG. 7E in which the current controlling layer 130 is disposed in the first type semiconductor layer 122, the formation of the current controlling layer 130 illustrated in FIGS. 2A & 2C can be brought forward to be performed during the formation of the first type semiconductor layer 122 illustrated in FIG. 2B. For example, the current controlling layer 130 can be formed after forming 90% of the first type semiconductor layer 122, and the rest 10% of the first type semiconductor layer 122 is then formed after the formation of the current controlling layer 130.

Other details regarding the micro-LED 100D of FIG. 7E are similar to the micro-LED 100D of FIG. 7D and therefore are not repeated here to avoid duplicity.

Figure 7F:
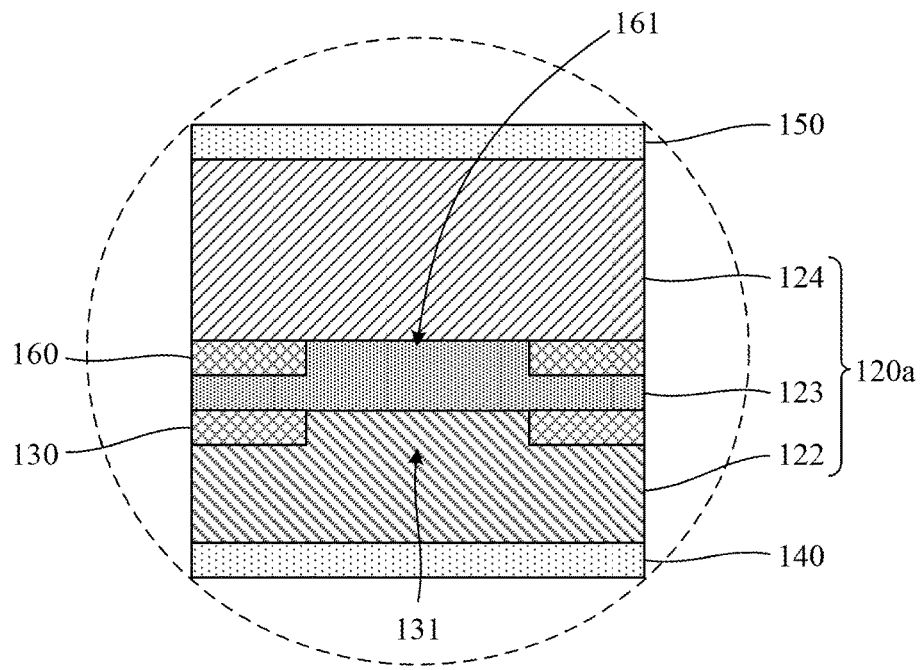
FIG. 7F is an enlarged cross-sectional view of the micro-LED in FIG. 7A according to another embodiment of this disclosure.

FIG. 7F is an enlarged cross-sectional view of the micro-LED 100D in FIG. 7A according to an embodiment of this disclosure. The difference between the micro-LED 100D of FIG. 7F and the micro-LED 100D of FIG. 7B is that the micro-LED 100D of FIG. 7F further includes a current controlling layer 160. The current controlling layer 160 is disposed between the active layer 123 and the second type semiconductor layer 124. That is, the current controlling layers 130 and 160 are respectively located at opposite sides of the active layer 123. To manufacture the micro-LED 100D shown in FIG. 7F in which the current controlling layer 130 is disposed between the first type semiconductor layer 122 and the active layer 123 and current controlling layer 160 is disposed between the second type semiconductor layer 124 and the active layer 123, the formation of the current controlling layer 160 can be performed after the formation of the second type semiconductor layer 124 and before the formation of the active layer 123 illustrated in FIG. 2B, and the formation of the current controlling layer 130 illustrated in FIGS. 2A & 2C can be brought forward to be performed after the formation of the active layer 123 and before the formation of the first type semiconductor layer 122 illustrated in FIG. 2B. Similarly, in some embodiments, the opening 161 of the current controlling layer 160 can be filled with the active layer 123 or the second type semiconductor layer 124.

Other details regarding the micro-LED 100D of FIG. 7F are similar to the micro-LED 100D of FIG. 7B and therefore are not repeated here to avoid duplicity.

Figure 7G:
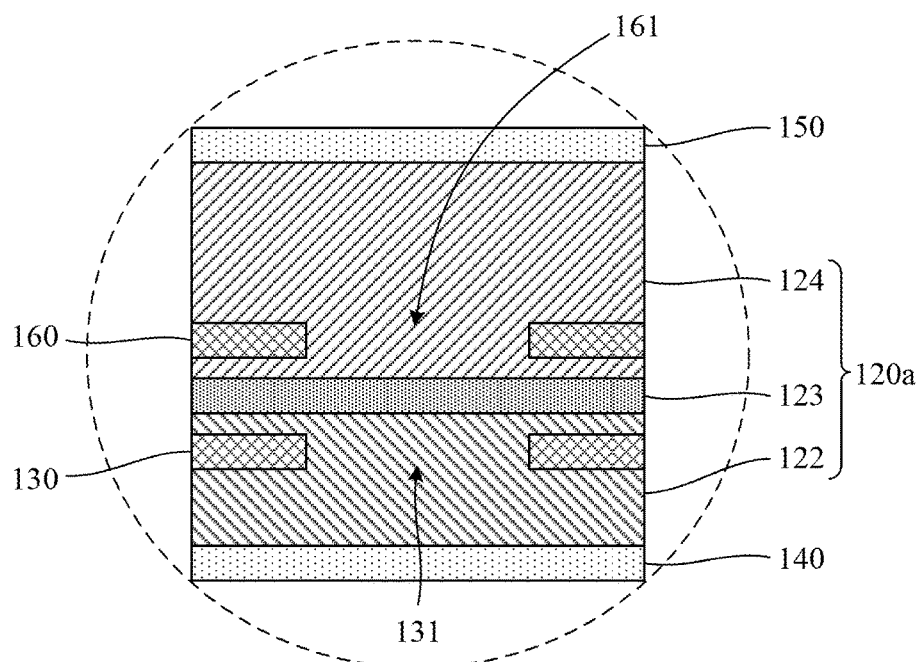
FIG. 7G is an enlarged cross-sectional view of the micro-LED in FIG. 7A according to another embodiment of this disclosure.

FIG. 7G is an enlarged cross-sectional view of the micro-LED 100D in FIG. 7A according to another embodiment of this disclosure. The differences between the current controlling layers 130 and 160 of FIG. 7G and the current controlling layers 130 and 160 of FIG. 7F are that the current controlling layer 130 of FIG. 7G is disposed in the first type semiconductor layer 122 without contacting the active layer 123 and the current controlling layer 160 of FIG. 7G is disposed in the second type semiconductor layer 124 without contacting the active layer 123. In this configuration, the first type semiconductor layer 122 may protect the active layer 123 while manufacturing the current controlling layer 130.

In some embodiments, only one of the current controlling layers 130 and 160 is formed to contact the active layer 123, and the other one of the current controlling layers 130 and 160 is formed without contacting the active layer 123.

To manufacture the micro-LED 100D shown in FIG. 7G in which the current controlling layer 130 is disposed in the first type semiconductor layer 122 and the current controlling layer 160 is disposed in the second type semiconductor layer 124, the formation of the current controlling layer 160 can be performed during the formation of the second type semiconductor layer 124 illustrated in FIG. 2B, and the formation of the current controlling layer 130 illustrated in FIGS. 2A & 2C can be brought forward to be performed during the formation of the first type semiconductor layer 122 illustrated in FIG. 2B. For example, the current controlling layer 160 can be formed after forming 90% of the second type semiconductor layer 124, and the rest 10% of the second type semiconductor layer 124 is then formed after the formation of the current controlling layer 160. For example, the current controlling layer 130 can be formed after forming 10% of the first type semiconductor layer 122, and the rest 90% of the first type semiconductor layer 122 is then formed after the formation of the current controlling layer 130.

Other details regarding the micro-LED 100D of FIG. 7G are similar to the micro-LED 100D of FIG. 7F and therefore are not repeated here to avoid duplicity.

In some embodiments, the current controlling layer 130 is disposed in the micro p-n diode 120a (e.g., between at least a part of the first type semiconductor layer 122 and the active layer 123 as shown in FIG. 7F and FIG. 7G), and the current controlling layer 160 is disposed outside the micro p-n diode 120a (e.g., between the second type semiconductor layer 124 and the second conductive layer 150 as shown in FIG. 5B). In some embodiments, the current controlling layer 130 is disposed outside the micro p-n diode 120a (e.g., between the first type semiconductor layer 122 and the first conductive layer 140 as shown in FIG. 5B), and the current controlling layer 160 is disposed in the micro p-n diode 120a (e.g., between at least a part of the second type semiconductor layer 124 and the active layer 123 as shown in FIG. 7F and FIG. 7G).

It is noted that in the micro-LEDs 100D of FIG. 7B to FIG. 7G, to achieve the purpose of current control, the current controlling layer 130 is a dielectric layer in some embodiments, but the disclosure is not limited in this regard. In some embodiments, the first type semiconductor layer 122 and the second type semiconductor layer 124 form a first p-n junction, the current controlling layer 130 and the first type semiconductor layer 122 form a second p-n junction, and the first conductive layer 140 and the second conductive layer 150 are configured to forward bias the first p-n junction while reverse bias the second p-n junction. In some embodiments, the first type semiconductor layer 122 and the second type semiconductor layer 124 form a p-n junction, and the current controlling layer 130 and the first type semiconductor layer 122 form a Schottky barrier. In some embodiments, the first type semiconductor layer 122 has the resistivity $\rho_1$, the current controlling layer 130 is a high resistivity layer which has a resistivity $\rho_h$, and $\rho_h > \rho_1$. In some embodiments, the first type semiconductor layer 122 is a p type semiconductor layer, the second type semiconductor layer 124 is an n type semiconductor layer, and the current controlling layer 130 is a hole blocking layer. In some embodiments, the first type semiconductor layer 122 is an n type semiconductor layer, the second type semiconductor layer 124 is a p type semiconductor layer, and the current controlling layer 130 is an electron blocking layer. The mechanism of controlling current of the current controlling layer 160 of FIG. 7F and FIG. 7G can be similar to one of the above embodiments of the current controlling layer 130 and therefore are not repeated here to avoid duplicity.

Figure 8A:
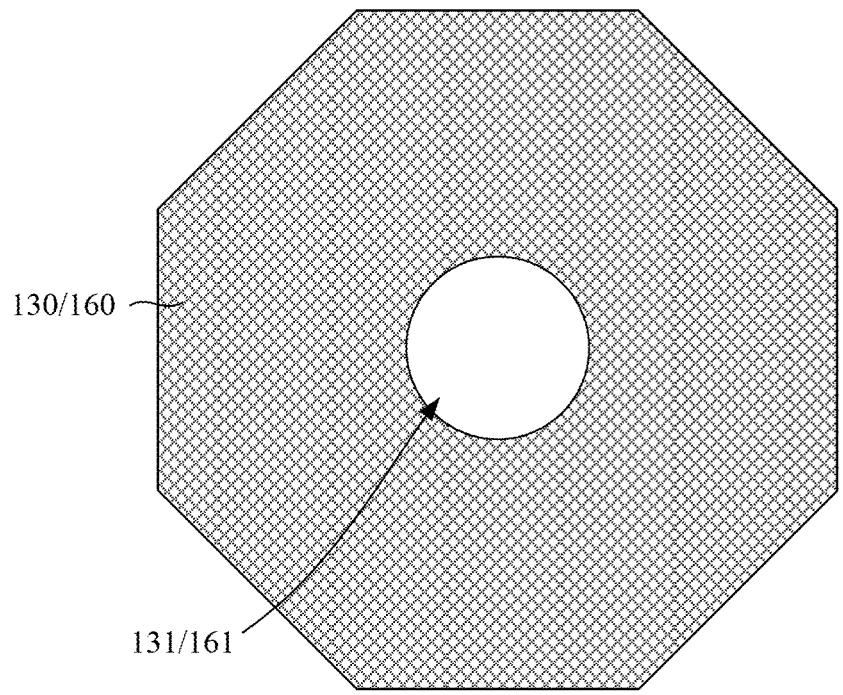
FIG. 8A is a plan view of a current controlling layer according to an embodiment of this disclosure.

FIG. 8A is a plan view of a current controlling layer 130 or 160 according to an embodiment of this disclosure. As shown in FIG. 8A, the current controlling layer 130 or 160 has only one opening 131 or 161 therein. More specifically, the opening 131 or 161 of FIG. 8A are circular in shape. However, the disclosure is not limited in this regard.

Figure 8B:
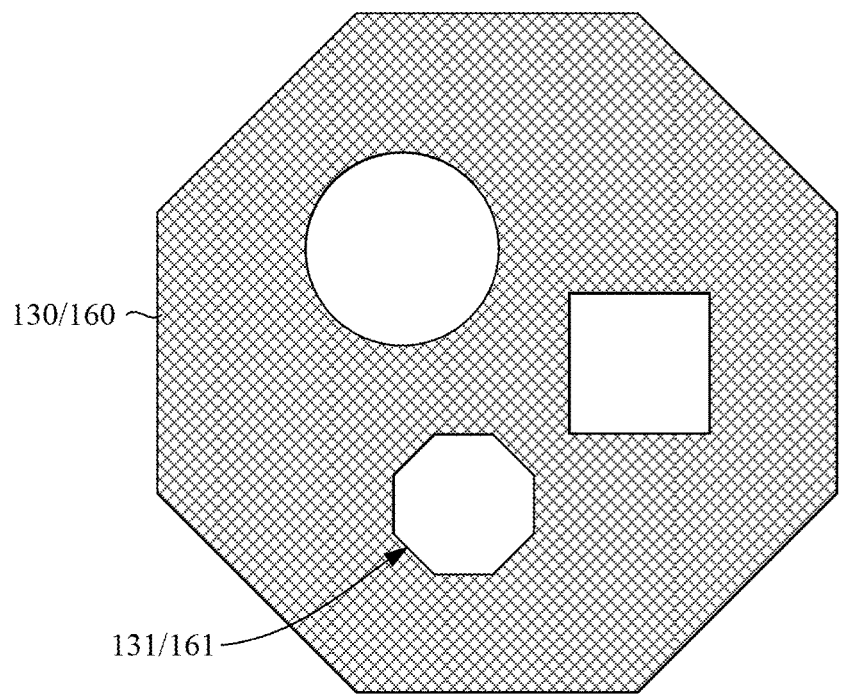
FIG. 8B is a plan view of a current controlling layer according to another embodiment of this disclosure.

FIG. 8B is a plan view of a current controlling layer 130 or 160 according to another embodiment of this disclosure. As shown in FIG. 8B, the current controlling layer 130 or 160 has a plurality of the openings 131 or 161 therein. The number of the openings 131 or 161 is in a range from 1 to 1000. The openings 131 or 161 have different shapes. In another embodiment, the openings 131 or 161 can the same shape, and the openings 131 or 161 can be arranged in an array.

Figure 8C:
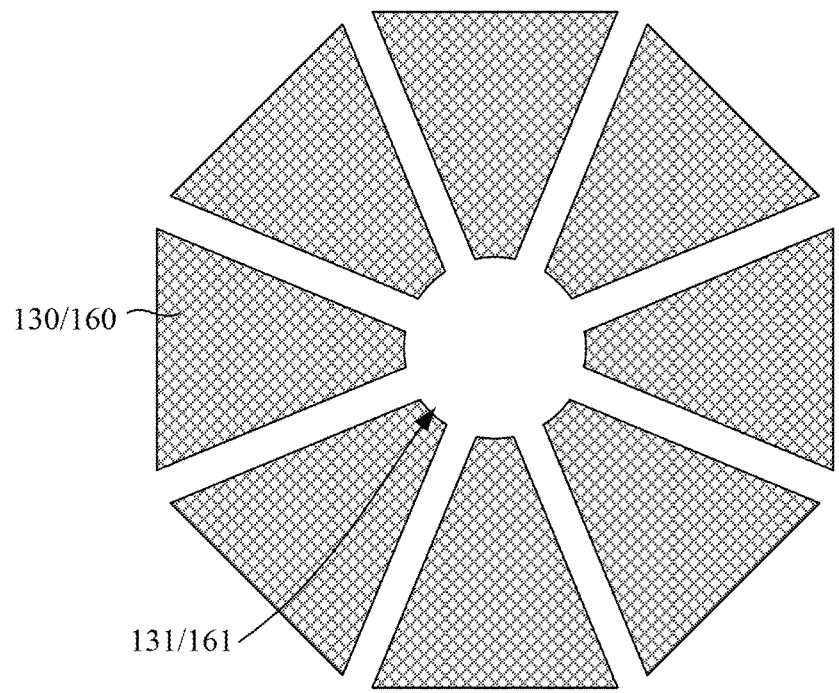
FIG. 8C is a plan view of a current controlling layer according to another embodiment of this disclosure.

FIG. 8C is a plan view of a current controlling layer 130 or 160 according to another embodiment of this disclosure. As shown in FIG. 8C, the difference between the current controlling layer 130 or 160 of FIG. 8C and the current controlling layer 130 or 160 of FIG. 8A is that the opening 131 or 161 of FIG. 8C is an unenclosed opening. That is, the opening 131 or 161 of FIG. 8C is not necessary to isolate to the edge of the micro-LED. For example, the opening 131 or 161 is connected to the edge of the micro-LED by at least one groove. Other details regarding the current controlling layer 130 or 160 of FIG. 8C are similar to the current controlling layer 130 or 160 of FIG. 8A and therefore are not repeated here to avoid duplicity.

Figure 8D:
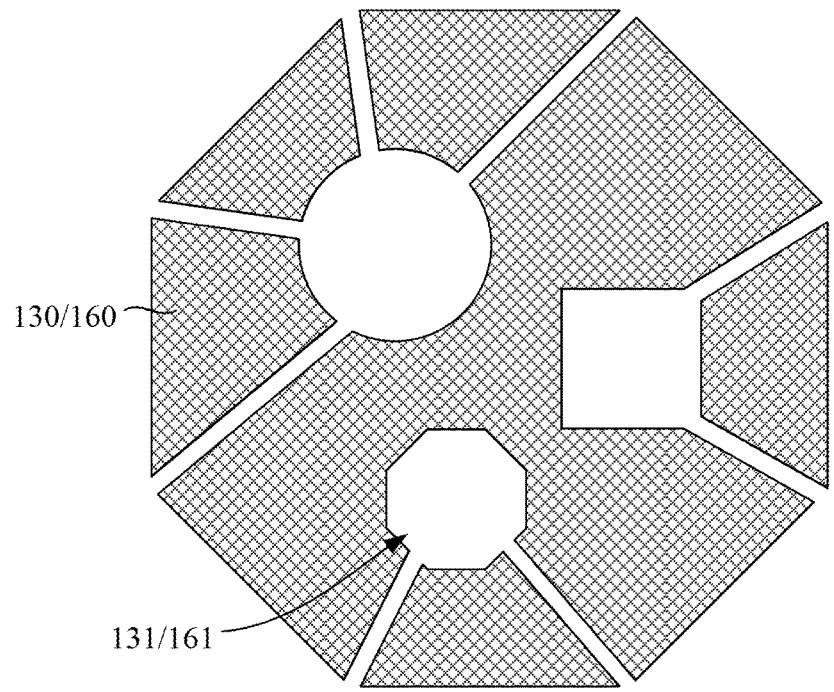
FIG. 8D is a plan view of a current controlling layer according to another embodiment of this disclosure.

FIG. 8D is a plan view of a current controlling layer 130 or 160 according to another embodiment of this disclosure. As shown in FIG. 8D, the difference between the current controlling layer 130 or 160 of FIG. 8D and the current controlling layer 130 or 160 of FIG. 8B is that each of the openings 131 or 161 of FIG. 8D is an unenclosed opening. That is, each of the openings 131 or 161 of FIG. 8D is not necessary to isolate to the edge. For example, each of the openings 131 or 161 is connected to the edge of the micro-LED by at least one groove. Other details regarding the current controlling layer 130 or 160 of FIG. 8D are similar to the current controlling layer 130 or 160 of FIG. 8B and therefore are not repeated here to avoid duplicity.

In addition, referring back to FIG. 3A, the first conductive layer 140 fully covers the openings 131 of the current controlling layer 130, but the disclosure is not limited in this regard. In some embodiments, the first conductive layer 140 partially covers the openings 131 of the current controlling layer 130. For example, the first conductive layer 140 covers the openings 131 without covering the grooves. Similarly, referring back to FIG. 5B, the second conductive layer 150 fully covers the openings 161 of the current controlling layer 160, but the disclosure is not limited in this regard. In some embodiments, the second conductive layer 150 partially covers the openings 161 of the current controlling layer 160. For example, the second conductive layer 150 covers the openings 161 without covering the grooves.

Figure 9:
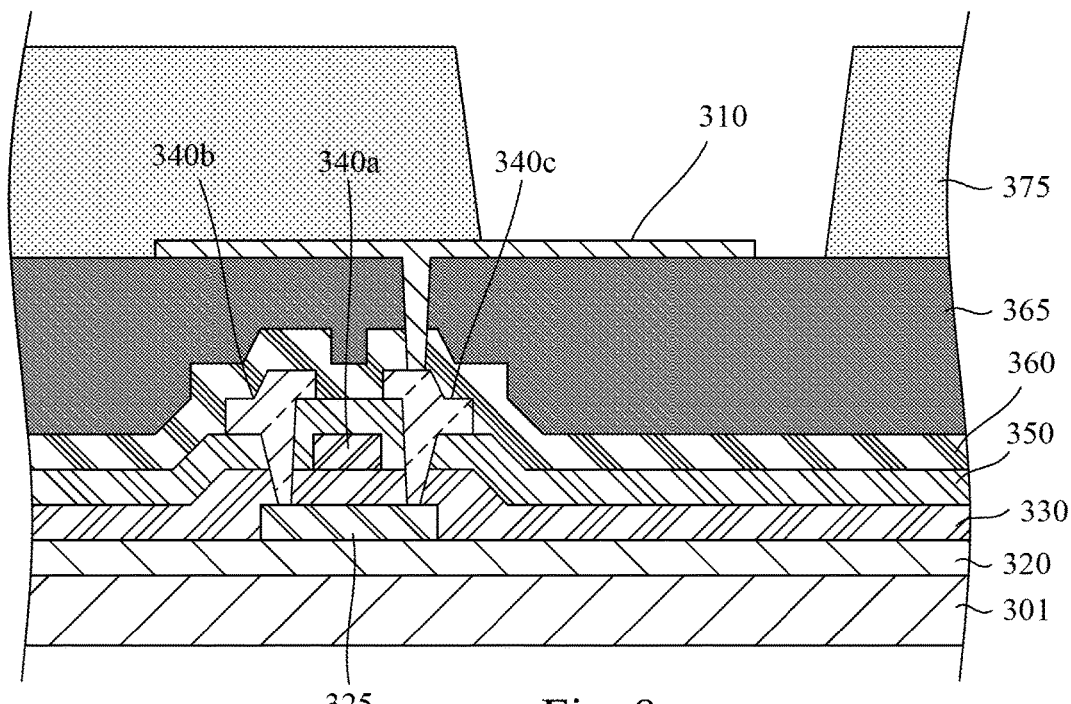
FIG. 9 is a cross-sectional views illustrating a receiving substrate according to an embodiment of the disclosure.

FIG. 9 is a cross-sectional view illustrating the receiving substrate 300 according to an embodiment of the disclosure. Referring to FIG. 9, a buffer layer 320 is formed on a substrate 301. A gate insulating layer 330 is formed on the entire surface of the substrate 301 having the semiconductor layer 325. A gate electrode 340a, an interlayer insulating layer 350, and source and drain electrodes 340b and 340c are formed on the gate insulating layer 330 to constitute a top gate structured thin film transistor (TFT). A passivation layer 360 and a planarization layer 365 are sequentially formed on or over an entire surface of the substrate 301, and a bonding electrode 310 is formed on the planarization layer 365 such that the bonding electrode 310 is electrically connected to the source or drain electrodes 340b and 340c by way of a via hole (not shown) formed through the passivation layer 360 and the planarization layer 365. A pixel defining layer 375 is then formed on or over the planarization layer 365 and/or a portion of the bonding electrode 310 to partially expose (or to expose a portion of) the bonding electrode 310.

Figure 10:
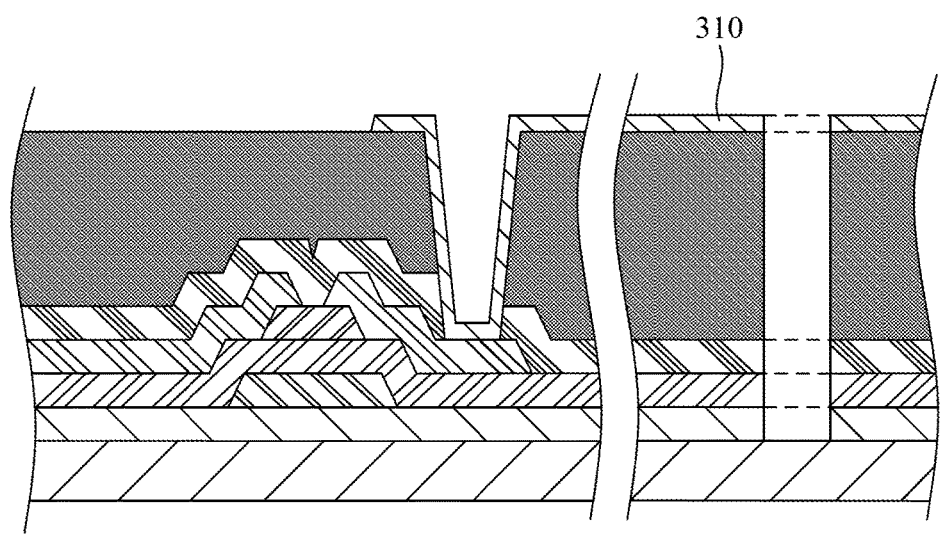
FIG. 10 is a cross-sectional view illustrating the receiving substrate according to another embodiment of the disclosure.

It is to be appreciated that the receiving substrate 300 with the top gate structured TFT illustrated in FIG. 9 is meant to be exemplary. FIG. 10 is a cross-sectional view illustrating the receiving substrate 300 according to another embodiment of the disclosure. Referring to FIG. 10, in the embodiment, the receiving substrate 300 is illustrated to include a bottom gate structured TFT, and the number of photomasks used to fabricate the receiving substrate 300 varies as needed. In some embodiments, a variety of suitable TFT of the receiving substrate 300 can be utilized in the disclosure.

Figure 11:
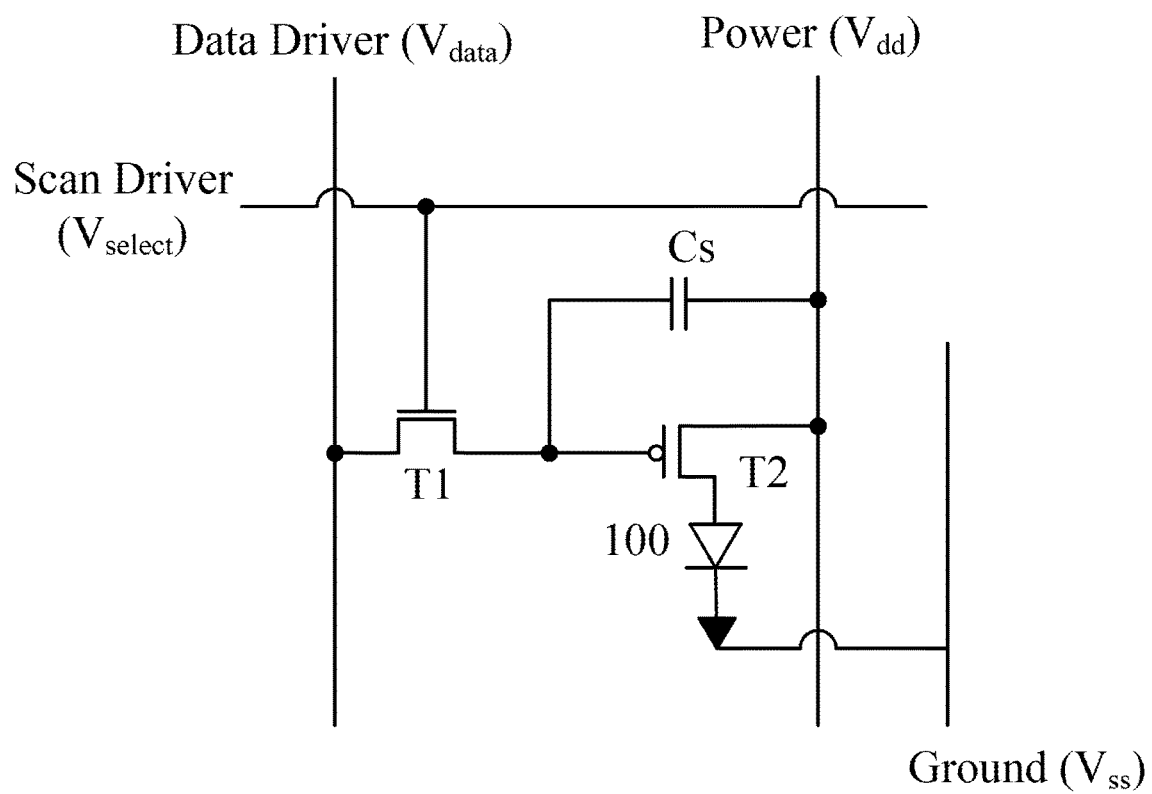
FIG. 11 is a circuit diagram of a subpixel with 2T1C circuitry in an active matrix display in accordance with an embodiment of the disclosure.

FIG. 11 is a circuit diagram of a subpixel with 2T1C circuitry according to an embodiment of the disclosure. In such an embodiment, the circuit can be used in the receiving substrate 300 illustrated in FIG. 9 or FIG. 10, which makes the receiving substrate 300 become an active matrix display substrate. The circuit includes a switching transistor T1, a driving transistor T2, a storage capacitor Cs, and a micro-LED 100. The transistors T1, T2 can be any type of transistor such as a thin film transistor. For example, the switching transistor T1 can be an n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro-LED 100 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro-LED 100 can emit light based on the current. It is to be appreciated that the 2T1C circuitry is meant to be exemplary, and that other types of circuitry or modifications of the traditional 2T1C circuitry are contemplated in accordance with embodiments of the disclosure. For example, more sophisticated circuits can be used to compensate for current distribution to the driver transistor and the micro device, or for their instabilities.

Figure 12:
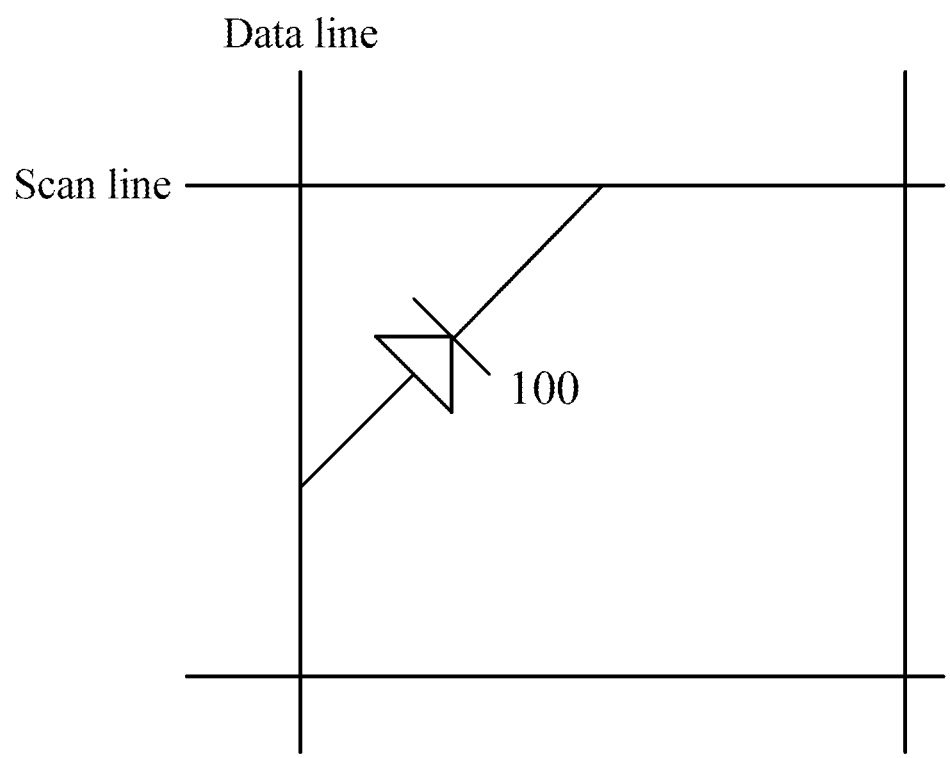
FIG. 12 is a circuit diagram of a subpixel according to an embodiment of the disclosure.

FIG. 12 is a circuit diagram of a subpixel according to an embodiment of the disclosure. In such an embodiment, the circuit used in the receiving substrate 300 makes the receiving substrate 300 become a passive matrix display substrate.

Figure 14:
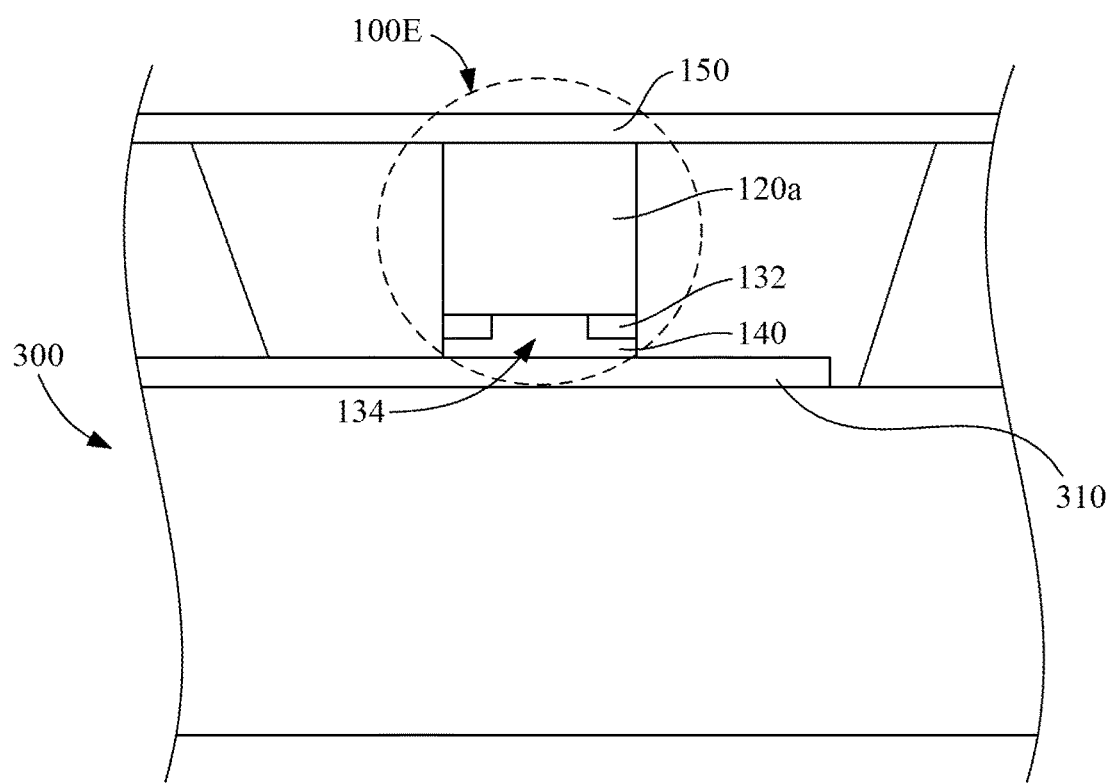
FIG. 14 is a cross-sectional view of a micro-LED disposed on a receiving substrate according to some embodiments of this disclosure.
Figure 15:
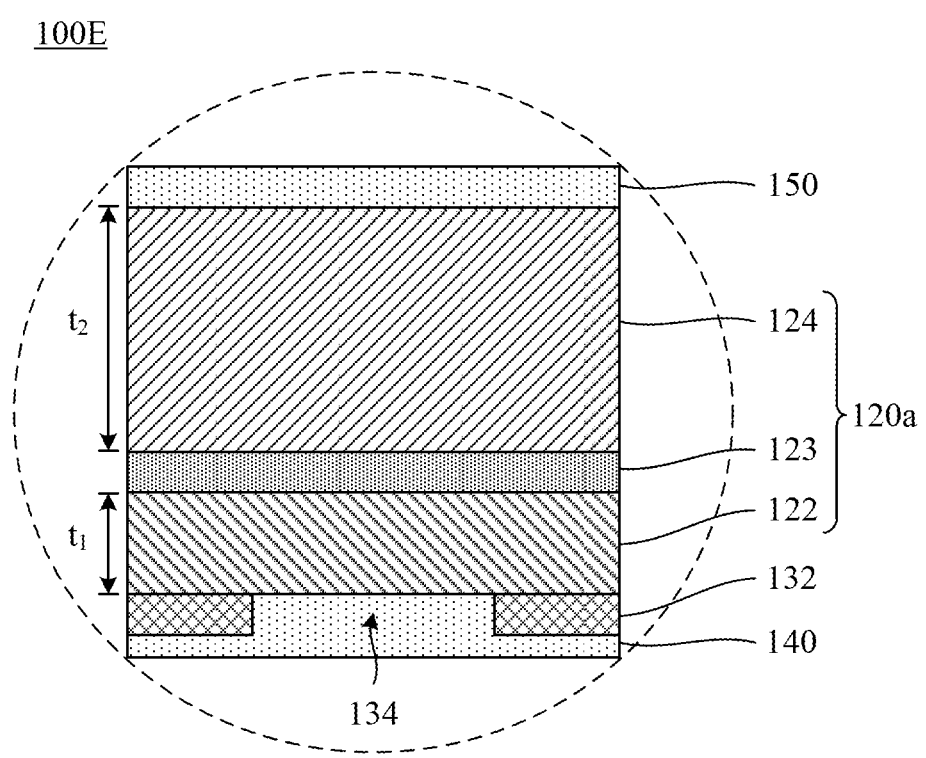
FIG. 15 is an enlarged cross-sectional view of the micro-LED in FIG. 14 according to some embodiments of this disclosure.

FIG. 14 is a cross-sectional view of a micro-LED 100E disposed on a receiving substrate 300 according to some embodiments of this disclosure. FIG. 15 is an enlarged cross-sectional view of the micro-LED 100E in FIG. 14 according to some embodiments of this disclosure. The receiving substrate 300 is illustrated as a display substrate including a bonding electrode 310 joined with the micro-LED 100E, for example, and the details of the receiving substrate 300 can be referred to FIG. 9 that is stated above. The micro-LED 100E includes a micro p-n diodes 120a, an edge isolation structure 132, a first conductive layer 140, and a second conductive layer 150. The micro-LED 100E shown in FIG. 14 can be manufactured according to operations sequentially illustrated by FIGS. 2A-2I as described above, for example.

The micro-LED 100E includes a micro p-n diode 120a, an edge isolation structure 132, a first conductive layer 140, and a second conductive layer 150. The micro p-n diode 120a includes a first type semiconductor layer 122, an active layer 123, and a second type semiconductor layer 124. The second type semiconductor layer 124 is joined with the first type semiconductor layer 122. The active layer 123 is disposed between the first type semiconductor layer 122 and the second type semiconductor layer 124. The edge isolation structure 132 is joined with the first type semiconductor layer 122. The edge isolation structure 132 has at least one passage 134 formed between the first type semiconductor layer 122 and the first conductive layer 140. The first conductive layer 140 is partially joined with the edge isolation structure 132 and is electrically coupled with the first type semiconductor layer 122 through the passage 134 of the edge isolation structure 132. The second conductive layer 150 is electrically coupled with the second type semiconductor layer 124. At least one of the first conductive layer 140 and the second conductive layer 150 is at least partially transparent.

In the embodiment, the first conductive layer 140 wholly covers the exposed part of the first type semiconductor layer 122 through the passage 134 of the edge isolation structure 132, but the disclosure is not limited in this regard.

In some embodiments, a combination of the first type semiconductor layer 122, the active layer 123, the second type semiconductor layer 124, the edge isolation structure 132, the first conductive layer 140, and the second conductive layer 150 is joined with the bonding electrode 310 on the receiving substrate 300, so as to form a micro-LED display. In the embodiment, the first type semiconductor layer 122 is proximal to the receiving substrate 300, the second type semiconductor layer 124 is distal to the receiving substrate 300, and the second conductive layer 150 is wholly transparent.

Figure 16A:
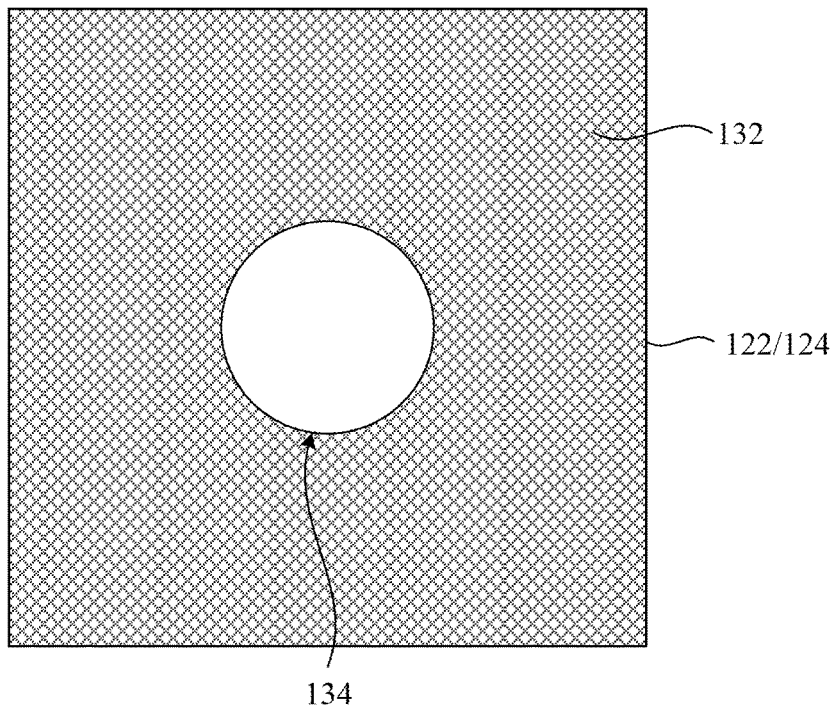
FIG. 16A is a plan view of an edge isolation structure according to an embodiment of this disclosure.

FIG. 16A is a plan view of an edge isolation structure 132 according to an embodiment of this disclosure. Referring now to FIG. 16A, in the embodiment, a vertical projection of an edge of the first type semiconductor layer 122 on the first conductive layer 140 wholly overlaps with the first conductive layer 140, and the edge isolation structure 132 is wholly located on the vertical projection of the edge of the first type semiconductor layer 122. That is, the edge isolation structure 132 of FIG. 16A wholly isolates between the edge of the first type semiconductor layer 122 and the first conductive layer 140, but the disclosure is not limited in this regard. In addition, the passage 134 of the edge isolation structure 132 of FIG. 16A is in the form of an opening, but the disclosure is not limited in this regard.

Figure 16B:
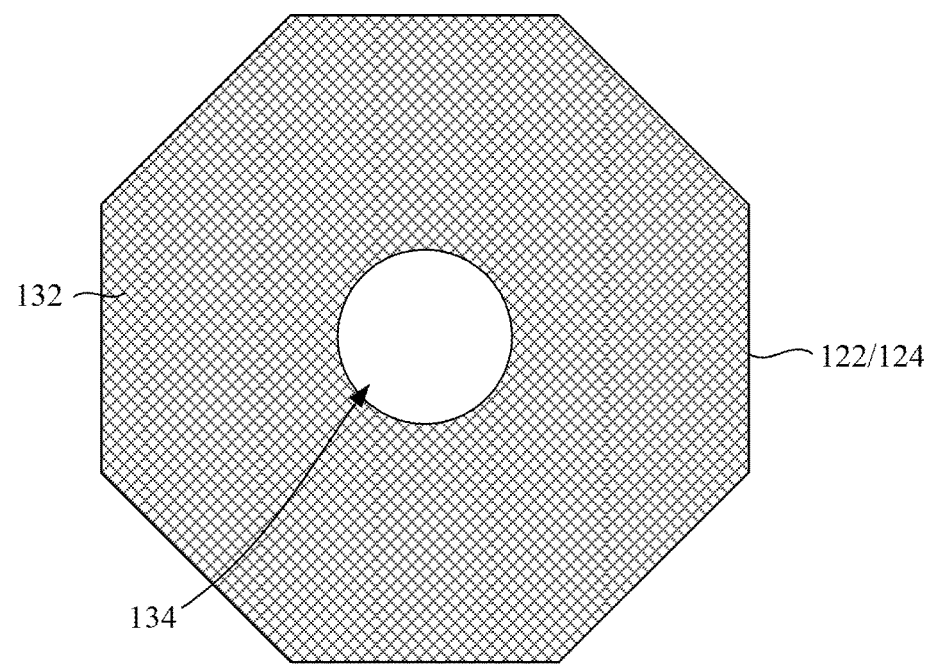
FIG. 16B is a plan view of an edge isolation structure according to another embodiment of this disclosure.

FIG. 16B is a plan view of an edge isolation structure 132 according to another embodiment of this disclosure. Referring now to FIG. 16B, in the embodiment, the edge isolation structure 132 is also wholly located on the vertical projection of the edge of the first type semiconductor layer 122. The difference between FIG. 16B and FIG. 16A is that the vertical projection of the edge of the first type semiconductor layer 122 in FIG. 16B is octagonal. Other details of FIG. 16B are similar to FIG. 16A and therefore are not repeated here to avoid duplicity.

Figure 16C:
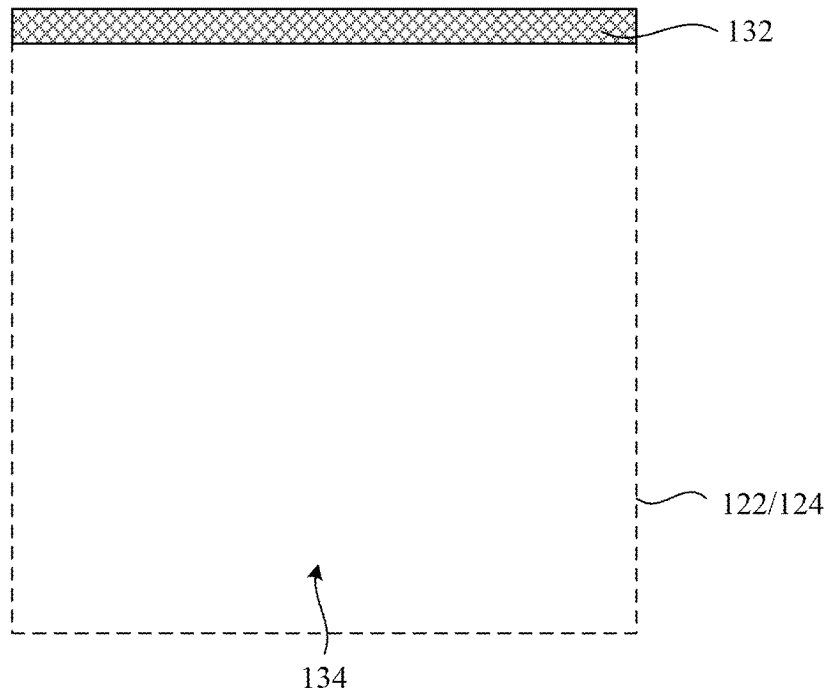
FIG. 16C is a plan view of an edge isolation structure according to another embodiment of this disclosure.

FIG. 16C is a plan view of an edge isolation structure 132 according to another embodiment of this disclosure. The difference between the edge isolation structure 132 of FIG. 16C and the edge isolation structure 132 of FIG. 16A is that the edge isolation structure 132 of FIG. 16C is partially located on the vertical projection of the edge of the first type semiconductor layer 122. That is, the edge isolation structure 132 of FIG. 16C partially isolates between the edge of the first type semiconductor layer 122 and the first conductive layer 140.

As shown in FIG. 15, the passage 134 of the edge isolation structure 132 defines the contact interface between the first conductive layer 140 and the first type semiconductor layer 122. When the micro-LED 100E is forward biased, charge carriers flow from the contact interface between the first conductive layer 140 and the first type semiconductor layer 122 to the junction of the first type semiconductor layer 122 and the second type semiconductor layer 124 (i.e., the active layer 123). Since the edge isolation structure 132 at least partially isolates between the edge of the first type semiconductor layer 122 and the first conductive layer 140, charge carriers spreading to the side surface of the micro-LED 100E are rare or none. Therefore, the non-radiative recombination occurring at the side surface of the micro-LED 100E can be reduced, thereby increasing the efficiency of the micro-LED 100E.

In some embodiments, the size of the micro-LED 100E is smaller than 250 μm×250 μm or 0.0625 mm$^2$.

Specifically, to reduce the non-radiative recombination occurring at the side surface of the micro-LED 100E, the micro-LED 100E having the edge isolation structure 132 generally comply with the inequality: L/A>L'/A', where L is the original perimeter of the edge of the first type semiconductor layer 122 viewed in a direction normal to the first type semiconductor layer 122, A is the original area of the first type semiconductor layer 122 viewed in the direction, L' is the perimeter of the part of the edge of the first type semiconductor layer 122 that is not covered by the edge isolation structure 132 viewed in the direction, and A' is the area of the part of the first type semiconductor layer 122 that is not covered by the edge isolation structure 132 viewed in the direction.

For example, the size of the first type semiconductor layer 122 of FIG. 4C is 100 μm×100 μm, and the size of the edge isolation structure 132 is 100 μm×3 μm. Therefore, the value of L/A=(100×4)/(100×100)=0.04, and the value of L'/A'= (100+97×2)/(100×97)=0.03 which is smaller than L/A. As a result, the edge isolation structure 132 in the micro-LED 100E of FIG. 16C complies with the above-mentioned inequality and thus can effectively reduce the non-radiative recombination occurring at the side surface of the micro-LED 100E.

Figure 16D:
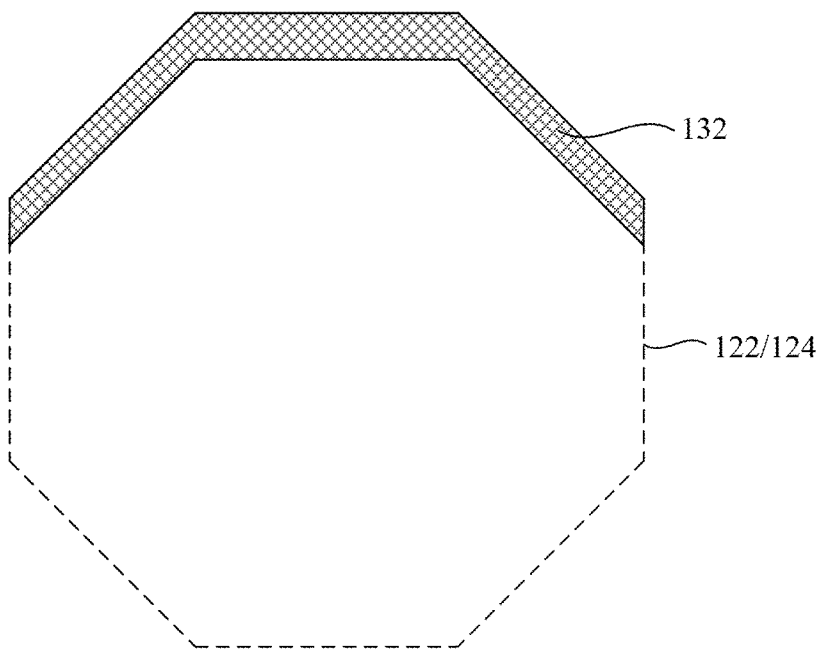
FIG. 16D is a plan view of an edge isolation structure according to another embodiment of this disclosure.

FIG. 16D is a plan view of an edge isolation structure 132 according to another embodiment of this disclosure. Referring now to FIG. 16D, in the embodiment, the edge isolation structure 132 is also partially located on the vertical projection of the edge of the first type semiconductor layer 122. The difference between FIG. 16D and FIG. 16C is that the vertical projection of the edge of the first type semiconductor layer 122 in FIG. 16D is octagonal. Other details of FIG. 16A are similar to FIG. 16C and therefore are not repeated here to avoid duplicity.

Figure 16E:
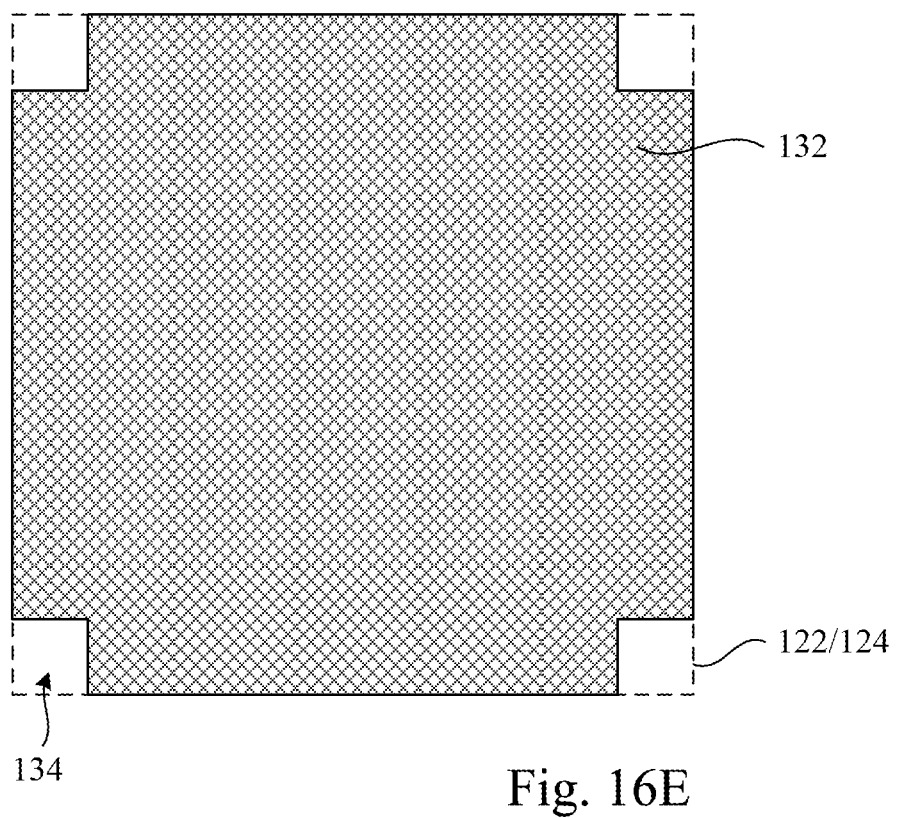
FIG. 16E is a plan view of an edge isolation structure according to another embodiment of this disclosure.

FIG. 16E is a plan view of an edge isolation structure 132 according to another embodiment of this disclosure. Similarly, the difference between the edge isolation structure 132 of FIG. 16E and the edge isolation structure 132 of FIG. 16A is that the edge isolation structure 132 of FIG. 16E is partially located on the vertical projection of the edge of the first type semiconductor layer 122. However, for example, the size of the first type semiconductor layer 122 of FIG. 16E is 100 μm×100 μm, and the edge isolation structure 132 covers the first type semiconductor layer 122 except four corners of which the size of each is 10 μm×10 μm. Therefore, the value of L'/A'=(10×2×4)/(10×10×4)=0.2 which is larger than L/A. Under the circumstances, the edge isolation structure 132 in the micro-LED 100E of FIG. 16C violates the above-mentioned inequality and thus cannot reduce the non-radiative recombination occurring at the side surface of the micro-LED 100E.

Moreover, since the first type semiconductor layer 122 has the short current spreading length, the first type semiconductor layer 122 for example has high resistivity and is thin in thickness, as illustrated in FIG. 15. Furthermore, since the edge isolation structure 132 accompanied with the first type semiconductor layer 122 having the short current spreading length limits carriers spreading to the side surface of the micro-LED 100E to be rare or none, the leakage currents of the micro-LED 100E can be reduced regardless of the lattice defects in the side surface of the micro-LED 100E, which is helpful for continue miniaturization of the micro-LED 100E.

In some embodiments, the edge isolation structure 132 is transparent. In some embodiments, the edge isolation structure 132 is monochrome transparent. In some embodiments, the edge isolation structure 132 is reflective. In some embodiments, the edge isolation structure 132 is monochrome reflective.

In some embodiments, the edge isolation structure 132 is a dielectric layer which is made of a dielectric material, such as silicon nitride or silicon dioxide. The thickness of the edge isolation structure 132 is in a range from 1 nm to 5 μm. The edge isolation structure 132 is formed by, for example, physical vapor deposition (PVD), CVD. However, the edge isolation structure 132 of the disclosure is not limited to be a dielectric layer.

Figure 17A:
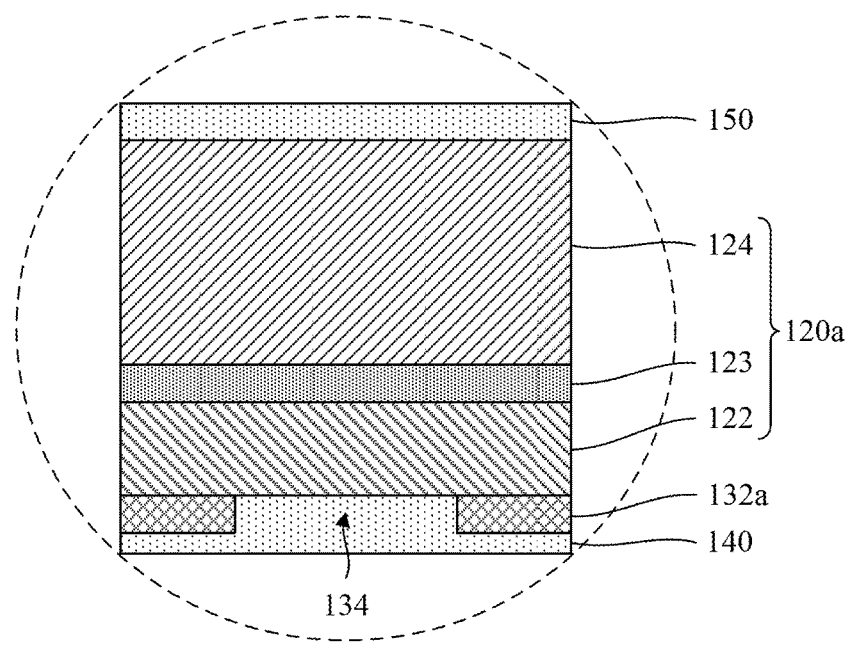
FIG. 17A is an enlarged cross-sectional view of the micro-LED according to some embodiments of this disclosure.

FIG. 17A is an enlarged cross-sectional view of the micro-LED 100F according to some embodiments of this disclosure. Referring now to FIG. 5A, the first type semiconductor layer 122 and the second type semiconductor layer 124 form a first p-n junction, the edge isolation structure 132a and the first type semiconductor layer 122 form a second p-n junction, and the first conductive layer 140 and the second conductive layer 150 are configured to forward bias the first p-n junction while reverse bias the second p-n junction. In an embodiment, the first type semiconductor layer 122 is a p type semiconductor layer, and the second type semiconductor layer 124 and the edge isolation structure 132a are n type semiconductor layers. In another embodiment, the first type semiconductor layer 122 is an n type semiconductor layer, and the second type semiconductor layer 124 and the edge isolation structure 132a are p type semiconductor layers. As a result, no current will flow through the part of the active layer 123 corresponding to the edge isolation structure 132a, so that the edge isolation structure 132a can isolate current into the edge of the micro-LED 100F and thus achieves the purpose of reducing surface recombination.

Other details regarding the micro-LED 100F of FIG. 17A are similar to the micro-LED 100E of FIG. 15 and therefore are not repeated here to avoid duplicity.

Figure 17B:
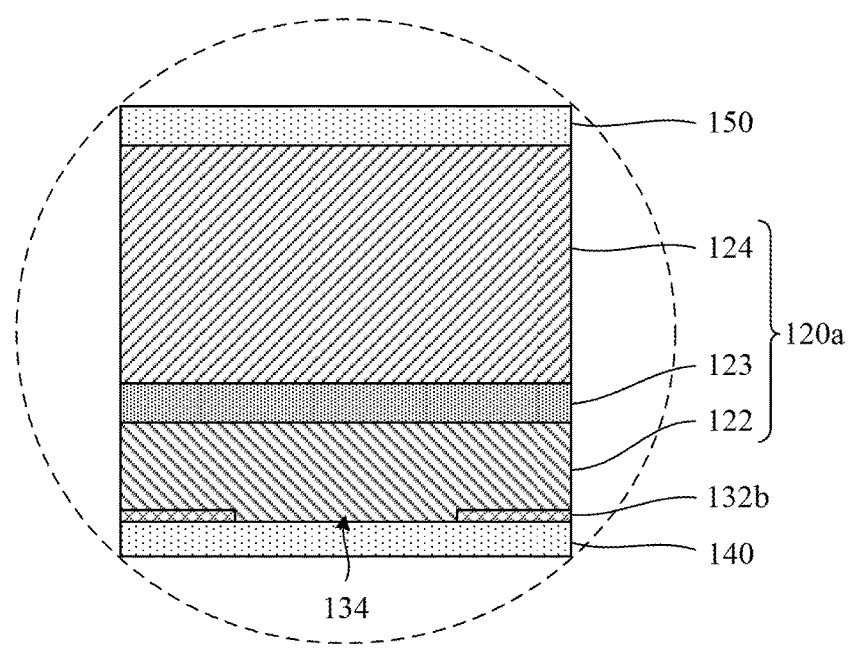
FIG. 17B is an enlarged cross-sectional view of the micro-LED according to some embodiments of this disclosure.

FIG. 17B is an enlarged cross-sectional view of the micro-LED 100G according to still a third embodiment of this disclosure. Referring now to FIG. 17B, the first type semiconductor layer 122 and the second type semiconductor layer 124 form a p-n junction, the edge isolation structure 132b and the first type semiconductor layer 122 form a Schottky barrier. In the embodiments, the first type semiconductor layer 122 may consisted of heavily Mg-doped p-GaN (e.g., 30 nm in thickness and [Mg]=~2.2×10$^{20}$ cm–3) or moderately Mg-doped p-GaN (e.g., 120 nm in thickness and [Mg]=~2.1×10$^{19}$ cm–3), for example. To fabricate the edge isolation structure 132b, an Ar$^+$ plasma treatment on the first type semiconductor layer 122 was performed using a predetermined working pressure, rf power, and a predetermined process time. The Schottky barrier were first fabricated on the treated surfaces of the first type semiconductor layer 122 using an Ni/Ag/Pt ohmic contact as the first conductive layer 140. It is evident that the bias current of the Ni/Ag/Pt contact formed on the plasma-treated surfaces of the first type semiconductor layer 122 are nearly zero in the measured voltage range from −1 to 5V, while the plasma-untreated surfaces of the first type semiconductor layer 122 shows ohmic behavior. That is, the Ar$^+$ plasma treatment to the first type semiconductor layer 122 led to the formation of a large barrier height. As a result, no current will flow through the part of the active layer 123 corresponding to the edge isolation structure 132b, so that the edge isolation structure 132b can isolate current into the edge of the micro-LED 100G and thus achieves the purpose of reducing surface recombination.

Other details regarding the micro-LED 100G of FIG. 17B are similar to the micro-LED 100E of FIG. 15 and therefore are not repeated here to avoid duplicity.

In another embodiment, the first type semiconductor layer 122 has the resistivity $\rho_1$ mentioned above, the edge isolation structure layer 130 is a high resistivity layer which has a resistivity $\rho_h$, and $\rho_h > \rho_1$. For example, $\rho_h$ may be over 10 times greater than $\rho_1$, but the disclosure is not limited in this regard. In some embodiments, the edge isolation structure layer 130 can be a semiconductor layer doped with a lower concentration with respect to the first type semiconductor layer 122, a semi-metal layer, a ceramic layer, or a semi-insulator layer. As a result, the edge isolation structure layer 130 can lead most of the current to flow through the passage 134 of the edge isolation structure layer 130, so as to limit the emitting area of the active layer 123 at a part corresponding to the passage 134 as possible. For example, under the circumstances that the resistivity $\rho_h$ of the edge isolation structure layer 130 is 10 times greater than the resistivity $\rho_1$ of the first type semiconductor layer 122, at least 50% current will flow through the passage 134 having relatively small area, so that the edge isolation structure layer 130 can achieve the purpose of reducing surface recombination.

In some embodiments, as shown in FIG. 17B, the first type semiconductor layer 122 is a p type semiconductor layer, the second type semiconductor layer 124 is an n type semiconductor layer, and the edge isolation structure 132 is a hole blocking layer. The LUMO (Lowest Unoccupied Molecular Orbital) energy level of the edge isolation structure 132 is lower than that of the first type semiconductor layer 122 for at least 0.2 eV, so as to block holes transporting from the first type semiconductor layer 122 to the active layer 123. As a result, the holes in the first type semiconductor layer 122 can only transport to the active layer 123 via the passage 134 of the edge isolation structure 132. For example, the material of the edge isolation structure 132 can be $Al_xGa_yN_{(1-x-y)}$ with superlattice structure.

In some embodiments, as shown in FIG. 17B, the first type semiconductor layer 122 is an n type semiconductor layer, the second type semiconductor layer 124 is a p type semiconductor layer, and the edge isolation structure 132 is an electron blocking layer. The HOMO (Highest Occupied Molecular Orbital/Conduction band) energy level of the edge isolation structure 132 is higher than that of the first type semiconductor layer 122 for at least 0.2 eV, so as to block electrons transporting from the first type semiconductor layer 122 to the active layer 123. As a result, the electrons in the first type semiconductor layer 122 can only transport to the active layer 123 via the passage 134 of the edge isolation structure 132. For example, the material of the edge isolation structure 132 can be $Al_xGa_yN_{(1-x-y)}$ with superlattice structure.

According to the micro-LEDs 100E-100G mentioned above, in some embodiments, the edge isolation structure 132 is located at a side of the micro p-n diodes 120a proximal to the bonding electrode 310 (see FIG. 14) of the receiving substrate 300 (see FIG. 14). That is, the passage 134 of the edge isolation structure 132 faces toward the receiving substrate 300 (see FIG. 14). However, the disclosure is not limited in this regard.

As previously described, the micro-LED including the current controlling layer with the opening can define a contact area between a conductive layer and a semiconductor layer. In the following embodiments, this contact area can be defined by at least one current-injecting zone which is used for forming at least one current injection path from the conductive layer to the semiconductor layer. In the following embodiments, the current-injecting zone is applied to LED structure, and the descriptions below are provided with respect to variations of the LED structure including the current-injecting zone.

In one or more embodiments of the present disclosure, by forming a current controlling structure having at least one current-injecting zone in the LED structure, the current-injecting zone can confine the area where the current goes into the LED, such that the current density within an emitting area of the LED can be increased. Moreover, since the current-injecting zone can confine the area where the current goes into the LED, the current density within an emitting area of the LED increases and can be more uniform, thereby increasing the efficiency of the LED. Accordingly, as the current flowing in the semiconductor layer is present within the boundary of the current-injecting zone, the current may tend to travel along a vertical direction and is controlled to have the less lateral diffusion current. Furthermore, current controlling structure includes at least one inactivated portion between a semiconductor layer and an electrode to at least partially isolates therebetween, and therefore charge carriers spreading to a side surface of the LED are rare or none.

Figure 18A:
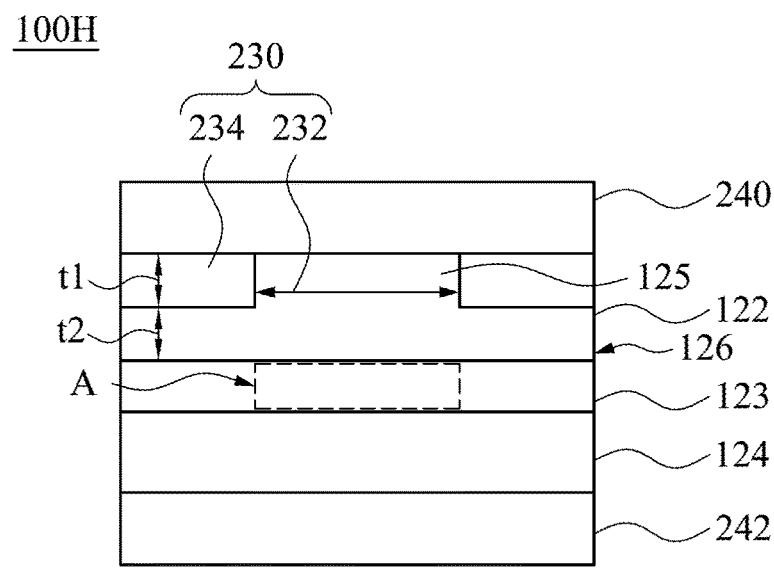
FIG. 18A is a cross-sectional view of an LED according to some embodiments of the present disclosure.

FIG. 18A is a cross-sectional view of an LED 100H according to some embodiments of the present disclosure. The difference between the LED 100H illustrated in FIG. 18A and one of the micro-LEDs described above is that a current-injecting zone used for defining a contact area between a conductive layer and a semiconductor layer is applied to LED structure. Thus, the LED 100H illustrated in FIG. 18A includes a current controlling structure 230 to play the role of the current controlling layer mentioned above, in which the current controlling structure 230 has at least one current-injecting zone 232 to define a contact area between a conductive layer and a semiconductor layer.

Furthermore, the current controlling layer mentioned above provides the effect that defining the contact area by the opening therein, and thus the current can flow into the semiconductor layer through the current controlling layer, which may be taken as a two-dimensional structure. In the present embodiment, since the contact area is defined by the current controlling structure 230 with the current-injecting zone 232, the current flowing into the semiconductor layer is controlled and confined by the current controlling structure 230, which may be taken as a three-dimensional structure. With this three-dimensional structure, the current traveling within the current-injecting zone 232 can be controlled to reduce the lateral diffusion. Moreover, it can further improve the reduction of current lateral diffusion from the injection area. In this regard, the details of the three-dimensional current-injecting zone are provided by the following descriptions.

As shown in FIG. 18A, the LED 100H includes a first type semiconductor layer 122, a second type semiconductor layer 124, an active layer 123, the current controlling structure 230, a first electrode 240, and a second electrode 242. The second type semiconductor layer 124 is joined with the first type semiconductor layer 122. The active layer 123 is disposed between the first type semiconductor layer 122 and the second type semiconductor layer 124. The current controlling structure 230 is joined with the first type semiconductor layer 122, in which the current controlling structure 230 is present at a side of the first type semiconductor layer 122 facing away from the active layer 123. The current controlling structure 230 has the current-injecting zone 232 therein. The first electrode 240 is electrically coupled with the first type semiconductor layer 122 through the current-injecting zone 232 of the current controlling structure 230. The second electrode 242 is electrically coupled with the second type semiconductor layer 124. In addition, the first electrode 240 and the second electrode 242 serve as the conductive layers mentioned above.

In some embodiments, the current controlling structure 230 has at least one inactivation portion 234, in which the first type semiconductor layer 122 is at least surrounded by the inactivated portion 234. The inactivation portion 234 has a higher resistivity than that of the first type semiconductor layer 122, and the current-injecting zone 232 can be defined by the higher resistivitiy part of the inactivation portion 234 of the current controlling structure 230.

In an ideal case, the boundary of the current-injecting zone 232 can be defined by a gap between the resistivities of the first type semiconductor layer 122 and the inactivation portion 234 of the current controlling structure 230. With this difference between the resistivities of the first type semiconductor layer 122 and the inactivation portion 234 of the current controlling structure 230, the current controlling structure 230 can provide an entrance for at least one current injection path in the first type semiconductor layer 122.

Figure 18B:
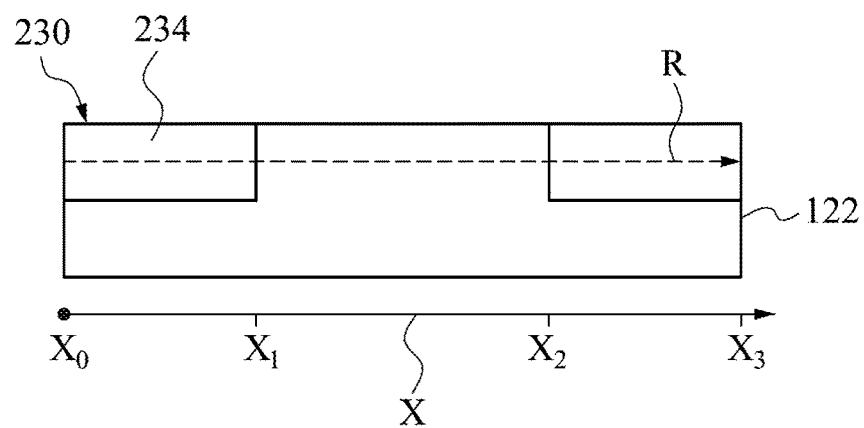
FIG. 18B is a cross-sectional view of the first type semiconductor layer and the current controlling structure of the LED illustrated in FIG. 18A with an x-axis.
Figure 18C:
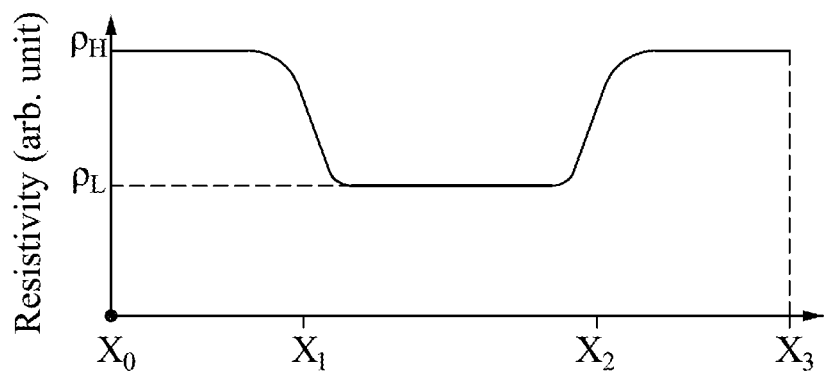
FIGS. 18C and 18D are graphs plotting relatively resistivity versus x-coordinate in the first type semiconductor layer and the current controlling structure illustrated in FIG. 18B according to various embodiments of the present disclosure.
Figure 18D:
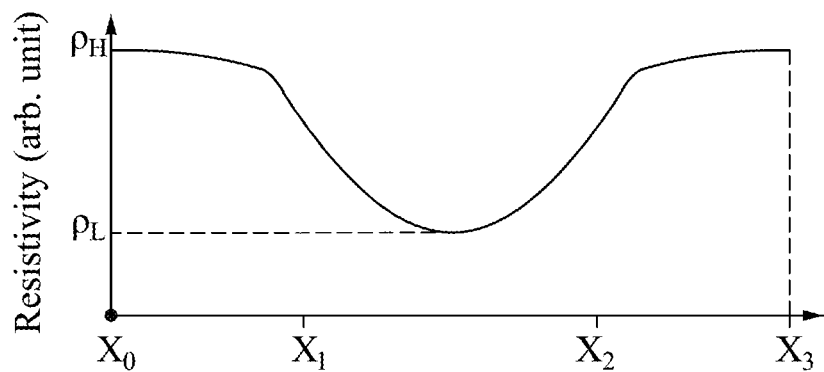

In practice, the boundary of the current-injecting zone 232 may be the region that the lateral variation of the bulk resistivity changes significantly. FIG. 18B is a cross-sectional view of the first type semiconductor layer 122 and the current controlling structure 230 with an x-axis X illustrated in the LED in FIG. 18A. An x-axis X is illustrated in FIG. 18B, in which the x-axis X has coordinates $X_0$, $X_1$, $X_2$, and $X_3$. FIGS. 18C and 18D are graphs plotting relatively resistivity versus x-coordinate in the first type semiconductor layer 122 and the current controlling structure 230 illustrated in FIG. 18B according to various embodiments of the present disclosure, in which the horizontal axis represent x-coordinate of the x-axis X illustrated in FIG. 18B, the vertical axis represents the resistivity, and both of the x-coordinate of the x-axis and the resistivity are in arbitrary unit herein. In addition, The curves R illustrated in FIGS. 18C and 18D represent the resistivities of the first type semiconductor layer 122 and the current controlling structure 230 along the dot line R illustrated in FIG. 18B.

As shown in FIGS. 18B and 18C, the curve shows that the resistivities of the first type semiconductor layer 122 and the current controlling structure 230 can be decreased in the first half and be increased at the latter half along the x-axis X. In other words, the resistivity within the interval from $X_0$ to $X_1$ is decreased, the resistivity within the interval from $X_1$ to $X_2$ is decreased in the first half and is increased at the latter half, and the resistivity within the interval from $X_2$ to $X_3$ is increased. Furthermore, in FIG. 18C, the maximum resistivity is marked as pH, and the minimum resistivity is marked as $\rho_L$. In this case, since the current traveling in the first type semiconductor layer 122 may be confined to travel within the zone corresponding to the interval between $X_1$ and $X_2$ due to the less resistivity, the current-injecting zone 232 defined by the inactivation portion 234 may be constructed within this zone. In some embodiments, the current traveling in the first type semiconductor layer 122 may tend to travel mainly within the zone corresponding to the interval that the resistivity is less than $(\rho_H+\rho_L)/2$, and hence the current-injecting zone 232 defined by the inactivation portion 234 is constructed within this zone.

As shown in FIGS. 18B and 18D, the difference between the curves respectively illustrated in FIGS. 18C and 18D is that the curve illustrated in FIG. 18C is steeper than the curve illustrated in FIG. 18D in the interval between $X_1$ and $X_2$. However, since the current traveling in the first type semiconductor layer 122 may be confined to travel within the zone corresponding to the interval between $X_1$ and $X_2$ due to the less resistivity as well, the current-injecting zone 232 defined by the inactivation portion 234 can be constructed within this zone Explained in a different way, according to the descriptions above, although the curves R representing the resistivity may be different, under a condition in which the resistivities of the first type semiconductor layer 122 and the current controlling structure 230 are decreased in the first half and are increased at the latter half along the x-axis X, the current traveling in the first type semiconductor layer 122 is confined to travel in a zone which has the less resistivity. Thus, once the the resistivities of the first type semiconductor layer 122 and the current controlling structure 230 are decreased in the first half and are increased at the latter half along the x-axis X, the current-injecting zone 232 can be defined by the inactivated portion 234 due to the higher resistivity of the inactivated portion 234. In addition, the resistivity of the first type semiconductor layer 122 has a minimum value at a position within the current-injecting zone 232, and the resistivity of the first type semiconductor layer 122 at an edge portion of the current-injecting zone 232 is gradually decreased from the outside of the current-injecting zone 232 to the inside of the current-injecting zone 232.

Referring back to FIG. 18A. According to the descriptions above, the current-injecting zone 232 can be constructed by the difference between the resistivities. On the other hand, since the current controlling structure 230 is the three-dimensional structure, the current-injecting zone 232 is the three-dimensional structure as well. With the three-dimensional current-injecting zone 232, after the current flowing into the first type semiconductor layer 122 from the first electrode 240 through the current-injecting zone 232, at least one part of a path of current traveling in the first type semiconductor layer 122 is present within the boundary of the current-injecting zone 232. Moreover, since the resistivity outside the boundary of the current-injecting zone 232 is greater than the resistivity inside the boundary of the current-injecting zone 232, the current traveling within the boundary of the current-injecting zone 232 may be laterally confined in the current-injecting zone 232.

Thus, with this configuration, as the current traveling in the first type semiconductor layer 122 is present within the boundary of the current-injecting zone 232, the current may tend to travel along a vertical direction from the first type semiconductor layer 122 to the second type semiconductor layer 124, such that the current spreading with a horizontal vector is reduced (lateral spreading current). Therefore, in the first type semiconductor layer 122, the direction of the current traveling within the boundary of the current-injecting zone 232 is laterally confined, and hence it could reduce the generation of lateral spreading current. Accordingly, the current injection area of the active layer can be well defined.

Explained in a different way, the current controlling structure 230 can provide the effects that defining the entrance of the current entering the first type semiconductor layer 122 and controlling the current traveling within the boundary of the current-injecting zone 232 to reduce lateral current spreading. Therefore, the current density within the boundary of the current-injecting zone 232 can be increased, and the current spreading with the horizontal vector is reduced such that the lateral current is prevented from being generated. Moreover, under the condition in which the lateral current is prevented from being generated, a current spreading length of the first type semiconductor layer 122 is reduced as well.

Accordingly, the current-injecting zone 232 can provide the similar effects as the effects provided by the opening of the current controlling layer mentioned above, and hence the opening of the current controlling layer mentioned above can be replaced by the current-injecting zone 232. For example, since the current controlling structure 230 can provide the effects that defining an entrance of the current flowing into the first type semiconductor layer 122, the current-injecting zone 232 can define a contact area between the first electrode 240 and the first type semiconductor layer 122. In this regard, similar to the configuration illustrated in FIGS. 1 and 3A, the first electrode 240 may have a light-permeable part, and a vertical projection of the current-injecting zone 232 of the current controlling structure 230 on the first electrode 240 at least partially overlaps with the light-permeable part of the first electrode 240. In addition, the light-permeable part of the first electrode 240 may be transparent or semi-transparent. Alternatively, in some embodiments, the first electrode 240 having the light-permeable part is wholly transparent.

With this configuration, when the LED 100H is forward biased, since the current controlling structure 230 defines the contact area between the first electrode 240 and the first type semiconductor layer 122 and controls the direction of the current traveling within the boundary of the current-injecting zone 232, charge carriers may flow from the contact area between the first electrode 240 and the first type semiconductor layer 122 to the active layer 123. In the active layer 123, the electrons and holes recombine across the semiconductor gap, so the active layer 123 can emit light. More specifically, since the current controlling structure 230 can confine the area where the current goes into the LED 100H, a light emitting area A in the active layer 123 can be formed under the current-injecting zone 232 of the current controlling structure 230. Therefore, since the current controlling structure 230 confines an area where the current goes into the LED 100H and controls the direction of the current traveling within the boundary of the current-injecting zone 232, the current density within the emitting area A of the active layer 123 of the LED 100H increases, thereby gaining the operating stability and efficiency of the LED 100H.

As described previously, in some embodiments, the current controlling structure 230 includes the inactivated portion 234. The inactivated portion 234 is present in the first type semiconductor layer 122, and the inactivated portion 234 defines the current-injecting zone 232. In some embodiments, the current-injecting zone 232 is a conductive channel extending from a surface of the first type semiconductor layer 122 facing the first electrode 240 toward the a surface of the first type semiconductor layer 122 facing away from the first electrode toward 240. The activated portion 125 is at least present in the current-injecting zone 232, and the activated portion 125 has a resistivity less than that of the inactivated portion 234.

In some embodiments, a part of the activated portion 125 is present in the central first type semiconductor layer 122, and another part of the activated portion 125 is present between the active layer 123 and the inactivated portion 234 of the current controlling structure 230. Thus, the part of the activated portion 125 extends from the first electrode 240 to the active layer 123, and another part of the activated portion 125 extends from the inactivated portion 234 to the active layer 123. With this configuration, the activated portion 125 of the first type semiconductor layer 122 illustrated in FIG. 18A is similar to a reversed-T shape, and a surface of the inactivated portion 234 and a surface of the activated portion 125 facing the first electrode 240 are coplanar. In addition, an interface between the reversed T-shaped (by the cross-sectional view) activated portion 125 of the first type semiconductor layer 122 and the inactivated portion 234 of the current controlling structure 230 can be taken as a boundary of the current-injecting zone 232. Moreover, an upper surface of the reversed T-shaped activated portion 125 is a region that can be taken as the entrance for at least one current injection path into the first type semiconductor layer 122.

Furthermore, as the descriptions mentioned in FIGS. 18C and 18D, since the current-injecting zone 232 can be constructed by the difference between the resistivites, the current-injecting zone 232 may be defined in a portion of the first type semiconductor layer 122 that has the less resistivity than that of the inactivated portion 234 and is surrounded by the inactivated portion 234. Explained in a different way, the current-injecting zone 232 is at least surrounded by the inactivated portion 234. Thus, in some embodiments, once the inactivated portion 234 is formed, a zone having the less resistivity than that of the inactivated portion 234 and surrounded by the inactivated portion 234 may be defined as the current-injecting zone 232.

With this configuration, when the LED 100H is forward biased, since the activated portion 125 has the resistivity less than that of the inactivated portion 234, as the current flows from the first electrode 240 into the first type semiconductor layer 122, the current traveling in the first type semiconductor layer 122 is confined to be present within the activated portion 125 and the lateral current spreading is reduced. Therefore, as the current flows in the activated portion 125 surrounded by the inactivated portion 234, the current is controlled to tend to travel along the vertical direction from the first type semiconductor layer 122 to the second type semiconductor layer 124, such that the lateral current which may travel through the inactivated portion 234 is reduced.

In some embodiments, the activated portion 125 of the first type semiconductor layer 122 has the resistivity less than that of the inactivated portion 234 of the current controlling structure 230 due to the difference between nitrogen vacancies therein, in which the activated portion 125 has a nitrogen vacancy density less than that of the inactivated portion 234. In this regard, since a conductivity of the inactivated portion 234 of the current controlling structure 230 is affected by the nitrogen vacancy therein, the inactivated portion 234 of the current controlling structure 230 may have a conductivity less than that of the activated portion 125 of the first type semiconductor layer 122. Explained in a different way, the difference between the resistivities of the activated portion 125 and the inactivated portion 234 may be caused by the difference between the nitrogen vacancy densities thereof.

In some embodiments, the activated portion 125 of the first type semiconductor layer 122 has the resistivity less than that of the inactivated portion 234 of the current controlling structure 230 due to the difference between carrier concentrations thereof, in which the activated portion 125 has a carrier concentration more than that of the inactivated portion 234. In this regard, since the activated portion 125 has the carrier concentration more than that of the inactivated portion 234, the activated portion 125 of the first type semiconductor layer 122 may have a conductivity higher than that of the inactivated portion 234 of the current controlling structure 230. Explained in a different way, the difference between the resistivities of the activated portion 125 and the inactivated portion 234 is caused by the difference between the carrier concentrations thereof. Furthermore, in some embodiments in which the difference between the resistivities of the activated portion 125 and the inactivated portion 234 is caused by the different carrier concentrations, the carrier concentration is a hole concentration. Alternatively, the carrier concentration is an electron concentration.

In some embodiments, the current controlling structure 230 is made of a semiconductor material. In some embodiments, the first type semiconductor layer 122 and the current controlling structure 230 are made of the same semiconductor material with the different resistivities. In some embodiments, the first type semiconductor layer 122 and the current controlling structure 230 are p type semiconductor layers with different resistivities, and the second type semiconductor layer 124 is an n type semiconductor layer.

In some embodiments, the first type semiconductor layer 122 is made of, for example, p-doped AlGaN, p-doped InGaN or p-doped GaN. The thickness of the first type semiconductor layer 122 is in a range from 50 nm to 20 μm. The first type semiconductor layer 122 is formed by, for example, epitaxy.

In some embodiments, the second type semiconductor layer 124 is made of, for example, n-doped GaN:Si. The thickness of the second type semiconductor layer 124 is in a range from 0.1 μm to 50 μm. The second type semiconductor layer 124 is formed by, for example, epitaxy.

In some embodiments, the active layer 123 is made of, for example, heterostructure or quantum well structure. The thickness of the active layer 123 is in a range from 50 nm to 5 μm. The active layer 123 is formed by, for example, epitaxy. In some embodiments, the active layer 123 can be omitted. In some embodiments in which the active layer 123 is omitted, the first type semiconductor layer 122 is directly disposed on the second type semiconductor layer 124.

In some embodiments, the part of the activated portion 125 extending from the first electrode 240 to the active layer 123 has a resistivity $\rho_1$, another part of the activated portion 125 extending from the inactivated portion 234 to the active layer 123 has a resistivity $\rho_2$, the inactivated portion 234 has a resistivity $\rho_3$, and $\rho_3 > \rho_2 \geq \rho_1$. In some embodiments, the part of the activated portion 125 extending from the first electrode 240 to the active layer 123 has the resistivity $\rho_1$ less than 10 Ω-cm, another part of the activated portion 125 extending from the inactivated portion 234 to the active layer 123 has a resistivity $\rho_2$ less than 10 Ω-cm, and the inactivated portion 234 has the resistivity $\rho_3$ greater than $10^2$ Ω-cm.

In some embodiments, the inactivated portion 234 has a thickness t1, and another part of the activated portion 125 present between the inactivated portion 234 and the active layer 123 has a thickness t2. In some embodiments, a thickness of the first type semiconductor layer 122 is the sum of the thickness t1 and the thickness t2, and thus a thickness of the part of the activated portion 125 extending from the first electrode 240 to the active layer 123 is the sum of the thickness t1 and the thickness t2. In addition, as the inactivated portion 234 have the thickness t1, the current-injecting zone 232 defined by the inactivated portion 234 can be taken as conductive channel having a length equal to the thickness t1.

As confirmed by the aforementioned equation I, the current spreading length of the semiconductor layer of the diode is proportional to $$\sqrt{\frac{t}{\rho}}.$$

In some embodiments, the current spreading length of the first type semiconductor layer 122 is relative to at least one of the thickness t1 and the thickness t2. In some embodiments, the current spreading length of the first type semiconductor layer 122 is varied by adjusting a relationship between the thickness t1 and the thickness t2. For example, under the sum of the thickness t1 and the thickness t2 is kept the same, increasing the thickness t1 and decreasing the thickness t2 can reduce the current spreading length of the first type semiconductor layer 122.

In some embodiments, at least one of $\rho_3$ of the inactivated portion 234 and $\rho_2$ of another part of the activated portion 125 is non-uniform, in which at least one the resistivities is gradually decreased along a direction from an interface between the inactivated portion 234 and the first electrode 240 to the active layer 123. In some embodiments, $\rho_3$ of the inactivated portion 234 and $\rho_2$ of another part of the activated portion 125 are non-uniform and are gradually decreased along a direction from the interface between the inactivated portion 234 and the first electrode 240 to the active layer 123, in which the $\rho_3$ of the inactivated portion 234 and $\rho_2$ of another part of the activated portion 125 at an interface therebetween are continuous.

In some embodiments in which at least one of $\rho_3$ of the inactivated portion 234 and $\rho_2$ of another part of the activated portion 125 is non-uniform, at least one of the carrier concentrations of the activated portion 125 and the inactivated portion 234 is non-uniform. For example, the hole concentrations of the activated portion 125 and the inactivated portion 234 along a direction from the interface between the inactivated portion 234 and the first electrode 240 to the active layer 123 is increased. The relate descriptions are provided later with FIGS. 18E and 18F.

In addition, in some embodiments, the current controlling structure 230 includes a portion present in the first type semiconductor layer 122, in which the first type semiconductor layer 122 has a resistivity $\rho_a$ less than 10 Ω-cm and the portion of the current controlling structure 230 has a resistivity $\rho_b$ greater than $10^2$ Ω-cm. Under this condition, the first type semiconductor layer 122 has a thickness ta and the portion of the current controlling structure 230 has a thickness tb, in which the ratio of the thickness tb to the thickness ta is in a range from 0.05 to 1.

Figure 18E:
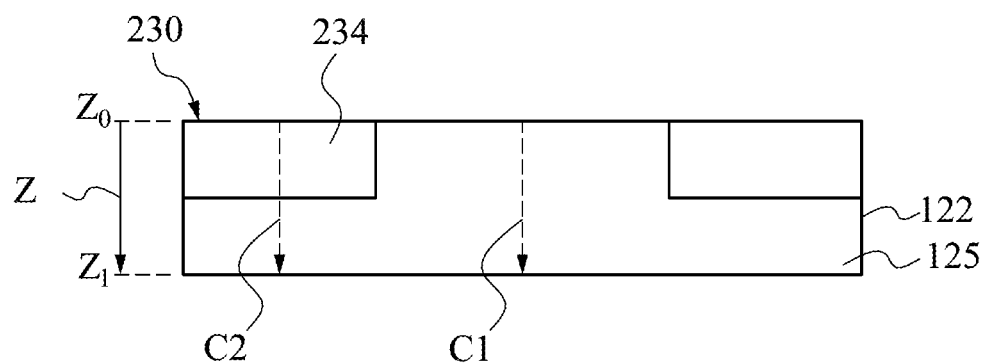
FIG. 18E is a cross-sectional view of the first type semiconductor layer and the current controlling structure of the LED illustrated in FIG. 18A with a z-axis.
Figure 18F:
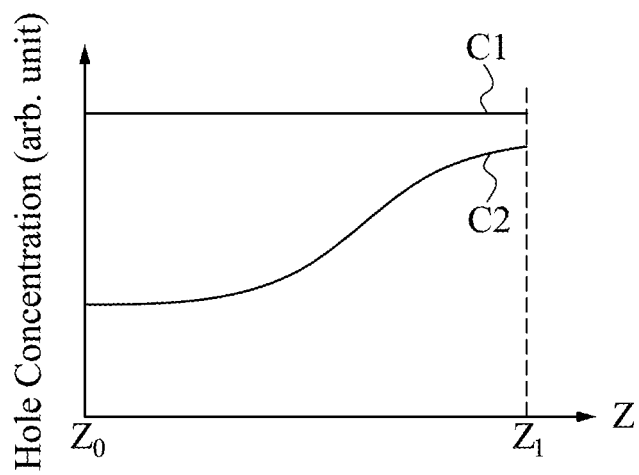
FIG. 18F is a graph plotting relatively hole concentration versus z-coordinate in the first type semiconductor layer and the current controlling structure illustrated in FIG. 18E.

FIG. 18E is a cross-sectional view of the first type semiconductor layer 122 and the current controlling structure 230 of the LED illustrated in FIG. 18A with a z-axis. A z-axis Z is illustrated in FIG. 18E, in which the direction of the z-axis Z is from a point $Z_0$ to a point $Z_1$, as the arrow marked at the z-axis Z. FIG. 18F is a graph plotting relatively hole concentration versus z-coordinate in the first type semiconductor layer 122 and the current controlling structure 230 illustrated in FIG. 18E, in which the horizontal axis represents the z-coordinate of the z-axis Z illustrated in FIG. 18B, the vertical axis represents the hole concentration, and both of the z-coordinate of the z-axis Z and the hole concentration are in arbitrary unit herein. In addition, the mark C1 represents the hole concentration of the activated portion 125 present in the central first type semiconductor layer 122 along the z-axis Z, and the mark C2 represents the hole concentrations of the inactivated portion 234 and the activated portion 125 present between in the inactivated portion 234 and the active layer 123 (see FIG. 18A).

In the hole concentration marked as C1, the hole concentration along the z-axis Z from the point $Z_0$ to the point $Z_1$ is substantial constant. In the hole concentration marked as C2, the hole concentration along the z-axis Z from the point $Z_0$ to the point $Z_1$ is substantial non-uniform. Thus, the hole concentrations of the inactivated portion 234 and the activated portion 125 present between in the inactivated portion 234 and the active layer 123 (see FIG. 18A) is gradually increased, in which the hole concentration marked as C2 is continuous. In some embodiment, since the hole concentration marked as C2 is continuous, an activated-inactivated-buffer portion is present between the inactivated portion 234 and the activated portion 125.

FIGS. 19A-19D are plan views of the current controlling structure illustrated in FIG. 18A according to various embodiments of the present disclosure. As shown in FIGS. 19A-19D, the number and the shape of the current-injecting zone 232 of the current controlling structure 230 illustrated in FIG. 18A can be varied in accordance with some embodiments of the present disclosure.

Figure 19A:
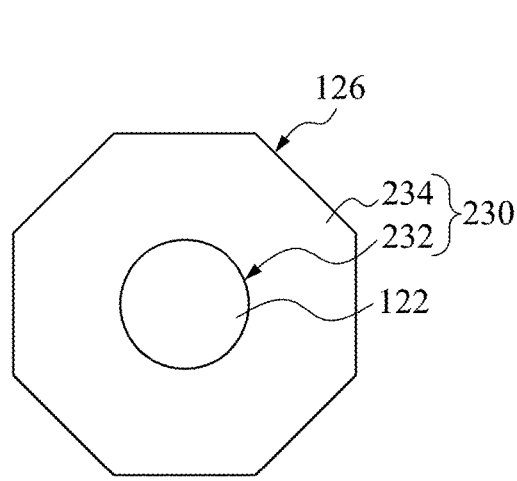
FIGS. 19A-19D are plan views of the current controlling structure illustrated in FIG. 18A according to various embodiments of the present disclosure.
Figure 19B:
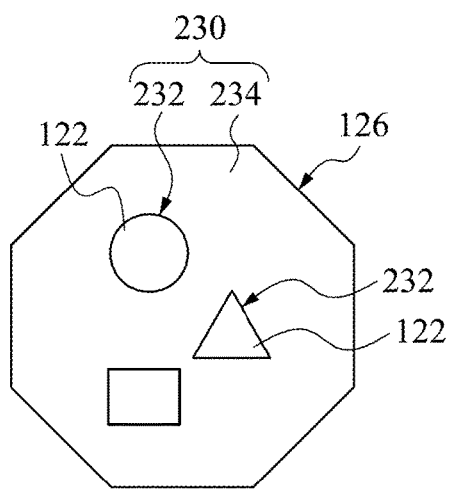

As shown in FIGS. 18A and 19A, the number of the current-injecting zone 232 of the current controlling structure 230 is one, in which the current-injecting zone 232 is defined by the inactivated portion 234. In some embodiments, the current-injecting zone 232 is separated from an edge 126 of the first type semiconductor layer 122 by the inactivated portion 234 of the current controlling structure 230. Explained in a different way, the current-injecting zone 232 illustrated in FIG. 19A can be taken as a zone with an enclosed type.

As shown in 19B, the number of the current-injecting zones 232 of the current controlling structure 230 is three. In other words, in some embodiments, the number of the current-injecting zones 232 of the current controlling structure 230 can be plural. In some embodiments, the current-injecting zones 232 of the current controlling structure 230 have the same shape or different shapes, in which at least one of the current-injecting zones 232 can be circular, triangle, rectangular or polygonal. Similarly, the current-injecting zones 232 illustrated in FIG. 19B can be taken as zones with the enclosed type.

Figure 19C:
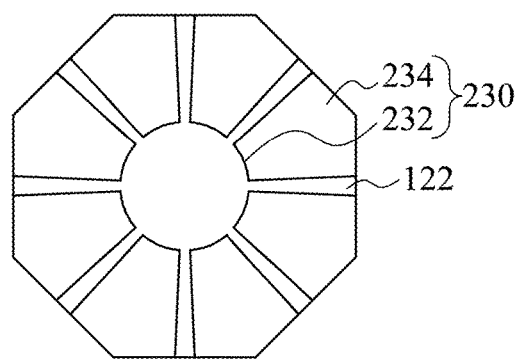

As shown in FIGS. 18A and 19C, the number of the current-injecting zone 232 of the current controlling structure 230 is similar to one. Furthermore, the current-injecting zone 232 is adjacent to the edge 126 of the first type semiconductor layer 122 illustrated in FIG. 19C. Explained in a different way, the current-injecting zone 232 illustrated in FIG. 19C can be taken as a zone with an open type.

Figure 19D:
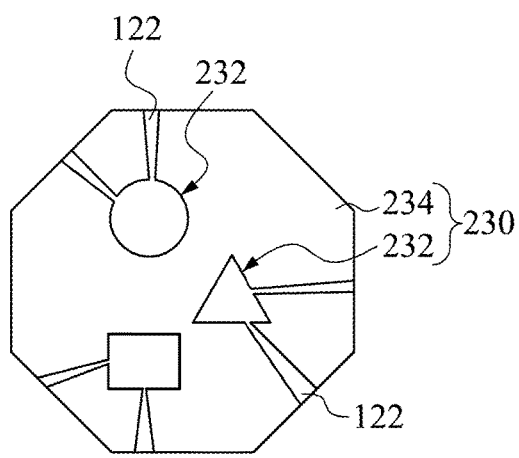

As shown in FIGS. 18A and 19D, the number of the current-injecting zones 232 of the current controlling structure 230 is similar to three, and the current-injecting zones 232 illustrated in FIG. 19D can be taken as zones with the open type Referring back to FIG. 18A. According to the configuration mentioned in FIGS. 19A-19D, in some embodiments, the inactivated portion 234 of the current controlling structure 230 preset between the first type semiconductor layer 122 and the first electrode 240 at least partially isolates between the edge 126 of the first type semiconductor layer 122 and the first electrode 240, and therefore the charge carriers spreading to a side surface of the LED 100H are rare or none. Therefore, the non-radiative recombination occurring at the side surface of the LED 100H can be reduced, thereby increasing the efficiency of the LED 100H. Explained in a different way, the current controlling structure 230 can serve as the edge isolation structure mentioned before.

In some embodiments, the LED 100H including the current controlling structure 230 can be manufactured by a number of methods. Next, one of the methods for manufacturing an LED including a current controlling structure is provided according to operations sequentially illustrated by FIGS. 20A-20F, in which FIGS. 20A-20F are cross-sectional views of an LED at an intermediate stage of a method for manufacturing the same according to some embodiments of the present disclosure.

Figure 20A:
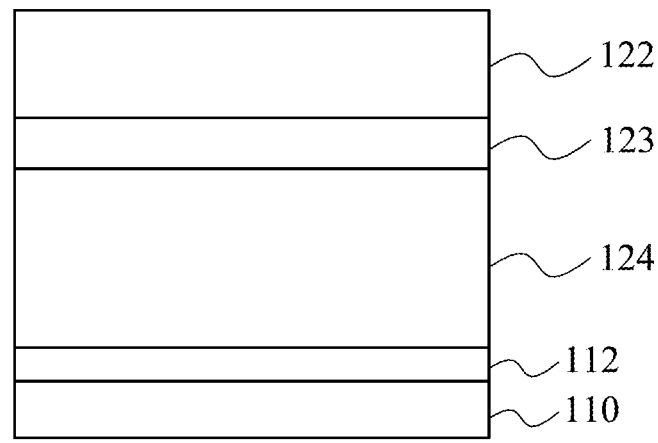
FIGS. 20A-20F are cross-sectional views of an LED at an intermediate stage of a method for manufacturing the same according to some embodiments of the present disclosure.

As shown in FIG. 20A, a buffer layer 112 is formed on a growth substrate 110. In some embodiments, several growth techniques may be used for growth of the buffer layer 112, such as metal organic CVD (MOCVD), molecular beam epitaxy (MBE), hydride vapor phase epitaxy (HVPE), and liquid phase epitaxy (LPE).

In some embodiments, the growth substrate 110 may be a bulk substrate including sapphire ($Al_2O_3$). Alternatively, the growth substrate 110 may be formed of other suitable materials such as, Si, GaN, SiC, or ZnO. In some embodiments, the buffer layer 112 may be made of a material different from or the same as the growth substrate 110. Alternatively, the buffer layer 112 may be a III-V compound semiconductor layer such as GaN, InN, AlN, InGaN, AlGaN, InAlGaN, and combinations thereof.

Next, a second type semiconductor layer 124 is formed on the buffer layer 112, an active layer 123 is formed on the second type semiconductor layer 124, and a first type semiconductor layer 122 is formed on the active layer 123 and the second type semiconductor layer 124. In some embodiments, the first type semiconductor layer 122, the active layer 123, and the second type semiconductor layer 124 may be formed by, for example, epitaxy, such as metal-organic chemical vapor deposition (MOCVD).

Figure 20B:
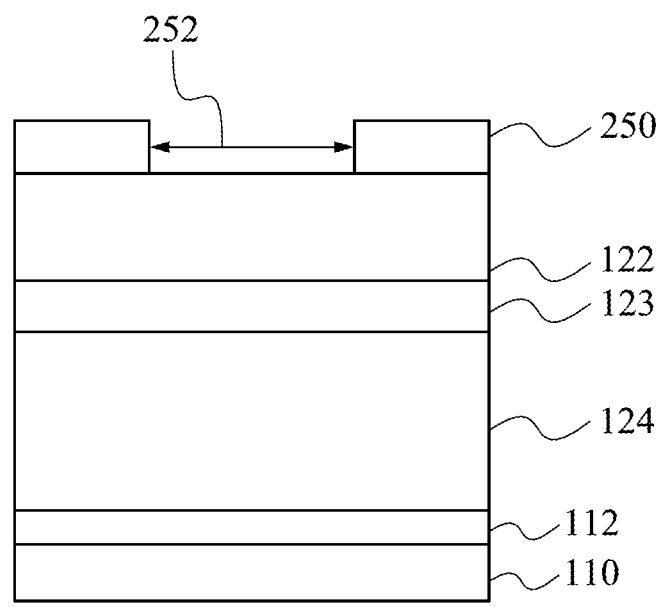

As shown in FIG. 20B, a first mask 250 is formed on the first type semiconductor layer 122. The first mask 250 has an opening 252 therein to expose at least one part of the first type semiconductor layer 122. In some embodiments, the first mask 250 is a metal layer made of titanium, and the available formation method for forming the first mask 250 includes deposition methods.

Figure 20C:
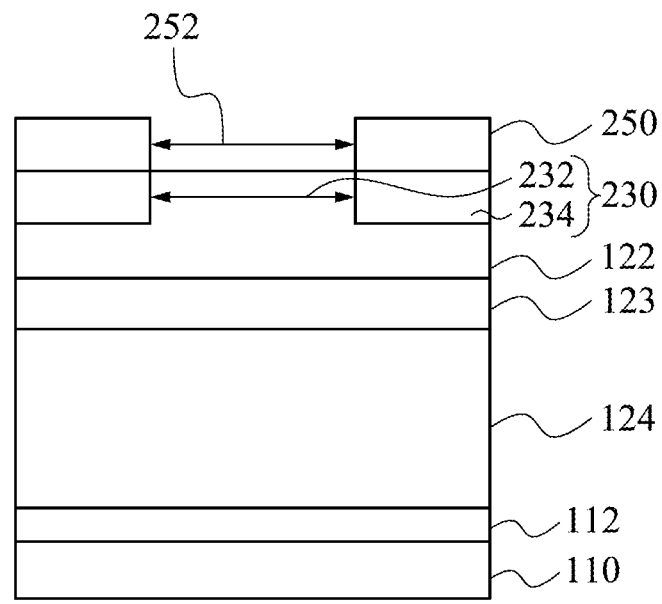

As shown in FIG. 20C, a heating process is performed. In some embodiments in which the first type semiconductor layer 122 is made of AlGaN/InGaN/GaN, at least one element is doped in the first type semiconductor layer 122 to form p-doped GaN, for example, magnesium may be doped in the first type semiconductor layer 122 to form p-doped AlGaN/InGaN/GaN. Since hydrogen gas is used in the formation of the first type semiconductor layer 122, the hydrogen atoms may be present in the first type semiconductor layer 122. In this regard, since at least one hole of the magnesium doped into the first type semiconductor layer 122 may be occupied by at least one electron of the hydrogen atom, the conductivity of the first type semiconductor layer 122 is affected by this interaction.

With the heating process, the hydrogen present in the first type semiconductor layer 122 can be removed such that the first type semiconductor layer 122 is activated, and hence the heating process can be taken as an activating process in accordance with some embodiments. In some embodiments, after the activating process is performed, the conductivity of the first type semiconductor layer 122 is improved. In some embodiments in which the heating process is performed, the first type semiconductor layer 122 is heated with a temperature in a range from about 600° C. to about 800° C.

In some embodiments in which the first type semiconductor layer 122 is made of AlGaN/InGaN/GaN and the first mask 250 is made of titanium, after performing the heating process, an interaction between the first mask 250 and the first type semiconductor layer 122 covered with the first mask 250 involving the nitrogen vacancy may occur. In this regard, since the titanium present in the first mask 250 tend to combine with the nitrogen present in the first type semiconductor layer 122 to form titanium nitride (TiNx), the nitrogen present in the first type semiconductor layer 122 may be taken out such that the nitrogen vacancy may be formed in the first type semiconductor layer 122. The conductivity of the first type semiconductor layer 122 is reduced due to the nitrogen vacancy, and hence the first type semiconductor layer 122 covered with the first mask 250 may have the nitrogen vacancy density higher than the other of the first type semiconductor layer 122.

As previously described, the difference between the resistivities of the activated portion 125 and the inactivated portion 234 can be achieved by the difference between the nitrogen vacancy densities thereof. Therefore, after the heating process is achieved, in the first type semiconductor layer 122, at least one part having a resistivity higher than other part is transferred into a current controlling structure 230 including at least one inactivated portion 234, and the other part of the first type semiconductor layer 122 is activated to form at least one activated portion 125.

Explained in a different way, the activated portion 125 and the inactivated portion 234 of the current controlling structure 230 can be formed by the same heating process. The current controlling structure 230 is formed by reducing the conductivity of the part of the first type semiconductor layer 122 which is covered with the first mask 250, and the activated portion 125 is formed by increasing the conductivity of the other part of the first type semiconductor layer 122 by removing the hydrogen therein.

Furthermore, since the first mask 250 has the opening 252 therein, the inactivated portion 234 can surround at least one zone having the resistivity less than the inactivated portion 234. Therefore, after forming the inactivated portion 234 in the first type semiconductor layer 122, this zone can provide an entrance for at least one current injection path in the first type semiconductor layer 122, and hence this zone is defined as a current-injecting zone 232. In some embodiments, the dimension of the current-injecting zone 232 is determined by the dimension of the opening 252 of the first mask 250. In some embodiments, a vertical projection of the opening 252 of the first mask 250 on the first type semiconductor layer 122 is similar to the dimension of the current-injecting zone 232.

Figure 20D:
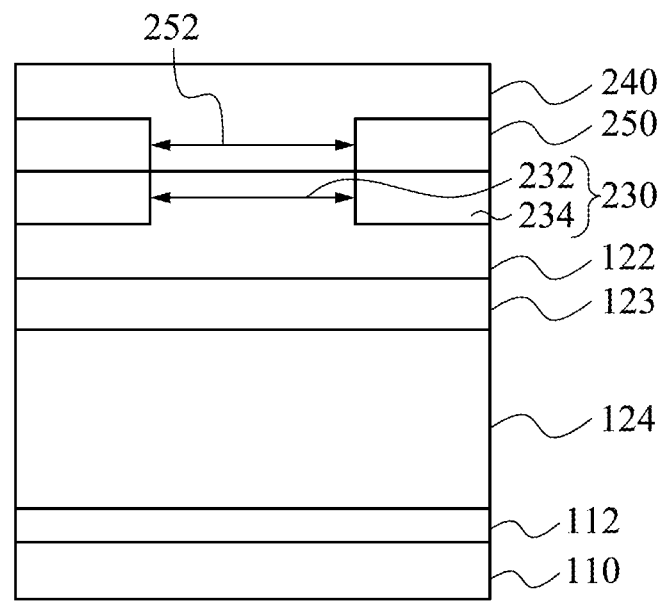

As shown in FIG. 20D, a first electrode 240 is formed on the first type semiconductor layer 122 and the current controlling structure 230, in which the first electrode 240 is electrically coupled with the first type semiconductor layer 122 through the current-injecting zone 232 of the current controlling structure 230. In some embodiments, the first electrode 240 has a thickness of approximately 1 μm-15 μm. In some embodiment, the first electrode 240 is formed on the first mask 250 made of metal, and thus a combination of the first electrode 240 and the first mask 250 serves as a conductive layer. In some embodiments, the first mask 250 is removed, and the formation of the first electrode 240 is performed after removing the first mask 250.

Figure 20E:
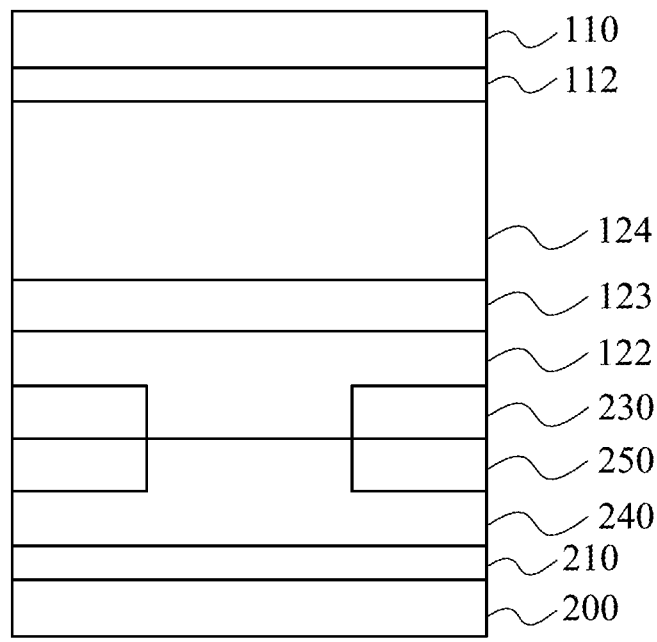

As shown in FIG. 20E, a combination of the first type semiconductor layer 122, the active layer 123, the second type semiconductor layer 124, the first current controlling structure 230, and the first electrode 240 is transferred to a carrier substrate 200. Furthermore, The carrier substrate 200 has an adhesive layer 210 thereon, in which the combination is bonded with the carrier substrate 200 through the adhesive layer 210. In some embodiments, the adhesive layer 210 may have a thickness of approximately 0.1 μm-100 μm. The adhesive layer 210 may be made of adhesion capable organic or non-organic materials, e.g., UV curable glue or silicone. The adhesive layer 210 may be formed from a material which is capable of adhering the combination of the first type semiconductor layer 122, the active layer 123, the second type semiconductor layer 124, the first current controlling structure 230, and the first electrode 240 to the carrier substrate 200. Specifically, the adhesion force of the adhesive layer 210 could be adjusted or reduced by an electric field, UV light, electromagnetic radiation, heat, ultrasound, mechanical force, pressure, or any combinations thereof.

Figure 20F:
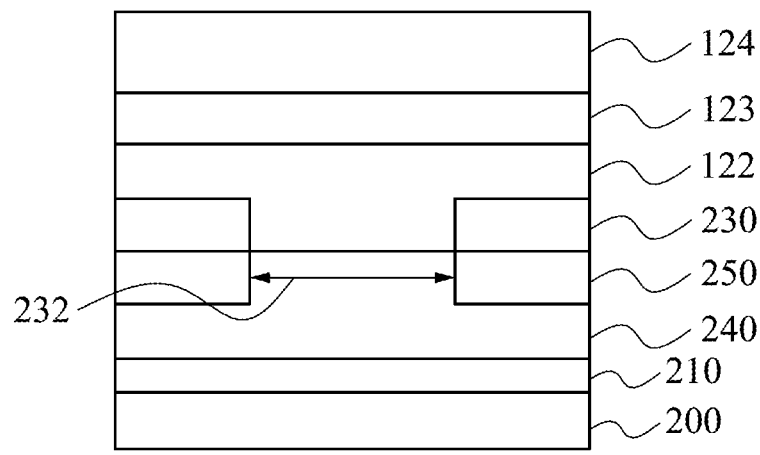

As shown in FIG. 20F, the growth substrate 110 and the buffer layer 112 have been removed from the structure illustrated in FIG. 20E. In some embodiments, the growth substrate 110 and the buffer layer 112 may be removed by a suitable method such as chemical lift-off or laser lift-off (LLO). Moreover, a predetermined amount of the second type semiconductor layer 124 is thinned down to the desirable thickness, and an operable p-n diode is remained after the thinning. In some embodiments, after thinning the second type semiconductor layer 124, a formation of a second electrode 242 mentioned in FIG. 18A can be performed. In the formation of the second electrode 242, the second electrode 242 may be formed on another receiving substrate (not illustrated). Next, similar to the operation illustrated in FIG. 2I, the structure illustrated in FIG. 20F without the carrier substrate 200 and the adhesive layer 210 can be transferred to another substrate, for example, the receiving substrate with the second electrode 242 thereon. In some embodiments, after the structure illustrated in FIG. 20F is transferred to the receiving substrate with the second electrode 242 thereon, the second electrode 242 is joined with the second type semiconductor layer 124. Thereafter, the LED including the current controlling structure 230 with the current-injecting zone 232 is formed.

Furthermore, the method for manufacturing the LED described above is provided through performing a number of the processes with the single LED. However, in some embodiments, an array of the LEDs including the current controlling structure with the current-injecting zone can be formed. For example, a plurality of the first masks 250 are formed on the first type semiconductor 122, and hence a plurality of the current-injecting zones 232 are correspondingly formed. Next, similar to the structure illustrated in FIG. 20F, after the thinning, the structure is chipped to form a plurality of the LEDs, and the LEDs are positioned over the adhesive layer 210.

Figure 21A:
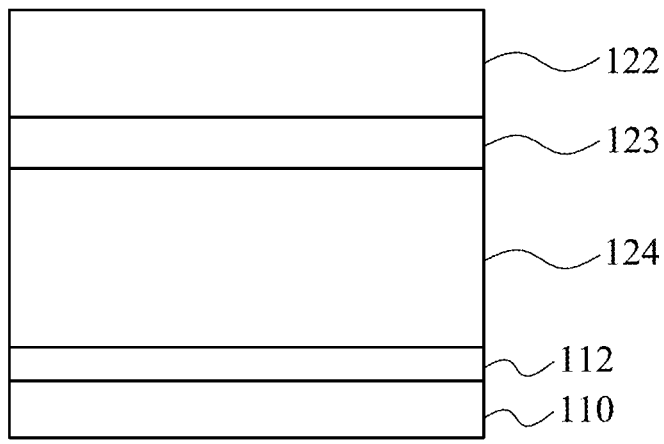
FIGS. 21A-21B are cross-sectional views of an LED at an intermediate stage of a method for manufacturing the same according to some embodiments of the present disclosure.
Figure 21B:
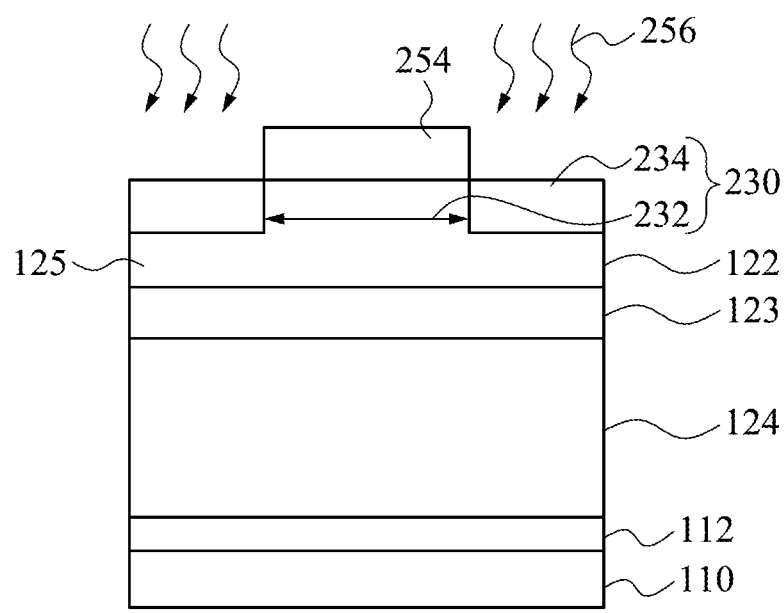

In some embodiments, the LED including the current controlling structure with the current-injecting zone can be manufactured by a method different from the operations illustrated FIG. 20A-20F. In this regard, an LED including a current controlling structure is provided according to operations sequentially illustrated by FIGS. 21A-21B, in which FIGS. FIGS. 21A-21B are cross-sectional views of an LED at an intermediate stage of a method for manufacturing the same according to some embodiments of the present disclosure. The difference between the operations illustrated in FIGS. 21A-21B and the operations illustrated in FIGS. 20A-20F is that a heating process is performed to activate the first type semiconductor layer 122 after the combination is formed. In addition, since the operations performed before the operation illustrated in FIG. 21A are similar to those in the operations illustrated in FIG. 20A, they are not repeated herein.

As shown in FIG. 21A, a combination of a growth substrate 110, a buffer layer 112, a second type semiconductor layer 124, an active layer 123, and a first type semiconductor layer 122 is formed. Next, a heating process is performed, such that most of the first type semiconductor layer 122 is activated.

As shown in FIG. 21B, a second mask 254 is formed on the first type semiconductor layer 122, in which the second mask 254 is a metal layer made of nickel in accordance with some embodiments. After forming the second mask 254, at least one part of the first type semiconductor layer 122 is covered with the second mask 254, and the other part of the first type semiconductor layer 122 is exposed. Next, at least one inactivating agent 256 is introduced to inactivate the exposed part of the activated first type semiconductor layer 122, and thus introducing the inactivating agent can be taken as an inactivating process. In some embodiments, the inactivating agent includes ammonia ($NH_3$). During the inactivating process, the second mask 254 is formed on the first type semiconductor layer 122 serves as a protect layer. After performing the inactivating process, the exposed part of the activated first type semiconductor layer 122 is inactivated such that a resistivity thereof is increased, and a resistivity of the part of the activated first type semiconductor layer 122 covered with the second metal layer is kept the same.

Explained in a different way, after performing the inactivating process, the exposed part of the activated first type semiconductor layer 122 has the resistivity higher than the resistivity of the part of the activated first type semiconductor layer 122 covered with the second mask 254. Therefore, after performing the inactivating process, the exposed part of the activated first type semiconductor layer 122 is transferred into a current controlling structure 230 including at least one inactivated portion 234, and the activated first type semiconductor layer 122 covered with the second metal layer is kept to be at least one activated portion 125. Therefore, the activated portion 125 and the inactivated portion 234 in the first type semiconductor layer 122 can be formed by the heating process and the inactivating process, in which the inactivating process continues with the heating process.

Furthermore, as stated above, with the heating process and the inactivating process performed sequentially, the activated portion 125 can have a carrier concentration more than that of the inactivated portion 234, in which the carrier concentration may be a hole concentration or an electron concentration.

In addition, in the first type semiconductor layer 122, since the resistivity of the part covered with the second mask 254 is kept the same, at least one zone having the resistivity less than the inactivated portion 234 is surrounded by the inactivated portion 234. After forming the inactivated portion 234 in the first type semiconductor layer 122, this zone can provide an entrance for at least one current injection path in the first type semiconductor layer 122, and hence this zone is defined as a current-injecting zone 232. In some embodiments, the dimension of the current-injecting zone 232 is determined by the dimension of the second mask 254. In some embodiments, a vertical projection of the second mask 254 on the first type semiconductor layer 122 is similar to the dimension of the current-injecting zone 232.

Next, after the activated portion 125 and the inactivated portion 234 are formed in the first type semiconductor layer 122, a first electrode (thus, the first electrode 240 mentioned above) is formed on the first type semiconductor layer 122, in which the first electrode is electrically coupled with the first type semiconductor layer 122 through the current-injecting zone 232. In some embodiment, the first electrode is formed on the second mask 254 made of metal, and thus a combination of the first electrode and the second mask 254 serves as a conductive layer. In some embodiments, the second mask 254 is removed, and the formation of the first electrode is performed after removing the second mask 254.

Figure 22:
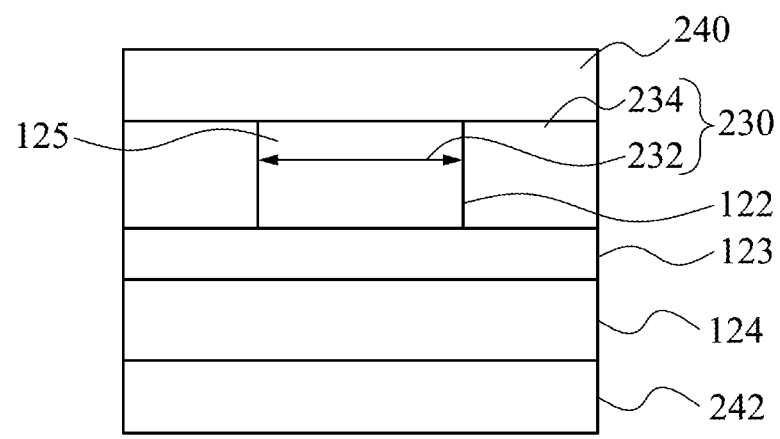
FIG. 22 is a cross-sectional view of an LED according to some embodiments of the present disclosure.

FIG. 22 is a cross-sectional view of an LED 100I according to some embodiments of the present disclosure. The difference between the LED illustrated in FIG. 22 and the LED illustrated in FIG. 18A is that the current controlling structure 230 including the inactivated portion 234 which extends to a surface of the first type semiconductor layer 122 facing the second type semiconductor layer 124.

In some embodiments, two opposite surfaces of the current controlling structure 230 are respectively coplanar with two opposite surfaces of the first type semiconductor layer 122. In addition, most of the activated portion 125 of the first type semiconductor layer 122 is surrounded by the inactivated portion 234, and thus the most of the activated portion 125 is present in the current-injecting zone 232. In some embodiments, the inactivated portion 234 extending to the surface of the first type semiconductor layer 122 facing the second type semiconductor layer 124 contacts the active layer 123. According the equation I mentioned previously, the current spreading length of the semiconductor layer of the diode is proportional to $$\sqrt{\frac{t}{\rho}}.$$

With this configuration, since the first type semiconductor layer 122 and the current controlling structure 230 may have the same thickness, the thickness t2 mentioned in FIG. 18A approaches zero in the LED 100I illustrated in FIG. 22. Therefore, the current spreading length of the first type semiconductor layer 122 can be further reduced.

Explained in a different way, since the activated portion 125 surrounded by the inactivated portion 234 is present in the current-injecting zone 232, a path of the current traveling in the first type semiconductor layer 122 is present in the current-injecting zone 232 as well. With this configuration, when the current flows in the first type semiconductor layer 122, the current is controlled to lateral spreading such that the lateral current is reduced, and hence reducing the current spreading length of the first type semiconductor layer 122 is achieved.

The LED 100I including the current controlling structure which extends to the first type semiconductor layer 122 can be manufactured by a number of methods. In some embodiments, the LED 100I illustrated in FIG. 22 can be manufactured by the methods mentioned in FIGS. 20A-20F and FIGS. 21A-21B with varying at least one recipe thereof. For example, performing time of the heating process or the inactivating process. In some embodiments, prolonging the performing time of the heating process or the inactivating process may increase the thickness of the inactivated portion 234. Moreover, in some embodiments, in the heating process illustrated in FIG. 20C, increasing the thickness of the mask 250 may increase the thickness of the inactivated portion 234.

Figure 23:
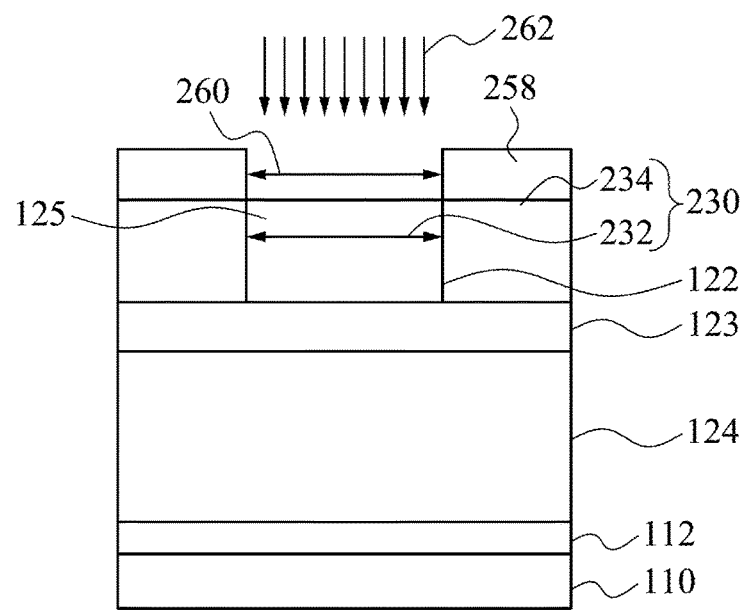
FIG. 23 is a cross-sectional view of an LED at an intermediate stage of a method for manufacturing the same according to some embodiments of the present disclosure.

In some embodiments, a method for manufacturing an LED including a current controlling structure which extends to a first type semiconductor layer is provided according to an operations illustrated in FIG. 23, in which FIG. 23 is a cross-sectional view of an LED at an intermediate stage of a method for manufacturing the same according to some embodiments of the present disclosure. In addition, since the operations performed before the operation illustrated in FIG. 23 are similar to those in the operations illustrated in FIG. 20A, they are not repeated herein. The difference between the operations illustrated in FIG. 23 and the operations illustrated in FIGS. 20A-20F is that the first type semiconductor layer 122 is activated by introducing at least one activating radiation 262.

As shown in FIG. 23, a combination of a growth substrate 110, a buffer layer 112, a second type semiconductor layer 124, an active layer 123, and a first type semiconductor layer 122 is formed. A third mask 258 is formed on the first type semiconductor layer 122, in which the third mask 258 has an opening 260 therein.

After forming the third mask 258, at least one part of the first type semiconductor layer 122 is covered with the third mask 258, and the other part of the first type semiconductor layer 122 is exposed. In some embodiments, the third mask 258 is made of a photo-resist material or a dielectric material, such as silicon nitride or silicon dioxide. Next, the activating radiation is introduced to activate the exposed portion of the first type semiconductor layer 122 through the mask layer. In some embodiments, the activating radiation includes an electron beam, a laser, ultraviolet light, or combinations thereof.

With this configuration, in the first type semiconductor layer 122, the part exposed by the opening 260 of the third mask 258 is activated to have a carrier concentration more than that of the part covered with the third mask 258. Therefore, in the first type semiconductor layer 122, the exposed part can have a conductivity higher than that of the covered part, and thus the exposed part can have a resistivity less than that of the covered part. Accordingly, the part of the first type semiconductor layer 122 exposed by the opening 260 of the third mask 258 is transferred into at least one activated portion 125, and the part of the first type semiconductor layer 122 covered with the third mask 258 is transferred into at least one inactivated portion 234, in which the activated portion 125 and the inactivated portion 234 are transferred from the same semiconductor layer.

As previously described, since the third mask 258 has the opening 260 therein, after the activated portion 125 and the inactivated portion 234 are formed, the activated portion 125 is surrounded by the inactivated portion 234 which has the higher resistivity. Thus, since the activated portion 125 surrounded by the inactivated portion 234 can provide an entrance for at least one current injection path in the first type semiconductor layer 122 to the active layer 123, a current-injecting zone 232 is formed and defined by the inactivated portion 234.

Moreover, after the activated portion 125 and the inactivated portion 234 are formed, a first electrode (the first electrode 240 mentioned above) is formed on the first type semiconductor layer 122. In some embodiments, the third mask 258 is removed, and the formation of the first electrode is performed after removing the third mask 258. In some embodiments, since the third mask 258 disposed on the inactivated portion 234 may not block the current-injecting zone 232, the third mask 258 is kept and the first electrode is directly formed on the first type semiconductor layer 122 and the third mask 258. However, the first electrode formed on the first type semiconductor layer 122 is electrically coupled with the first type semiconductor layer 122 through the current-injecting zone 232.

Figure 24:
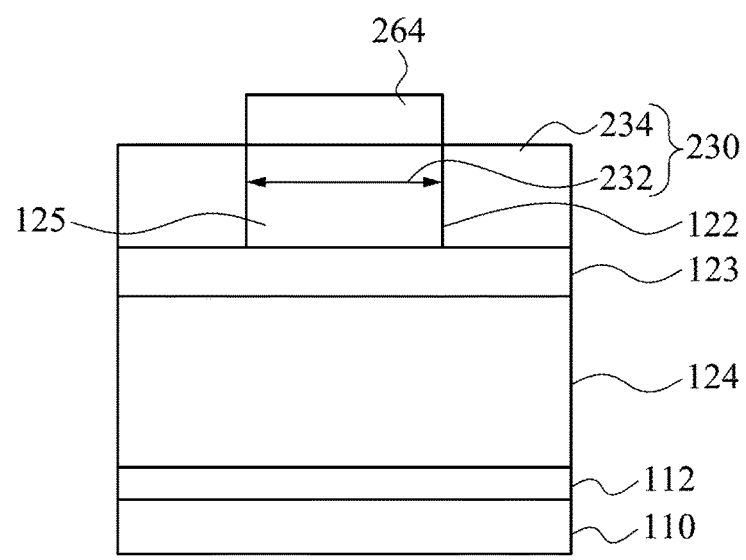
FIG. 24 is a cross-sectional view of an LED at an intermediate stage of a method for manufacturing the same according to some embodiments of the present disclosure.

Moreover, the operations described in FIG. 23 is one of the methods for manufacturing an LED including a current controlling structure which extends to a first type semiconductor layer. Next, another one of the methods for manufacturing an LED including a current controlling structure which extends to a first type semiconductor layer is provided according to an operation illustrated in FIG. 24, in which FIG. 24 is a cross-sectional view of an LED at an intermediate stage of a method for manufacturing the same according to some embodiments of the present disclosure. Since the operations performed before the operation illustrated in FIG. 24 are similar to those in the operations illustrated in FIG. 20A, they are not repeated herein. The difference between the operations illustrated in FIG. 24 and the operations illustrated in FIG. 23 is that the first type semiconductor layer 122 is activated with at least one catalysis layer.

As shown in FIG. 24, a combination of a growth substrate 110, a buffer layer 112, a second type semiconductor layer 124, an active layer 123, and a first type semiconductor layer 122 is formed. Next, a fourth mask 264 is formed on the first type semiconductor layer 122, in which the fourth mask 264 is a catalysis layer made of nickel in accordance with some embodiments.

After forming the fourth mask 264, at least one part of the first type semiconductor layer 122 is covered with the fourth mask 264, and another part of the first type semiconductor layer 122 is exposed. Next, a heating process is performed to at least remove the hydrogen present in the first type semiconductor layer 122 such that the first type semiconductor layer 122 is activated. With the fourth mask 264 used as the catalysis layer, the part of the first type semiconductor layer 122 covered with the fourth mask 264 can be activated with a temperature lower than that of the exposed part of the first type semiconductor layer 122.

In some embodiments, the part of the first type semiconductor layer 122 covered with the fourth mask 264 can be activated by the heating process with a first temperature, and the exposed part of the first type semiconductor layer 122 can be activated by the heating process with a second temperature, where the first temperature is less than the second temperature. As the heating process is performed with a temperature in a range from the first temperature to the second temperature, the covered part of the first type semiconductor layer 122 is activated, and the exposed part of the first type semiconductor layer 122 is kept the same.

Therefore, in the first type semiconductor layer 122, the covered part can have a conductivity higher than that of the exposed part, and thus the covered part can have a resistivity less than that of the exposed part. Accordingly, the part of the first type semiconductor layer 122 covered with the fourth mask is transferred into at least one activated portion 125, and the exposed part of the first type semiconductor layer 122 is kept the same to be taken as at least one inactivated portion 234 due to the higher resistivity.

Furthermore, after the activated portion 125 is formed, the activated portion 125 is surrounded by the inactivated portion 234 which has the higher resistivity. Thus, since the activated portion 125 surrounded by the inactivated portion 234 can provide an entrance for at least one current injection path from the first type semiconductor layer 122 to the active layer 123, a current-injecting zone 232 is formed and defined by the inactivated portion 234.

Moreover, after the activated portion 125 and the inactivated portion 234 are formed, a first electrode (the first electrode 240 mentioned above) is formed on the first type semiconductor layer 122. In some embodiments, the fourth mask 264 is removed, and the formation of the first electrode is performed after removing the third fourth mask 264. In some embodiments, the fourth mask 264 is kept and the first electrode is directly formed on the first type semiconductor layer 122 and the fourth mask 264. However, the first electrode formed on the first type semiconductor layer 122 is electrically coupled with the first type semiconductor layer 122 through the current-injecting zone 232.

Figure 25:
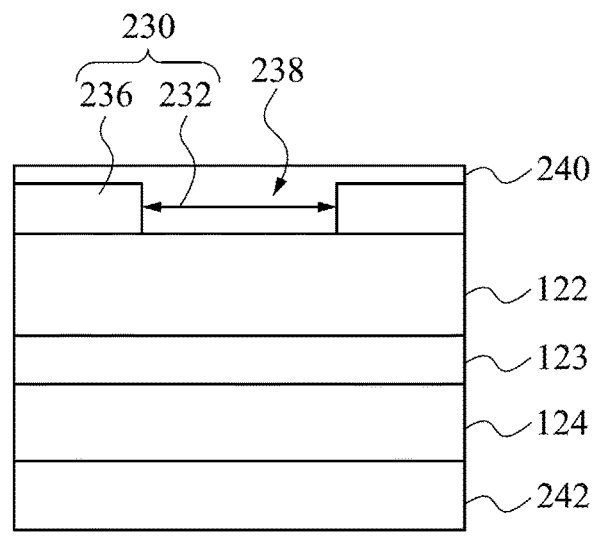
FIG. 25 is a cross-sectional view of an LED according to some embodiments of the present disclosure.

FIG. 25 is a cross-sectional view of an LED 100J according to some embodiments of the present disclosure. As shown in FIG. 25, the LED 100J includes a first type semiconductor layer 122, a second type semiconductor layer 124, an active layer 123, a current controlling structure 230, a first electrode 240, and a second electrode 242. The second type semiconductor layer 124 is joined with the first type semiconductor layer 122. The active layer 123 is disposed between the first type semiconductor layer 122 and the second type semiconductor layer 124.

The current controlling structure 230 is joined with the first type semiconductor layer 122 and include least one current controlling layer 236, in which the current controlling layer 236 has at least one opening 238 to form the current-injecting zone 232. The first electrode 240 is electrically coupled with the first type semiconductor layer 122 through the current-injecting zone 232 of the current controlling structure 230. The second electrode 242 is electrically coupled with the second type semiconductor layer 124.

In some embodiments, the inactivated portion mentioned previously is omitted, and the current-injecting zone 232 can be defined by the opening 238 of the current controlling layer 236, as the descriptions mentioned above. In some embodiments, the current controlling structure 230 can include one of the inactivated portion and the opening 238 of the current controlling layer 236 to define the current-injecting zone 232. In some embodiments, the current controlling structure 230 can include the inactivated portion and the opening 238 of the current controlling layer 236 both to define the current-injecting zone 232. In the following embodiments, descriptions are provided with respect to variations of the current controlling structure 230 including the inactivated portion and the opening 238 of the current controlling layer 236 both.

Figure 26:
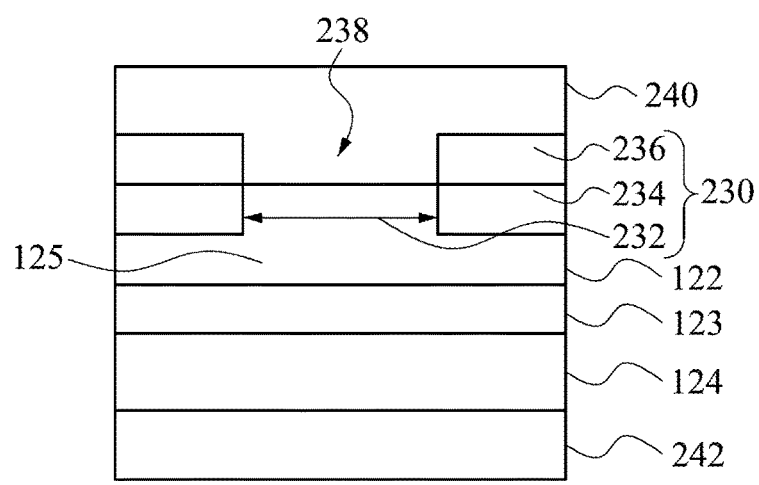
FIG. 26 is a cross-sectional view of an LED according to some embodiments of the present disclosure.

FIG. 26 is a cross-sectional view of an LED 100K according to some embodiments of the present disclosure. The difference between the LED illustrated in FIG. 26 and one of the LEDs illustrated in FIGS. 18A and 25 is that the LED 100K includes a current controlling structure including at least one inactivated portion and a current controlling layer with at least one opening.

As shown in FIG. 26, the LED 100K includes a first type semiconductor layer 122, a second type semiconductor layer 124, an active layer 123, a current controlling structure 230, a first electrode 240, and a second electrode 242. The second type semiconductor layer 124 is joined with the first type semiconductor layer 122. The active layer 123 is disposed between the first type semiconductor layer 122 and the second type semiconductor layer 124. The current controlling structure 230 is joined with the first type semiconductor layer 122, in which the current controlling structure 230 is present at a side of the first type semiconductor layer 122 facing away from the active layer 123.

In a configuration of the LED 100K illustrated FIG. 26, the current controlling structure 230 includes at least one inactivated portion 234 and a current controlling layer 236. The inactivated portion 234 is present in the first type semiconductor layer 122, in which the inactivated portion 234 defines a current-injecting zone 232. The current controlling layer 236 is disposed on a side of the inactivated portion 234 facing away from the first type semiconductor layer 122. The current controlling layer 236 has at least one opening 238 therein, in which a vertical projection of the opening 238 on the inactivated portion 234 at least partially overlaps with the current-injecting zone 232.

Furthermore, the first type semiconductor layer 122 includes at least one activated portion 125 in the current-injecting zone 232, in which the activated portion 125 has a carrier concentration more than that of the inactivated portion 234. The first electrode 240 is electrically coupled with the first type semiconductor layer 122 through the current-injecting zone 232 and the opening 238 of the current controlling layer 236. The second electrode 242 is electrically coupled with the second type semiconductor layer 124.

As previously described, either of the current-injecting zone 232 defined by the inactivated portion 234 and the opening 238 of the current controlling layer 236 can confine a contact area between a conductive layer and a semiconductor layer (e.g., the first electrode 240 and the first type semiconductor layer 122), thereby increasing the efficiency of the LED 100K. In the configuration of the LED 100K illustrated FIG. 26, since the LED 100K includes the current-injecting zone 232 and the opening 238 both, the effects provided by the current-injecting zone 232 and the opening 238 both are enhanced. For example, the current spreading length of the first type semiconductor layer 122 can be further reduced, and hence the charge carriers spreading to the side surface of the LED 100K are rare or none.

In some embodiments, the LED 100K illustrated in FIG. 26 can be manufactured by the operation similar as FIGS. 2A-2I and FIGS. 20A-24. In some embodiments, the LED 100K illustrated in FIG. 26 can be manufactured by at least one of the operations illustrated in FIGS. 20A-24 for forming the inactivated portion 234 and the activated portion 125, and then the at least one of the operations illustrated in FIGS. 2A-2I is performed to form the current controlling layer 236 having the opening 238 therein. Next, after the current controlling layer 236 is formed, the first electrode 240 and the second electrode 242 are respectively formed.

In addition, in some embodiments, the current controlling layer 236 is formed on a surface of the second type semiconductor layer 124 facing away from the first type semiconductor layer 122, and thus the current controlling layer 236 is present between the second type semiconductor layer 124 and the second electrode 242. In some embodiments in which the current controlling layer 236 is present between the second type semiconductor layer 124 and the second electrode 242, the current controlling layer 236 is formed after the removing the growth substrate.

Figure 27:
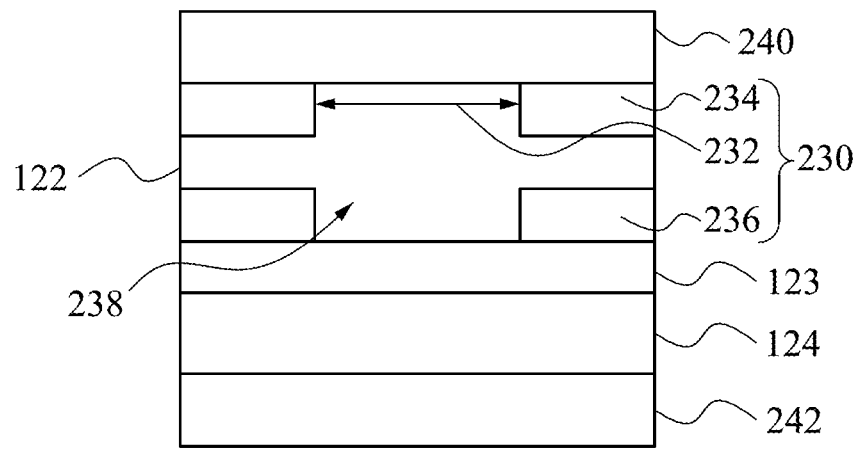
FIG. 27 is a cross-sectional view of an LED according to some embodiments of the present disclosure.

FIG. 27 is a cross-sectional view of an LED 100L according to some embodiments of the present disclosure. The difference between the LED 100L illustrated in FIG. 27 and the LED 100K illustrated in FIG. 26 is that the current controlling layer 236 having the opening 238 therein is disposed within the first type semiconductor layer 122.

In the LED 100L illustrated in FIG. 27, the current controlling layer 236 having the opening 238 therein is disposed between the first type semiconductor layer 122 and the active layer 123, and the current controlling layer 236 contacts the active layer 123. To manufacture the LED 100L shown in FIG. 27 in which the current controlling layer 236 is disposed between the first type semiconductor layer 122 and the active layer 123, the formation of the current controlling layer 236 can be brought to be performed between the formations of the active layer 123 and the first type semiconductor layer 122. Thus, the current controlling layer 236 is disposed in at least a part of the first type semiconductor layer 122.

Figure 28:
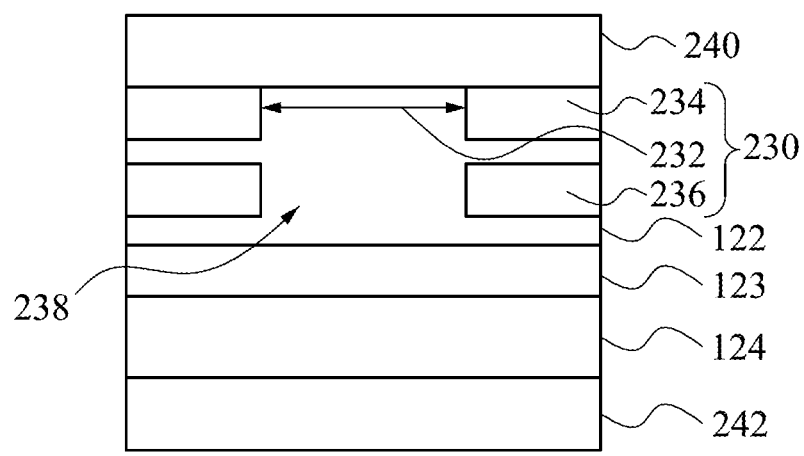
FIG. 28 is a cross-sectional view of an LED according to some embodiments of the present disclosure.

FIG. 28 is a cross-sectional view of an LED 100M according to some embodiments of the present disclosure. The difference between the LED 100M illustrated in FIG. 28 and the LED 100L illustrated in FIG. 27 is that the current controlling layer 236 having the opening 238 is disposed in the first type semiconductor layer 122 without contacting the active layer 123. Thus, the current controlling layer 236 having the opening 238 is separated from the active layer 123 by at least a part of the first type semiconductor layer 122.

With this configuration, the first type semiconductor layer 122 may protect the active layer 123 while manufacturing the current controlling layer 236. To manufacture the LED 100M shown in FIG. 28 in which the current controlling layer 236 having the opening 238 is disposed in the first type semiconductor layer 122, the formation of the current controlling layer 236 can be brought to be performed during the formation of the first type semiconductor layer 122. For example, the current controlling layer 236 can be formed after forming 10% of the first type semiconductor layer 122, and the rest 90% of the first type semiconductor layer 122 is then formed after the formation of the current controlling layer 236.

Figure 29:
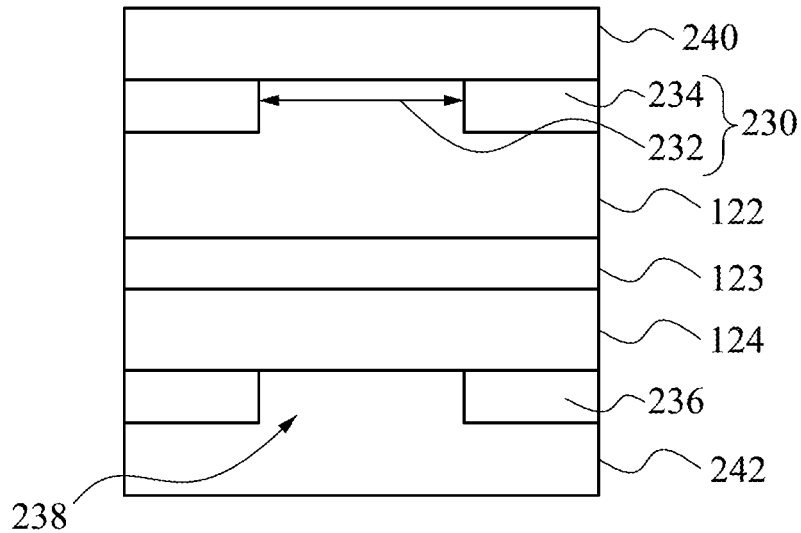
FIG. 29 is a cross-sectional view of an LED according to some embodiments of the present disclosure.

FIG. 29 is a cross-sectional view of an LED 100N according to some embodiments of the present disclosure. The difference between the LED 100N illustrated in FIG. 29 and the LED 100K illustrated in FIG. 26 is that the current controlling layer 236 having the opening 238 is disposed on a surface of the second type semiconductor layer 124 facing away from the first type semiconductor layer 122, in which the second electrode 242 is electrically coupled with the second type semiconductor layer 124 through the opening 238. Furthermore, a vertical projection of the opening 238 on the inactivated portion 234 is kept to at least partially overlap with the current-injecting zone 232.

To manufacture the LED 100N illustrated in FIG. 29, operations illustrated by FIG. 2A-2G can be sequentially performed. A difference between the manufacturing of the LED 100N illustrated in FIG. 29 and the operations illustrated by FIGS. 2A-2G is that the formation of the current controlling layer 236 is performed after removing the growth substrate 110, in which the current controlling layer 236 is formed on the second type semiconductor layer 124.

Figure 30:
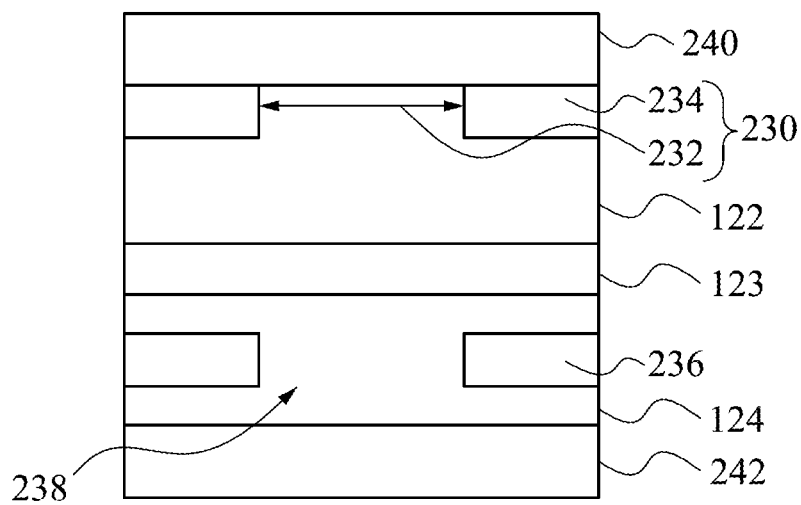
FIG. 30 is a cross-sectional view of an LED according to some embodiments of the present disclosure.

FIG. 30 is a cross-sectional view of an LED 100O according to some embodiments of the present disclosure. The difference between the LED 100O illustrated in FIG. 30 and the LED 100N illustrated in FIG. 29 is that the current controlling layer 236 is disposed in the second type semiconductor layer 124 without contacting the active layer 123. Thus, the current controlling layer 236 having the opening 238 is present between the second type semiconductor layer 124 and the active layer 123. In other words, the current controlling layer 236 having the opening 238 is separated from the active layer 123 by at least a part of the second type semiconductor layer 124.

However, although the current controlling layer 236 illustrated in FIG. 30 is disposed in the second type semiconductor layer 124 without contacting the active layer 123, in other embodiments, the current controlling layer 236 can be disposed in the second type semiconductor layer 124 with contacting the active layer 123. In other words, the disposition of the current controlling layer 236 may be similar to the current controlling layer 236 illustrated in FIG. 27 or FIG. 28.

Furthermore, in some embodiments, the number the current controlling layers 236 is two, and these current controlling layers 236 are respectively disposed at two opposite sides of the active layer 123. In some embodiments, the arrangement of the current controlling structure 230 including the two current controlling layers 236 can be varied according to the above embodiments. For example, one of the two current controlling layers 236 is disposed within the first type semiconductor layer 122, and another one of the two current controlling layers 236 is disposed within the second type semiconductor layer 124. In some embodiments involving at least one of the two current controlling layers 236 is disposed within the semiconductor layer, the current controlling layer disposed within the semiconductor layer may contact the active layer 123 or may be separated from the active layer 123 by at least a part of the semiconductor layer.

Furthermore, according to the method for manufacturing the LED mentioned in FIGS. 2A-2I, one of the operations is removing the growth substrate. In this regard, the removing process performed by LLO or the combination of the laser lift-off and chemical lift-off may generate a longitudinal wave and a transverse wave at the interface between the growth substrate and the buffer layer. The transverse wave includes oscillations occurring substantially perpendicular to a direction of energy transfer of the removing, and may substantially result in damage and cracking in the stacked structure of the LED. Accordingly, the descriptions are provided with respect to an operation with preventing the stacked structure of the LED from damage and cracking during the removing process.

Figure 31:
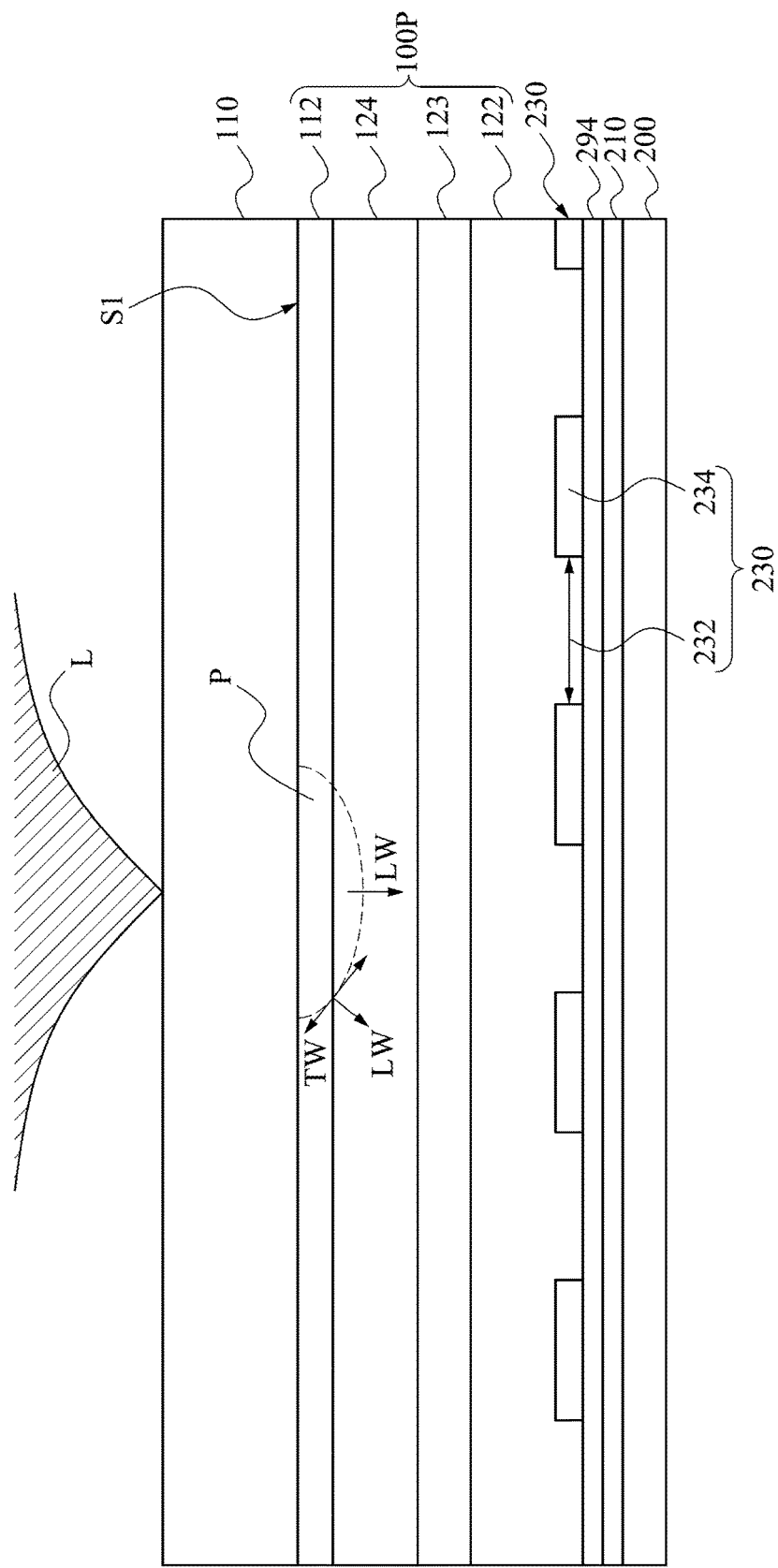
FIG. 31 is a cross-sectional view of an LED at an intermediate stage of a method for manufacturing the same according to some embodiments of the present disclosure.

FIG. 31 is a cross-sectional view of an LED at an intermediate stage of a method for manufacturing the same according to some embodiments of the present disclosure. In addition, since the operations performed before the operation illustrated in FIG. 31 are similar to the operations illustrated in FIGS. 2A-2D and FIGS. 20A-24, they are not repeated herein. Thus, the operations of forming the stacked structure of the LED and forming the current controlling structure 230 are not repeated herein. In the following descriptions, the term "the stacked structure of the LED" or "the LED structure" at least includes a buffer layer 112, a first type semiconductor layer 122, a second type semiconductor layer 124, an active layer 123, and a current controlling structure 230, and the LED structure is marked as 100P.

As shown in FIG. 31, a supporting layer 294 is formed on a surface of the LED structure 100P facing away from the growth substrate 110, and the growth substrate 110, the LED structure 100P and the supporting layer 294 are bonded with a carrier substrate 200 via an adhesive layer 210. The supporting layer 294 is electrically coupled with the first type semiconductor layer 122 through at least one current-injecting zone 232 defined by at least one inactivated portion 234. Furthermore, the adhesive layer 210 temporarily adheres the supporting layer 294 to the carrier substrate 200, in which the supporting layer 294 has a Young's modulus greater than that of the adhesive layer 210.

In some embodiments, the supporting layer 294 serves as an electrode of the LED structure 100P, and thus the supporting layer 294 can be taken as a part of the LED structure 100P. In some embodiments, the supporting layer 294 has a thickness greater than or equal to about 2 µm. The supporting layer 294 can be made of metal, alloy, or a transparent conductive material. For example, the supporting layer 294 can be made of titanium, tungsten, nickel, gold, platinum, palladium, rhodium, molybdenum, aluminum, copper, or any combinations thereof. In some embodiments, the supporting layer 294 may also be reflective. In some embodiments, a plurality of the supporting layers are stacked together, and the supporting layers may be made of the same or different materials.

During the removing process, the growth substrate 110 is removed from the LED structure 100P by a suitable removing method such as laser lift-off (LLO), a combination of the laser lift-off and chemical lift-off, or a combination of the laser lift-off and mechanical lift-off. While using LLO, the absorption in the GaN LED structure 100P at an interface S1 between the growth substrate 110 and the LED structure 100P results in localized heating of the interface resulting in decomposition at the interfacial GaN into Ga metal and nitrogen gas. Once the desired area has been irradiated, the transparent sapphire growth substrate 110 can be removed easily.

In detail, after being shot by a laser pulse L, a portion of the LED structure 100S ionizes rapidly to form a plasma P with high temperature and high pressure. The sudden expansion of the formed plasma P generates a vibration wave propagating into the LED structure 100P. The vibration wave expands spherically in both perpendicular and lateral direction at similar velocities. At the center of the illuminated area, a wave front of the vibration wave can be a plane, and a longitudinal wave LW dominates and results in a lateral cracking that may be desirable to increase the separation at the interface S1 between the growth substrate 110 and the LED structure 100P. However, in the surrounding of the illuminated area, the wave front of the vibration wave may be spherical, and thus a transverse wave TW is generated and cooperates with the longitudinal wave LW, thereby causing damage and cracking in the LED structure 100P. Thus, as stated earlier, The transverse wave TW includes oscillations occurring substantially perpendicular to a direction of energy transfer of the removing, and it may substantially result in damage and cracking in the LED structure 100P.

Under a situation in which the supporting layer 294 having a Young's modulus greater than that of the adhesive layer 210 is omitted or replaced by another layer, the vibration wave generated by LLO tends to be reflected back to propagate in the LED structure 100P by the adhesive layer, which is soft. Accordingly, in some embodiments, the supporting layer 294 serves as an absorber that absorbs and reduces the vibration wave (especially the transverse wave TW) propagating in the LED structure 100P, and thereby preventing the LED structure 100P from damage and cracking.

In some embodiments, the supporting layer 294 is made of rigid material. As stated earlier, the supporting layer 294 is designed to have the Young's modulus greater than that of the adhesive layer 210. Therefore, the supporting layer 294 is capable of helping absorbing the vibration wave and reducing the transverse wave TW from being reflected back to propagate in the LED structure 100P. The supporting layer 294 also can contribute to the mechanical strength to the LED structure 100P. Therefore, the LED structure 100P is prevented from cracking. As the previous description, the supporting layer 294 may have a thickness greater than or equal to about 2 µm, so as to absorb the vibration wave.

In some embodiments, the ablation depth of the laser pulse L is approximately 20 nm from the interface S1 between the growth substrate 110 and the LED structure 100P. In addition, the relative scale of the plasma P, the laser pulse L, and the current controlling structure 230 illustrated in FIG. 31 should not limit the scope of the present disclosure. The spot size of the laser pulse L or a vertical projection of the plasma P on the interface S1 can be smaller or larger than a vertical projection of the current controlling structure 230 on the interface S1. Moreover, LLO is used as an exemplary removing method herein, but it should not limit the scope of the present disclosure, and thus other various removing processes may be applied thereto.

Figure 32:
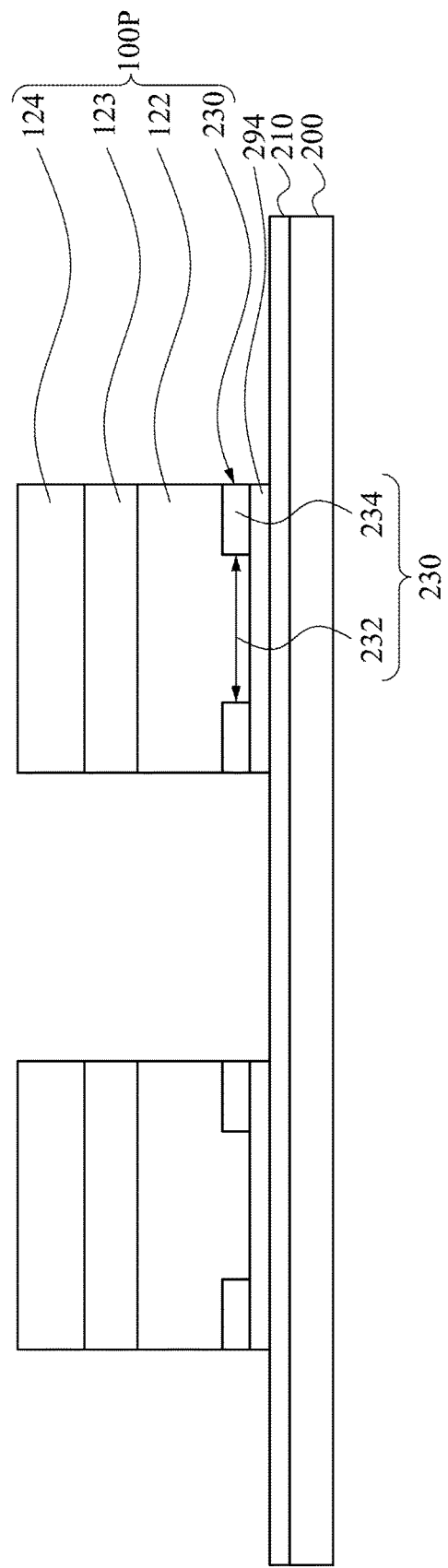
FIG. 32 is a cross-sectional view of the LED at an intermediate stage continuing with the stage illustrated in FIG. 31 according to some embodiments of the present disclosure.

FIG. 32 is a cross-sectional view of the LED at an intermediate stage continuing with the stage illustrated in FIG. 31 according to some embodiments of the present disclosure. As shown in FIG. 32, after the growth substrate 110 (see FIG. 31) is removed and the LED structure 100P is thinned, the LED structure 100P is chipped into a plurality of LEDs, in which the chipping extends into the supporting layer 294. The plurality of the LEDs including the current controlling structures 230 and the chipped supporting layer 294 are positioned over the adhesive layer 210. In some embodiments, the LEDs have vertical sidewalls. In some embodiments, after the chipping, at least one of the LEDs may be transferred to another substrate by a transfer head (not illustrated). In some embodiments, the Young's modulus of the adhesive layer 210 is less than or equal to 30 GPa. With this configuration, the adhesive layer 210 may absorb mechanical impact forces associated with contacting the LEDs with a transfer head during the transferring process.

In some embodiments in which the supporting layer 294 is formed on a surface of the first type semiconductor layer 122 facing away from the second type semiconductor layer 124, an intermediate LED structure includes a carrier substrate 200 and at least one LED includes 100P. The carrier substrate 200 has an adhesive layer 210 thereon for temporarily adhering the supporting layer 294 to the carrier substrate 200, in which the supporting layer 294 has a Young's modulus greater than that of the adhesive layer 210. According to the structure of the LED 100H illustrated in FIG. 18A, the supporting layer 294 can serve as the first electrode 240.

As described above, the LED structure 100P illustrated in FIG. 32 can further includes the supporting layer 294 serving as the mechanical wave absorber, and the supporting layer 294 absorbs and reduces the vibration wave propagating in the LED structure 100P during the removing process. On the other hand, since the LED structure 100P includes the current controlling structure 230 including the inactivated portion 234 to define the current-injecting zone 232, as stated earlier, the efficiency of the LED can be increased by the current-injecting zone 232. Thus, during the removing process, damage and the crack caused in the LED structure 100P are prevented by the supporting layer 294. Next, after the manufacturing process of the LED, the efficiency of the LED can be increased due to the current controlling structure 230.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A light-emitting diode (LED), comprising:
    a first type semiconductor layer;
    a second type semiconductor layer joined with the first type semiconductor layer; and
    a current controlling structure joined with the first type semiconductor layer, the current controlling structure having at least one current-injecting zone therein, wherein the current controlling structure comprises:
        at least one inactivated portion in the first type semiconductor layer, the inactivated portion defining the current-injecting zone;
    wherein the first type semiconductor layer comprises:
    at least one activated portion in the current-injecting zone, the activated portion having a resistivity less than that of the inactivated portion;
    a first electrode electrically coupled with the first type semiconductor layer through the current-injecting zone of the current controlling structure; and
    a second electrode electrically coupled with the second type semiconductor layer.

2. The LED of claim 1, wherein the inactivated portion extends to a surface of the first type semiconductor layer facing the second type semiconductor layer.

3. The LED of claim 1, wherein at least a part of the first type semiconductor layer which has a resistivity smaller than that of the inactivated portion is present between the inactivated portion and the second type semiconductor layer.

4. The LED of claim 2, wherein the part of the first type semiconductor layer which is present between the inactivated portion and the second type semiconductor layer has the resistivity greater than that of the activated portion.

5. The LED of claim 1, wherein a surface of the inactivated portion and a surface of the activated portion facing the first electrode are coplanar.

6. The LED of claim 1, wherein the current-injecting zone is a conductive channel extending from a surface of the first type semiconductor layer facing the first electrode toward a surface of the first type semiconductor layer facing away from the first electrode toward.

7. The LED of claim 1, wherein the first type semiconductor layer has a resistivity, the resistivity of the first type semiconductor layer has a minimum value at a position within the current-injecting zone, and the resistivity of the first type semiconductor layer at an edge portion of the current-injecting zone is gradually decreased from the outside of the current-injecting zone to the inside of the current-injecting zone.

8. The LED of claim 1, wherein
    the activated portion has a nitrogen vacancy density less than that of the inactivated portion.

9. The LED of claim 1, wherein
    the activated portion has a carrier concentration more than that of the inactivated portion.

10. The LED of claim 9, wherein at least one of the carrier concentration is one of a hole concentration and an electron concentration.

11. The LED of claim 9, wherein carrier concentration of the inactivated portion is gradually increased along a direction from an interface between the current controlling structure and the first electrode to the second type semiconductor layer.

12. The LED of claim 1, wherein the first type semiconductor layer and the current controlling structure are p type semiconductor layers with different resistivities, and the second type semiconductor layer is an n type semiconductor layer.

13. The LED of claim 1, wherein the current controlling structure comprises at least one current controlling layer, and the current controlling layer has at least one opening to form the current-injecting zone.

14. The LED of claim 1, wherein the current controlling structure further comprises:
    at least one current controlling layer having at least one opening, wherein a vertical projection of the opening on the inactivated portion at least partially overlaps with the current-injecting zone, and
    the activated portion has a carrier concentration more than that of the inactivated portion.

15. The LED of claim 14, wherein the current controlling layer is present on surfaces of the inactivated portion and the activated portion facing away from the second type semiconductor layer, and the first electrode is electrically coupled with the first type semiconductor layer through the opening and the current-injecting zone.

16. The LED of claim 14, further comprising:
    an active layer disposed between the first type semiconductor layer and the second type semiconductor layer, wherein the current controlling layer is present between the inactivated portion and the active layer.

17. The LED of claim 14, wherein the current controlling layer is present on a surface of the second type semiconductor layer facing away from the first type semiconductor layer, and the second electrode is electrically coupled with the second type semiconductor layer through the opening.

18. The LED of claim 14, further comprising:
an active layer disposed between the first type semiconductor layer and the second type semiconductor layer, wherein the current controlling layer is present between the second type semiconductor layer and the active layer.

* * * * *